US012668700B2

(12) United States Patent

Kobayashi et al.

(10) Patent No.: US 12,668,700 B2
(45) Date of Patent: Jun. 30, 2026

(54) COMPOSITION FOR FORMING SILICON-CONTAINING METAL HARD MASK AND PATTERNING PROCESS

(71) Applicant: SHIN-ETSU CHEMICAL CO., LTD., Tokyo (JP)

(72) Inventors: Naoki Kobayashi, Joetsu (JP); Kanata Takizawa, Joetsu (JP); Ryo Mitsui, Joetsu (JP); Toshiharu Yano, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 266 days.

(21) Appl. No.: 18/187,149

(22) Filed: Mar. 21, 2023

(65) Prior Publication Data

US 2023/0305405 A1 Sep. 28, 2023

(30) Foreign Application Priority Data

Mar. 25, 2022 (JP) ................................. 2022-049689

(51) Int. Cl.

*C08L 83/04* (2006.01)
*C08K 3/22* (2006.01)

(Continued)

(52) U.S. Cl.

CPC ................ *C08L 83/04* (2013.01); *C08K 3/22* (2013.01); *C08L 83/06* (2013.01); *G03F 7/0041* (2013.01);

(Continued)

(58) Field of Classification Search

None

See application file for complete search history.

(56) References Cited

U.S. PATENT DOCUMENTS 8,759,220 B1 6/2014 Ogihara et al.
2005/0196616 A1 * 9/2005 Stewart ............... C03C 17/3405 428/423.1

(Continued)

FOREIGN PATENT DOCUMENTS

EP 3686256 A1 7/2020
EP 3559746 B1 3/2021

(Continued)

OTHER PUBLICATIONS

N. Takamura et al., Journal of Polymer Science: Part A: Polymer Chemistry, vol. 37, pp. 1017-1026. (Year: 1999).*

(Continued)

*Primary Examiner* — Jiong-Ping Lu
(74) *Attorney, Agent, or Firm* — Oliff PLC

(57) ABSTRACT

The present invention is a composition for forming a silicon-containing metal hard mask, including: (A) a metal oxide nanoparticle; (B) a thermally crosslinkable polysiloxane (Sx) having no aromatic-ring-containing organic group; and (C) a solvent. This provides a composition for forming a silicon-containing metal hard mask that has a high effect of inhibiting collapse of an ultrafine pattern in a multilayer resist method, that can form a resist pattern having excellent LWR, that has more excellent dry etching resistance and wet removability than a conventional silicon-containing underlayer film material, and that has more excellent filling ability than a conventional metal hard mask material.

17 Claims, 5 Drawing Sheets

(51) Int. Cl.

| | |
|---|---|
| ***C08L 83/06*** | (2006.01) |
| ***G03F 7/004*** | (2006.01) |
| ***G03F 7/06*** | (2006.01) |
| ***G03F 7/11*** | (2006.01) |
| ***G03F 7/20*** | (2006.01) |
| ***H10P 50/00*** | (2026.01) |
| ***H10P 50/26*** | (2026.01) |
| ***H10P 50/28*** | (2026.01) |
| ***H10P 76/20*** | (2026.01) |
| ***H10P 76/40*** | (2026.01) |
| *C08G 77/14* | (2006.01) |

(52) U.S. Cl.

CPC ................ *G03F 7/063* (2013.01); *G03F 7/11* (2013.01); *G03F 7/202* (2013.01); *G03F 7/2024* (2013.01); *H10P 50/268* (2026.01); *H10P 50/283* (2026.01); *H10P 50/287* (2026.01); *H10P 50/692* (2026.01); *H10P 50/695* (2026.01); *H10P 50/696* (2026.01); *H10P 50/71* (2026.01); *H10P 50/73* (2026.01); *H10P 76/2043* (2026.01); *H10P 76/405* (2026.01); *H10P 76/4085* (2026.01); *H10P 76/4088* (2026.01); *C08G 77/14* (2013.01)

(56) References Cited

U.S. PATENT DOCUMENTS

| | | | |
|---|---|---|---|
| 2006/0019195 | A1 | 1/2006 | Hatakeyama et al. |
| 2009/0136869 | A1 | 5/2009 | Ogihara et al. |
| 2009/0297784 | A1 | 12/2009 | Xu et al. |
| 2012/0052685 | A1 | 3/2012 | Ogihara et al. |
| 2013/0011630 | A1 | 1/2013 | Sullivan et al. |
| 2014/0193757 | A1 | 7/2014 | Ogihara et al. |
| 2015/0099228 | A1 | 4/2015 | Hatakeyama et al. |
| 2016/0251546 | A1 | 9/2016 | Nakajima et al. |
| 2017/0199457 | A1 | 7/2017 | Hatakeyama et al. |
| 2020/0087534 | A1 | 3/2020 | Rahman et al. |
| 2020/0233303 | A1* | 7/2020 | Ogihara ................. C08G 77/08 |
| 2021/0088908 | A1 | 3/2021 | Kai et al. |
| 2021/0271166 | A1 | 9/2021 | Zi et al. |
| 2021/0311394 | A1* | 10/2021 | Gädda ................... G03F 7/0755 |

FOREIGN PATENT DOCUMENTS

| | | | |
|---|---|---|---|
| JP | 2004-153125 | A | 5/2004 |
| JP | 2005-128509 | A | 5/2005 |
| JP | 2009-126940 | A | 6/2009 |
| JP | 2011-519063 | A | 6/2011 |
| JP | 2012-053253 | A | 3/2012 |
| JP | 2014-532289 | A | 12/2014 |
| JP | 5756134 | B2 | 7/2015 |
| JP | 2016-155882 | A | 9/2016 |
| JP | 6119544 | B2 | 4/2017 |
| JP | 6196165 | B2 | 9/2017 |
| JP | 6327484 | B2 | 5/2018 |
| KR | 10-2020-0091357 | A | 7/2020 |
| KR | 10-2021-0042959 | A | 4/2021 |
| TW | 202018025 | A | 5/2020 |
| WO | 2015/115377 | A1 | 8/2015 |

OTHER PUBLICATIONS

Aug. 20, 2024 Office Action issued in Korean Patent Application No. 10-2023-0036695.

Aug. 11, 2023 Extended Search Report issued in European Patent Application No. 23163424.7.

Nov. 20, 2023 Office Action and Search Report issued in Taiwanese Patent Application No. 112110539.

Feb. 3, 2026 Office Action issued in Japanese Patent Application No. 2023-041625.

* cited by examiner

[FIG. 1]
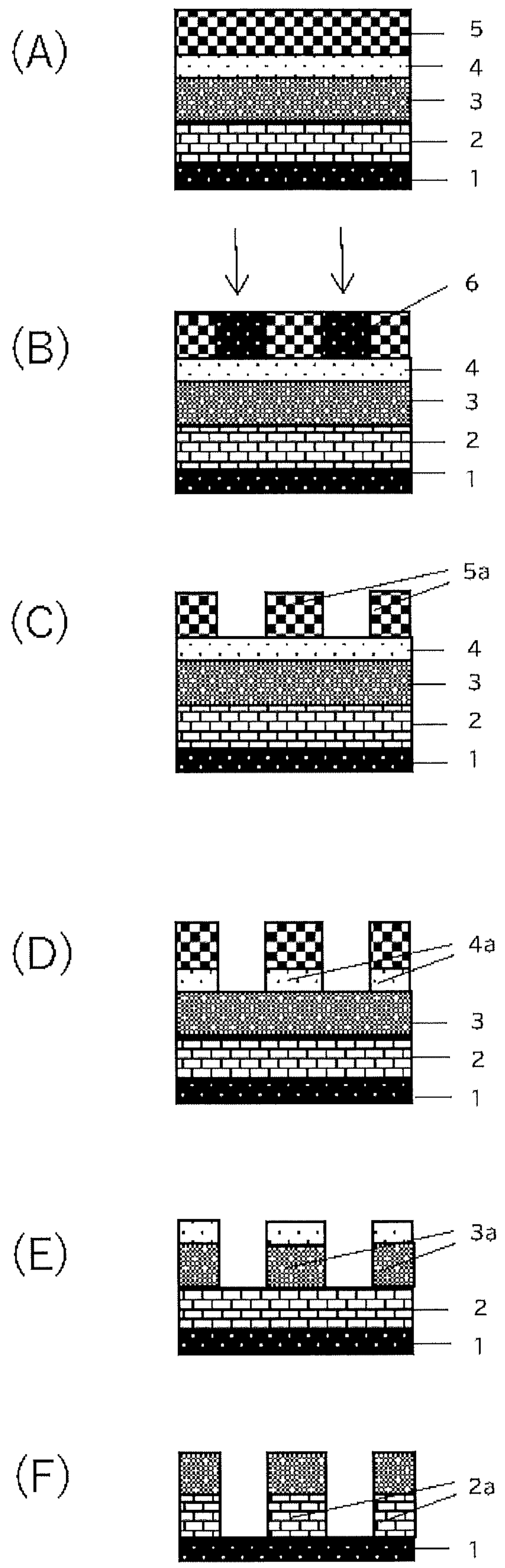

[FIG. 2]
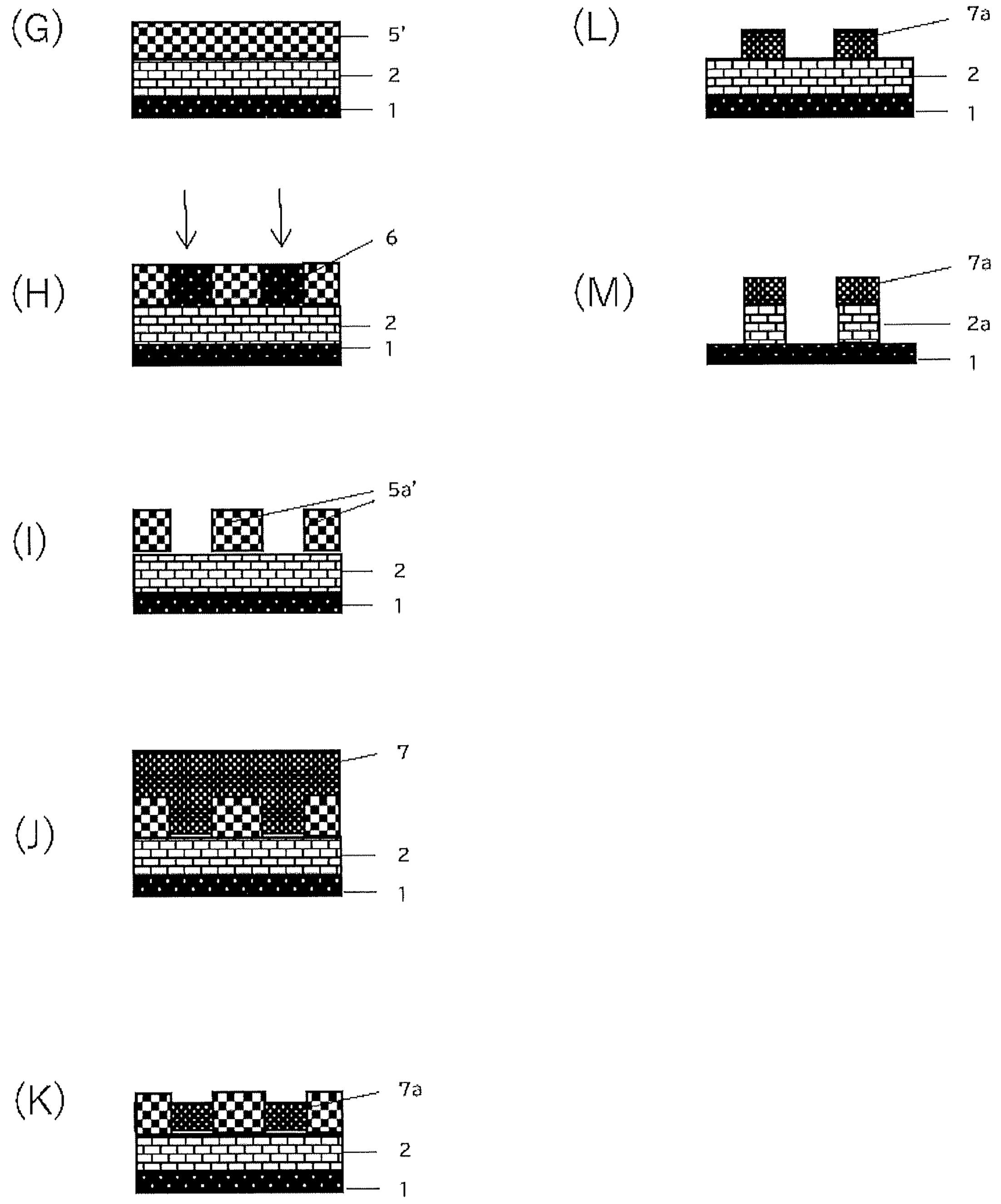

[FIG. 3]
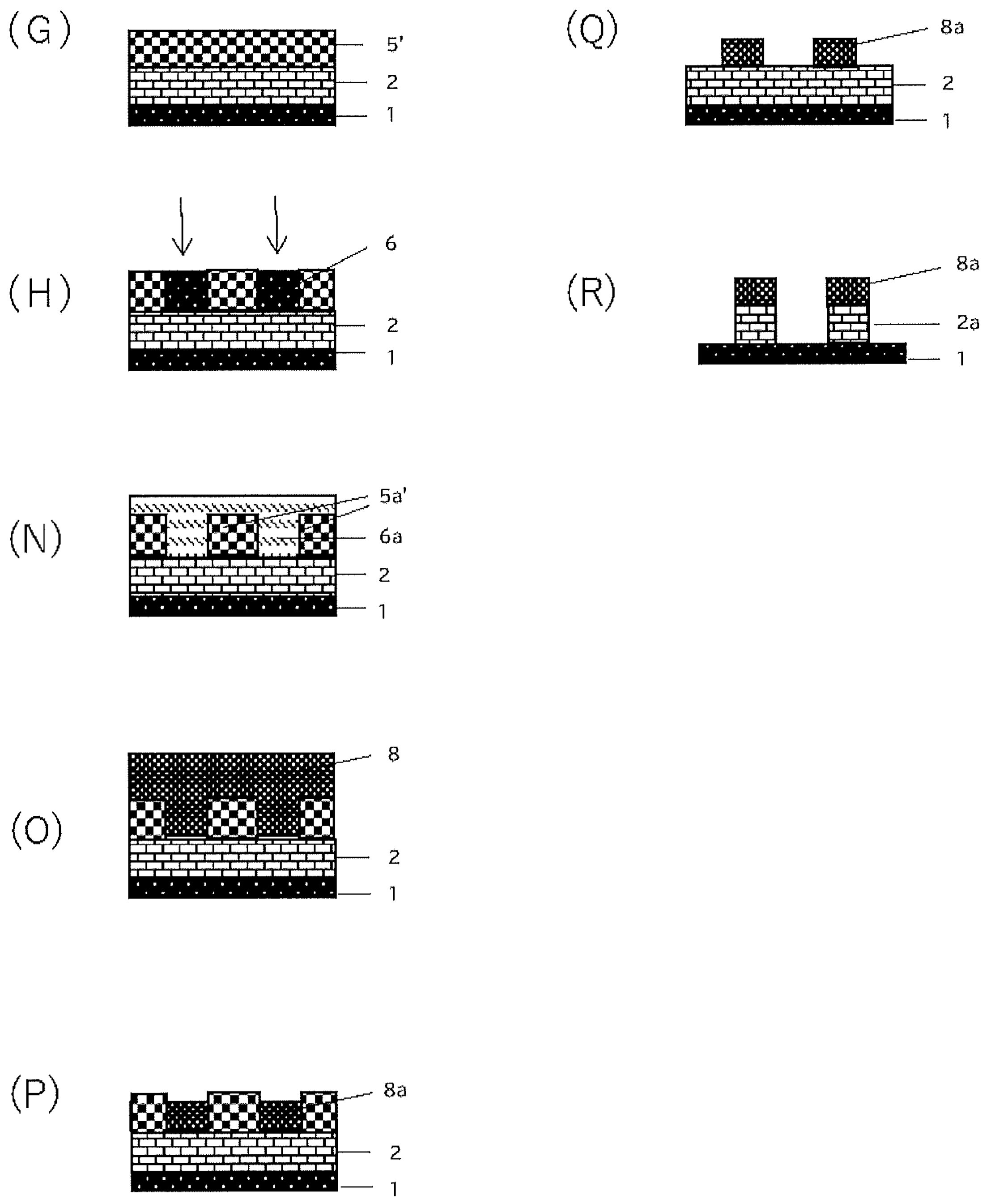

[FIG. 4]
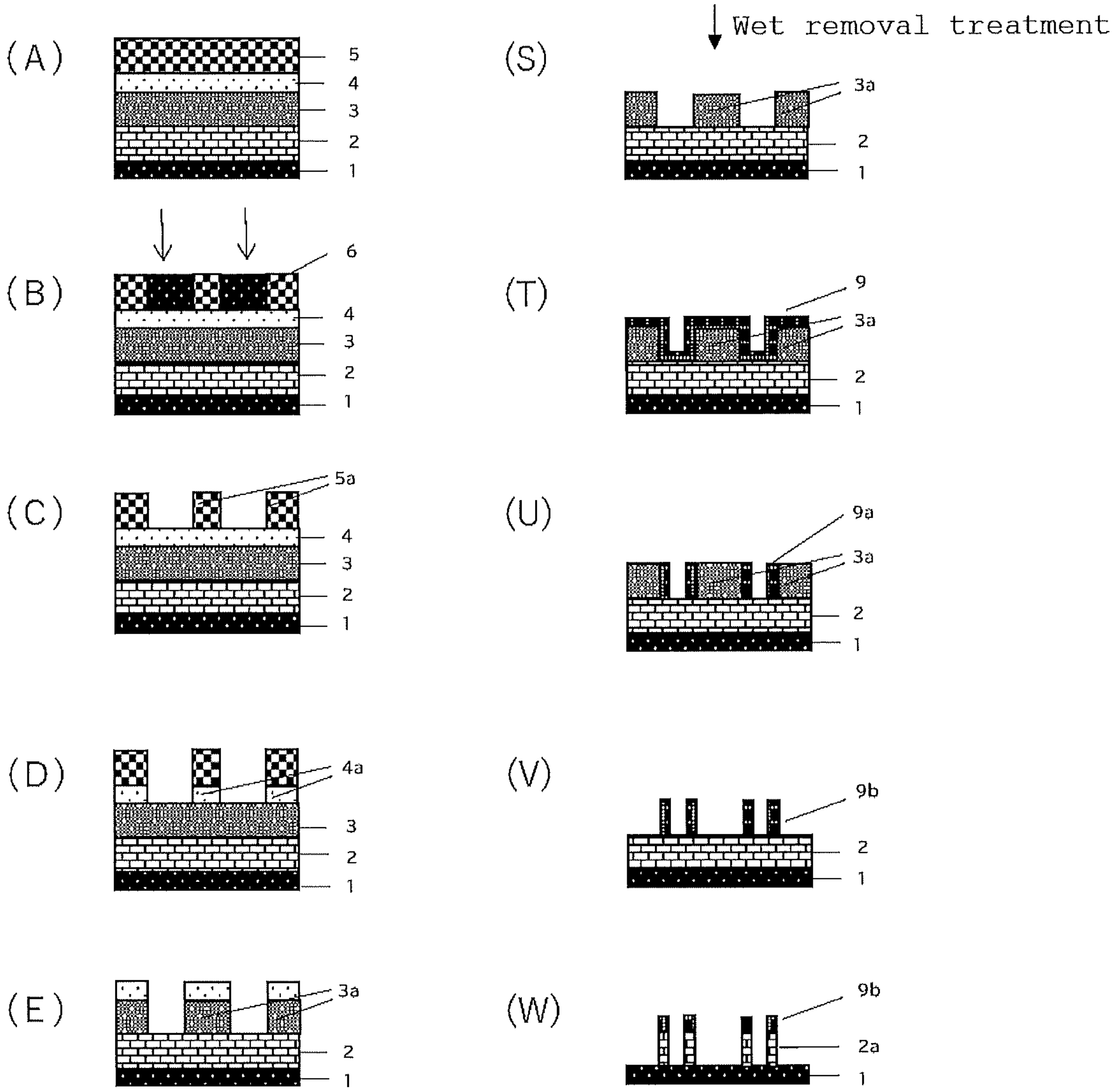

[FIG. 5]
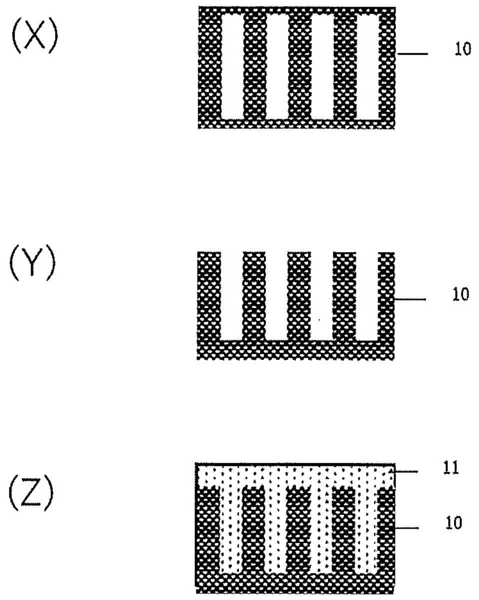

COMPOSITION FOR FORMING SILICON-CONTAINING METAL HARD MASK AND PATTERNING PROCESS

TECHNICAL FIELD

The present invention relates to a composition for forming a silicon-containing metal hard mask and a patterning process using the same.

BACKGROUND ART

As higher integration and higher speed of large-scale integrated circuits (LSI) have been achieved, the pattern size has been rapidly miniaturized. With this miniaturization, lithography techniques have achieved formation of the fine pattern by shortening a wavelength of a light source and appropriately selecting a resist composition corresponding the wavelength. The center of the resist composition is a positive-type photoresist composition used for a single layer. This single-layer positive-type photoresist composition contains a resist resin which has a skeleton having etching resistance against dry etching with chlorine-based or fluorine-based gas plasma, and has a switching mechanism so that an exposed portion is dissolved to form a pattern by dissolving the exposed portion. While using the remained resist pattern as an etching mask, a substrate to be processed is processed by dry etching.

However, miniaturizing the pattern, that is reducing the pattern width, with keeping a film thickness of the used photoresist film causes a problem of deteriorating resolution performance of the photoresist film. In addition, pattern-developing such a photoresist film, which has an excessively high "aspect ratio", with a developing liquid consequently causes a problem of pattern collapse. Thus, the photoresist film has been thinned as the pattern has been miniaturized.

Meanwhile, used for processing a substrate to be processed is commonly a method of processing the substrate by dry etching while using a photoresist film having a formed pattern as an etching mask. However, realistically there is no dry etching method that can have complete etching selectivity between the photoresist film and the substrate to be processed. Thus, there is a problem of collapse of the resist film with damaged during the substrate processing to fail to precisely transfer the resist pattern to the substrate to be processed. Accordingly, as the pattern has been miniaturized, the photoresist composition is required to bring higher dry etching resistance. On the other hand, a resin included the photoresist composition is required to have a small light absorption of the exposure wavelength to improve resolution. Thus, as the wavelength of the exposure light has become shorter of i-line, KrF, and ArF, the resin included the photoresist composition has changed to a novolac resin, polyhydroxystyrene, and a resin having an aliphatic polycyclic skeleton. However, the etching rate under the dry etching condition during the substrate processing has become realistically high, and recent photoresist compositions having high resolution rather tend to have weak etching resistance.

Thus, the substrate to be processed is required to be processed by dry etching with the photoresist film having smaller thickness and weaker etching resistance. It is urgent to achieve a material and process for this processing.

One of methods to solve such a problem is a multilayer resist method. This method is of: interposing an underlayer film having etching selectivity differing from etching selectivity of a photoresist film (that is, a resist upper layer film) between the resist upper layer film and a substrate to be processed; obtaining a pattern in the resist upper layer film; then transferring the pattern to the underlayer film by dry etching while using the resist upper layer film pattern as a dry etching mask; and further transferring the pattern to the substrate to be processed by dry etching while using the underlayer film as a dry etching mask.

One of the multilayer resist methods is a three-layer resist method that can be performed by using a common resist composition used for the single-layer resist method. In this three-layer resist method, for example, an organic film of a novolac resin, etc. is formed on a substrate to be processed, a silicon-containing resist intermediate film is formed thereon, and a common organic photoresist film is formed thereon as a resist upper layer film. The organic resist upper layer film can have good etching selectivity to the silicon-containing resist intermediate film when the dry etching is performed with fluorine-based gas plasma. Thus, the resist upper layer film pattern can be transferred to the silicon-containing resist intermediate film by dry etching with the fluorine-based gas plasma. According to this method, the pattern can be transferred to the silicon-containing film (resist intermediate film) even by using a resist composition that is difficult to form a pattern having a film thickness sufficient for directly processing the substrate to be processed or by using a resist composition that has dry etching resistance insufficient for processing the substrate. Subsequently transferring the pattern by dry etching with oxygen-based or hydrogen-based gas plasma can yield an organic film pattern of the novolac resin, etc. that has dry etching resistance sufficient for processing the substrate. A remained silicon-containing film after forming the organic film pattern is commonly removed so as not to be a residue to cause a defect by dry etching with fluorine-based gas plasma or by wet-etching (wet removal) with an etching liquid such as an alkaline etching liquid and a fluorine-based etching liquid. An insufficient etching rate increases possibility of problems such as remaining a residue derived from the silicon-containing film to cause a defect and requiring a long-time etching treatment to damage the substrate to be processed. As above, the silicon-containing resist intermediate film is needed to have an appropriate etching rate for precise patterning and smooth removal.

In recent years, with emerging of ArF immersion lithography, EUV lithography, etc., formation of finer patterns are becoming possible. Meanwhile, an ultrafine pattern, which has a small ground-contacting area, is extremely easily collapse, and inhibition of the pattern collapse is considerably challenging object. Accordingly, thinning the resist upper layer film is required. However, to increase the etching selectivity to the resist underlayer film, the resist upper layer film also requires to improve the dry etching selectivity. As an attempt to achieve this object, using a metal material for the resist material has been considered in recent years. A compound containing a metal element, such as barium, titanium, hafnium, zirconium, and tin, has higher EUV absorption than an organic material containing no metal, and is promising to improve resist photosensitivity and inhibit a shot noise effect. In addition, the metal-containing resist pattern is promising to be processed by etching with high selectivity-rate etching by combining the resist with an underlayer film composed of a non-metal material. However, resolution and stability of these metal-containing resists still do not reach a level required for practical use, and further improvement of the resolution is required (Patent Document 1).

Meanwhile, for the above object, a technique of using a metal species exhibiting excellent etching selectivity against the resist upper layer film and the substrate to be processed for the resist underlayer film has attracted attention. However, there is no report on a material that has not only excellent etching selectivity to the substrate to be processed but also filling property of a fine concave-convex pattern, which is a required performance as the resist underlayer film, and that can form an upper layer resist pattern having excellent LWR and CDU.

To form a resist underlayer film material that can form a fine resist pattern on the upper layer, reported is a material combining: a silicon-containing compound promising to have adhesiveness to the resist upper layer film; and a titanium compound promising to have etching selectivity (Patent Document 2). The hydrolysable titanium compound, however, has high reactivity, and has poor stability as a composition. Although a filling property is not described, the titanium-containing compound obtained by hydrolyzing or condensing the hydrolysable titanium compound has high reactivity to have low thermal flowability, and the filling property is presumed to be unpromising. Since many silicon-containing compounds used in Examples have an aromatic ring, the flowability assist of the silicon-containing compound is also presumed to be unpromising. Patent Document 3 reports formation of a line-and-space pattern with 60 nm on a resist underlayer film combining a polyacid and a polysiloxane. However, adhesiveness to the resist upper layer film is presumed not to be high with considering the polysiloxane structure, and it is presumably difficult to form a finer resist pattern.

For a high refractive-index lens material, many materials combining a metal oxide nanoparticle and a hydrolysable silane are reported (Patent Document 4 and Patent Document 5). Although performance as the resist underlayer film material is not described because of the usage differing from the semiconductor manufacturing, using the metal oxide nanoparticle having excellent dispersibility is promising to exhibit excellent flowability. However, the hydrolysable silane has no organic group promising for adhesiveness to the resist pattern, and thereby application as the advanced resist underlayer film material is not promising.

When a material that has not only excellent etching selectivity to the substrate to be processed but also excellent filling property of a fine concave-convex pattern, and that can form an upper layer resist pattern having excellent LWR and CDU can be developed, such a material can be preferably used as not only the resist intermediate film for the three-layer resist process, but also the resist underlayer film of the two-layer resist process. In particular, controlling the reflection coefficient from the substrate is not needed in the EUV-applying generation, and the two-layer resist process may be a choice when the material has excellent adhesiveness to the upper layer resist pattern and the etching selectivity between the upper layer resist and the substrate to be processed. Specifically, required is a material that can fill the substrate to be processed having concavity and convexity, that can form an ultrafine resist pattern on the upper layer, and that can transfer the upper layer resist pattern to the substrate to be processed with high precision. In addition, the material having excellent etching selectivity to the substrate to be processed and filling/planarizing ability can be applied for use not only as the resist underlayer film but also as a reversing agent used for a tone-reversed patterning process of the resist pattern. As noted above, when the material that has excellent filling property of a fine concave-convex pattern, that has excellent etching selectivity between the upper layer film and the substrate to be processed, and that can form a resist pattern having excellent LWR and CDU on the upper layer can be developed, such a material is useful as a versatile material that can solve the problem of the advanced-generation lithography technique with a plurality of approaches.

CITATION LIST

Patent Literature

Patent Document 1: JP 6119544 B
Patent Document 2: JP 6196165 B
Patent Document 3: JP 6327484 B
Patent Document 4: WO 2015-115377
Patent Document 5: JP 2016-155882 A

SUMMARY OF INVENTION

Technical Problem

The present invention has been made in view of the above circumstances. An object of the present invention is to provide a composition for forming a silicon-containing metal hard mask that has a high effect of inhibiting collapse of an ultrafine pattern in a multilayer resist method, that can form a resist pattern having excellent LWR, that has more excellent dry etching resistance and wet removability than a conventional silicon-containing underlayer film material, and that has more excellent filling ability (embedding ability) than a conventional metal hard mask material.

Solution to Problem

To solve the above problem, the present invention provides a composition for forming a silicon-containing metal hard mask, comprising: (A) a metal oxide nanoparticle; (B) a thermally crosslinkable polysiloxane (Sx) having no aromatic-ring-containing organic group; and (C) a solvent. The metal hard mask material used for the multilayer resist method or a reversing material used for a patterning process with a pattern-reversing process.

Since such a composition for forming a silicon-containing metal hard mask is constituted with the metal oxide nanoparticle having excellent dispersibility and the thermally crosslinkable polysiloxane having no aromatic-ring-containing organic group, the composition for forming a silicon-containing metal hard mask having high planarizing/filling ability difficult to be achieved by a metal oxide nanoparticle alone can be provided. The oxide nanoparticles of the metal species exhibiting excellent etching selectivity to the resist upper layer film or the substrate to be processed favorably dispersed in the film can exhibit more excellent etching resistance than a conventional silicon-containing intermediate material. Furthermore, a metal hard mask formed by using this composition for forming a silicon-containing metal hard mask has high effect of inhibiting the collapse of an ultrafine pattern, can form a resist pattern having excellent LWR, and has good wet removability.

The metal oxide nanoparticle (A) is preferably one or more kinds of an oxide nanoparticle of a metal selected from the group consisting of zirconium, hafnium, aluminum, tungsten, titanium, copper, tin, cerium, indium, zinc, yttrium, lanthanum, chromium, cobalt, platinum, iron, antimony, and germanium.

Using such a metal oxide nanoparticle can prepare a composition for forming a silicon-containing metal hard mask containing the metal nanoparticle having excellent dispersibility/stability.

The metal oxide nanoparticle (A) is preferably one or more of metal oxide nanoparticles selected from the group consisting of a zirconium oxide nanoparticle, a hafnium oxide nanoparticle, a tungsten oxide nanoparticle, a titanium oxide nanoparticle, and a tin oxide nanoparticle.

Using such a metal oxide nanoparticle can form a metal hard mask having excellent etching resistance.

The metal oxide nanoparticle (A) preferably has an average primary particle diameter of 100 nm or less.

Using such a metal oxide nanoparticle can prepare a composition for forming a silicon-containing metal hard mask containing the metal nanoparticle having excellent dispersibility and stability.

The thermally crosslinkable polysiloxane (Sx) (B) preferably has a structural unit of any one or more of a repeating unit represented by the following general formula (Sx-1), a repeating unit represented by the following formula (Sx-2), and a partial structure represented by the following general formula (Sx-3), (Sx-1)

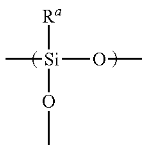

(Sx-2)

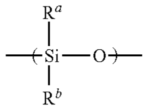

(Sx-3)

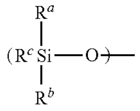

wherein $R^a$ represents: an aromatic ring-free organic group having one or more of a silanol group, a hydroxy group, an ether group, an ester group, an alkoxy group, or a carboxyl group, or an aromatic ring-free organic group to generate one or more of a silanol group, a hydroxy group, an ether group, an ester group, an alkoxy group, or a carboxyl group with eliminating a protective group by either or both actions of an acid and heat; and $R^b$ and $R^c$ each independently represent an organic group having no aromatic ring, or a hydrogen atom.

Containing such a thermally crosslinkable polysiloxane can exhibit good adhesiveness to the resist upper layer film in any resist pattern regardless of alkaline development (positive-type development) and organic solvent development (negative-type development). $R^a$ to $R^c$ containing no aromatic ring can form a silicon-containing metal hard mask having excellent thermal flowability.

The composition for forming a silicon-containing metal hard mask preferably further comprises a crosslinking catalyst (Xc).

Such a composition for forming a silicon-containing metal hard mask can form a silicon-containing metal hard mask in which the thermally crosslinkable polysiloxane and the metal oxide are densely crosslinked.

In this case, the crosslinking catalyst (Xc) is preferably a sulfonium salt, an iodonium salt, a phosphonium salt, an ammonium salt, a polysiloxane having these salts as a partial structure, or an alkali metal salt.

Combining such a crosslinking catalyst (Xc) with the inventive composition for forming a silicon-containing metal hard mask can form a resist pattern having further excellent LWR and CDU.

The solvent (C) is preferably an organic solvent being a mixture of: one or more kinds of an organic solvent having a boiling point of lower than 180° C.; and one or more kinds of an organic solvent having a boiling point of 180° C. or higher.

When the organic solvent is the above mixture, the thermal flowability by adding the high boiling-point solvent is imparted to the composition for forming a silicon-containing metal hard mask, resulting in high filling/planarizing ability.

The present invention also provides a patterning process for forming a pattern in a substrate to be processed, comprising:

(I-1) a step of applying the above composition for forming a silicon-containing metal hard mask on a substrate to be processed, then heat-treating the composition, and forming a silicon-containing metal hard mask;

(I-2) a step of forming a resist upper layer film on the silicon-containing metal hard mask by using a photoresist material;

(I-3) a step of pattern-exposing the resist upper layer film, and then developing the pattern with a developing liquid to form a pattern in the resist upper layer film;

(I-4) a step of transferring the pattern to the silicon-containing metal hard mask by dry etching while using the resist upper layer film having the formed pattern as a mask; and (I-5) a step of forming a pattern in the substrate to be processed by processing the substrate to be processed while using the silicon-containing metal hard mask having the formed pattern as a mask.

The patterning process with the above two-layer resist process can form a fine pattern in a body to be processed (substrate to be processed).

The present invention also provides a patterning process for forming a pattern in a substrate to be processed, comprising:

(II-1) a step of forming an organic resist underlayer film on a substrate to be processed;

(II-2) a step of applying the above composition for forming a silicon-containing metal hard mask on the organic resist underlayer film, then heat-treating the composition, and forming a silicon-containing metal hard mask;

(II-3) a step of forming a resist upper layer film on the silicon-containing metal hard mask by using a photoresist material;

(II-4) a step of pattern-exposing the resist upper layer film, and then developing the pattern with a developing liquid to form a pattern in the resist upper layer film;

(II-5) a step of transferring the pattern to the silicon-containing metal hard mask by dry etching while using the resist upper layer film having the formed pattern as a mask;

(II-6) a step of transferring a pattern to the organic resist underlayer film by dry etching while using the silicon-containing metal hard mask having the transferred pattern as a mask; and (II-7) a step of forming a pattern in the substrate to be processed by processing the substrate to be processed while using the organic resist underlayer film having the formed pattern as a mask.

The patterning process with the above three-layer resist process can form a fine pattern in a substrate to be processed with high precision.

The present invention also provides a patterning process for forming a pattern in a substrate to be processed, comprising:

(III-1) a step of forming an organic resist underlayer film on a substrate to be processed;

(III-2) a step of applying the above composition for forming a silicon-containing metal hard mask on the organic resist underlayer film, then heat-treating the composition, and forming a silicon-containing metal hard mask;

(III-3) a step of forming a BARC (bottom anti-reflection coating) or an adhesive film on the silicon-containing metal hard mask by using a composition for forming an organic thin film;

(III-4) a step of forming a resist upper layer film on the BARC or the adhesive film by using a photoresist material;

(III-5) a step of pattern-exposing the resist upper layer film, and then developing the pattern with a developing liquid to form a pattern in the resist upper layer film;

(III-6) a step of transferring the pattern to the BARC or the adhesive film, and the silicon-containing metal hard mask by dry etching while using the resist upper layer film having the formed pattern as a mask;

(III-7) a step of transferring the pattern to the organic resist underlayer film by dry etching while using the silicon-containing metal hard mask having the transferred pattern as a mask; and (III-8) a step of forming a pattern in the substrate to be processed by processing the substrate to be processed while using the organic resist underlayer film having the formed pattern as a mask.

The patterning process with the above four-layer resist process can form a fine pattern in a substrate to be processed with high precision.

The present invention also provides a patterning process for forming a pattern in a substrate to be processed by reversing a resist pattern, comprising:

(IV-1) a step of forming a photoresist film on a substrate to be processed by using a photoresist material;

(IV-2) a step of pattern-exposing the photoresist film, and then developing the pattern with a developing liquid to form a pattern in the photoresist film;

(IV-3) a step of applying the above composition for forming a silicon-containing metal hard mask on the photoresist film pattern, heat-treating the composition, covering a silicon-containing metal hard mask, and filling a gap of the photoresist film pattern with the silicon-containing metal hard mask;

(IV-4) a step of etching back the silicon-containing metal hard mask by a chemical stripper or dry etching, the mask covering the photoresist film having the formed pattern, and uncovering an upper surface of the photoresist film having the formed pattern;

(IV-5) a step of removing the photoresist film pattern having the uncovered surface by dry etching to form a reversed pattern to the original pattern on the silicon-containing metal hard mask; and (IV-6) a step of forming a tone-reversed pattern in the substrate to be processed by processing the substrate to be processed while using the silicon-containing metal hard mask having the formed reversed pattern as a mask.

The patterning process with the above reversing process can form a fine pattern in a substrate to be processed with further higher precision.

The present invention also provides a patterning process for forming a pattern in a substrate to be processed by reversing a pattern obtained by nanoimprinting, comprising:

(V-1) a step of forming a pattern on a substrate to be processed by nanoimprinting;

(V-2) a step of applying the above composition for forming a silicon-containing metal hard mask on the pattern, heat-treating the composition, covering a silicon-containing metal hard mask, and then filling a gap of the nanoimprint pattern with the silicon-containing metal hard mask;

(V-3) a step of etching back the silicon-containing metal hard mask by a chemical stripper or dry etching, the mask covering the pattern formed by nanoimprinting, and uncovering an upper surface of the nanoimprint pattern film having the formed pattern;

(V-4) a step of removing the nanoimprint pattern having the uncovered surface by dry etching to form a reversed pattern to the original pattern on the silicon-containing metal hard mask; and (V-5) a step of forming a tone-reversed pattern in the substrate to be processed by processing the substrate to be processed while using the silicon-containing metal hard mask having the formed reversed pattern as a mask.

The patterning process with the above reversing process can form a fine pattern in a substrate to be processed with further higher precision by using a nanoimprint lithography method.

The present invention also provides a patterning process for forming a pattern in a substrate to be processed by reversing a resist pattern, comprising:

(VI-1) a step of forming a photoresist film on a substrate to be processed by using a photoresist material;

(VI-2) a step of pattern-exposing the photoresist film and then developing the photoresist film with a developing liquid, and a step of further rinsing the developed film with a rinsing liquid as necessary;

(VI-3) a step of substituting the developing liquid or the rinsing liquid with the above composition for forming a silicon-containing metal hard mask, heat-treating the composition, covering a silicon-containing metal hard mask, and then filling a gap of the photoresist film pattern with the silicon-containing metal hard mask;

(VI-4) a step of etching back the silicon-containing metal hard mask by a chemical stripper or dry etching, the mask covering the photoresist film having the formed pattern, and uncovering an upper surface of the photoresist film having the formed pattern;

(IV-5) a step of removing the photoresist film pattern having the uncovered surface by dry etching to form a reversed pattern to the original pattern on the silicon-containing metal hard mask; and (IV-6) a step of forming a tone-reversed pattern in the substrate to be processed by processing the substrate to be processed while using the silicon-containing metal hard mask having the formed reversed pattern as a mask.

The patterning process with the above resist pattern reversing process can form an ultrafine pattern in a substrate to be processed with further higher precision without collapse of the ultrafine resist pattern.

When the resist pattern becomes ultrafine, a Laplace force is effective during removal of the resist with a developing liquid or a rinsing liquid to form the resist pattern, so that the pattern may be collapsed. In addition, spin-drying the developing liquid after the development may cause the pattern collapse due to the Laplace force. In the above method, substituting the developing liquid or the rinsing liquid with the above composition for forming a silicon-containing metal hard mask enables the metal hard mask to fill the gap of the resist pattern. After the drying, the composition film is formed between the resist patterns. A difference in a dry etching rate between the resist pattern and the formed composition film therebetween is utilized, so that the pattern can be reversed by dry etching.

The patterning process with the above resist pattern reversing process can be provided regardless of the developing liquid for alkali development (positive-type development) or organic solvent development (negative-type developing) by regulating the solvent composition of the composition for forming a silicon-containing metal hard mask to a composition having excellent compatibility with the above developing liquid.

The present invention also provides a patterning process for forming a pattern in a substrate to be processed, comprising:

(VII-1) a step of forming an organic resist underlayer film on a substrate to be processed, applying the above composition for forming a silicon-containing metal hard mask thereon, then heat-treating the composition to from a silicon-containing metal hard mask, and further forming a resist upper layer film thereon;

(VII-2) a step of exposing and developing the resist upper layer film to form a resist upper layer film pattern;

(VII-3) a step of transferring the resist upper layer film pattern to the silicon-containing metal hard mask by dry etching while using the resist upper layer film pattern as a mask, and further transferring the resist upper layer film pattern to the organic resist underlayer film by dry etching while using the silicon-containing metal hard mask having the transferred resist upper layer film pattern as a mask, the transferring being performed with remaining a part of the silicon-containing metal hard mask on the organic resist underlayer film, and then forming an organic resist underlayer film pattern;

(VII-4) a step of removing the remained silicon-containing metal hard mask on the organic resist underlayer film pattern with a removing liquid;

(VII-5) a step of forming an inorganic silicon film composed of any one of polysilicon, amorphous silicon, silicon oxide, silicon nitride, silicon oxynitride, silicon carbide, or a composite material thereof so as to cover the organic resist underlayer film pattern by a CVD method or an ALD method;

(VII-6) a step of removing a part of the inorganic silicon film by dry etching, and uncovering an upper part of the organic resist underlayer film pattern; and (VII-7) a step of removing the organic resist underlayer film pattern to form an inorganic silicon film pattern having a pattern pitch being ½ of a pattern pitch of the resist upper layer film.

The above patterning process can form an ultrafine resist pattern in the substrate to be processed by the side-wall spacer method with high precision without damaging the substrate to be processed. Since the silicon-containing metal oxide film can be removed by not dry etching but wet etching with the removing liquid in the step (VII-4), damage of the substrate to be processed due to a dry etching gas can be avoided. Thus, the patterning process can contribute to improvement of a yield of a semiconductor manufacturing apparatus.

Although the reason why the silicon-containing metal oxide film (underlayer film) using the above inventive composition for forming a silicon-containing metal hard mask exhibits the above effect is not clear, it can be presumed as follows, for example. The metal oxide is favorably dispersed in the composition for forming a silicon-containing metal hard mask, and thereby the Si atom and the metal atom are favorably crosslinked via the oxygen atom during the baking. Thus, the polysiloxane film and the metal oxide film, which have resistance against the removing liquid, hardly remain locally in the film. Therefore, the film removability with the removing liquid can be presumably improved.

In the step (VII-4), the removing liquid preferably contains either or both of a fluoride ion and a nitrogen-containing cation.

Such a removing liquid can easily remove the silicon-containing metal hard mask.

The substrate to be processed is preferably a semiconductor device substrate or a substrate having a film formed on the semiconductor device substrate, the film being a metal film, an alloy film, a metal carbide film, a metal oxide film, a metal nitride film, a metal oxycarbide film, or a metal oxynitride film.

In the present invention, the above materials can be used as the substrate to be processed, for example.

In this case, a metal constituting the substrate to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, manganese, ruthenium, or an alloy thereof.

These materials can be used as the metal. As noted above, pattern formation using the inventive composition for forming a silicon-containing metal hard mask can transfer and form a high precision pattern of the upper layer photoresist to the substrate to be processed.

Advantageous Effects of Invention

When the inventive composition for forming a silicon-containing metal hard mask is used, containing the polysiloxane having the organic group exhibiting good adhesiveness to the resist upper layer film with any of the alkali development and the organic solvent development can form a resist upper layer film pattern having better LWR and CDU than a conventional metal hard mask. In addition, the composition contains the metal species as a form of the metal oxide nanoparticle, the species exhibiting the excellent etching selectivity to the resist upper layer film and the substrate to be processed. This can achieve curing in a state of the metal species favorably dispersed in the film, so that more excellent etching resistance can be achieved than a conventional silicon-containing intermediate film. Thus, deformation of the resist upper layer film pattern during the dry etching can be inhibited and the pattern can be transferred to the substrate with maintaining the excellent LWR and CDU with high precision. The metal oxide nanoparticle is useful also from the viewpoint of the filling ability of the composition, which exhibits better flowability than a composition including a highly reactive hydrolysable metal compound. However, it is difficult to fill/planarize a fine pattern with the metal oxide nanoparticle alone. Thus, the polysiloxane needs a performance to assist the flowability. In the present invention, to assist the flowability brought by the metal oxide nanoparticle, the polysiloxane having the aromatic ring-free organic group is applied. This application improves the thermal flowability of the composition for forming a silicon-containing metal hard mask to achieve more excellent filling/planarization than a conventional metal hard mask. Thus, the present invention can be suitably used for the patterning process with transferring a fine resist pattern to a substrate to be processed having concavity and convexity and with the resist pattern reversing process. Furthermore, the inventive composition for forming a silicon-containing metal hard mask can achieve better wet removability than a conventional silicon-containing intermediate film.

BRIEF DESCRIPTION OF DRAWINGS

FIG. 1 is an explanatory view of an example of the inventive patterning process (three-layer resist process).

FIG. 2 is an explanatory view of an example of the inventive resist-reversing patterning process.

FIG. 3 is an explanatory view of an example of the inventive resist-reversing patterning process with substituting a resist developing liquid or a rinsing liquid.

FIG. 4 is an explanatory view of an example of the inventive resist patterning process using a side-wall spacer method.

FIG. 5 is an explanatory view of a method for evaluating filling ability.

DESCRIPTION OF EMBODIMENTS

As noted above, there have been demands for development of a composition for forming a film that has excellent filling property of a substrate to be processed having a fine concave-convex pattern, that has excellent etching selectivity to the substrate to be processed, and that can form an upper layer resist pattern having excellent LWR and CDU. Such a composition has been demanded as a versatile material applicable for the multilayer resist method and the patterning process with the resist pattern reversing process that are promising as the patterning process for an ultrafine pattern.

The present inventors have earnestly made study, and consequently found that a patterning process using a composition for forming a silicon-containing metal hard mask including a metal oxide nanoparticle and a specific polysiloxane is remarkably effective. The polysiloxane has: an organic group having a silanol group, a hydroxy group, or a carboxyl group, and having no aromatic ring; or an organic group to generate one or more of a silanol group, a hydroxy group, or a carboxyl group with eliminating a protective group by either or both actions of an acid and heat, the organic group having no aromatic ring. This finding has led to complete the present invention.

Specifically, the present invention is a resist underlayer film material used for the multilayer resist method or a reversing material used for a patterning process with a resist pattern-reversing process, etc. The present invention is a composition for forming a silicon-containing metal hard mask comprising: (A) a metal oxide nanoparticle; (B) a thermally crosslinkable polysiloxane having no aromatic-ring-containing organic group; and (C) a solvent.

As noted above, the present invention relates to a composition for forming a silicon-containing metal hard mask that can form a good resist pattern having a high effect of inhibiting collapse of an ultrafine pattern in the multilayer resist method, that has more excellent dry etching resistance and wet removability than a conventional silicon-containing underlayer film material, and that has more excellent filling/planarizing ability than a conventional metal hard mask material. The present invention also relates to pattern formation using this composition.

Hereinafter, the present invention will be described in detail, but the present invention is not limited thereto.

<Composition for Forming Silicon-Containing Metal Hard Mask>

The inventive composition for forming a silicon-containing metal hard mask comprises: (A) a metal oxide nanoparticle; (B) a thermally crosslinkable polysiloxane (Sx) having no aromatic-ring-containing organic group; and (C) a solvent.

The silicon-containing metal hard mask formed by using the inventive composition for forming a silicon-containing metal hard mask is a metal oxide film, and is usable as the resist underlayer film and the resist intermediate film, for example.

The above composition for forming a silicon-containing metal hard mask comprises: (A) the metal oxide nanoparticle; (B) the thermally crosslinkable polysiloxane (Sx) having no aromatic-ring-containing organic group; and (C) the solvent. The inventive composition optionally contains additives such as a crosslinking catalyst and an acid generator, as necessary. Hereinafter, components contained in the inventive composition will be described.

<(A) Metal Oxide Nanoparticle>

The metal oxide nanoparticle (A) contained in the inventive composition for forming a silicon-containing metal hard mask is preferably one or more kinds of an oxide nanoparticle of a metal selected from the group consisting of zirconium, hafnium, aluminum, tungsten, titanium, copper, tin, cerium, indium, zinc, yttrium, lanthanum, chromium, cobalt, platinum, iron, antimony, and germanium. Among these, a zirconium oxide nanoparticle, a hafnium oxide nanoparticle, a tungsten oxide nanoparticle, a titanium oxide nanoparticle, and a tin oxide nanoparticle are preferable from the viewpoints of the dispersibility and the dry etching resistance. In the present invention, "nanoparticle" means a particle having a volume average primary particle diameter of nanometer order (1 nm or more and less than 1000 nm). "Metal oxide nanoparticle" is a metal oxide particle having a volume-average primary particle diameter on the order of nanometers. The volume average primary particle diameter is a value measured by an electron microscope method described below.

Selecting the above metal oxide can form a silicon-containing metal hard mask having excellent dispersibility and dry etching resistance.

The metal oxide nanoparticle (A) preferably has an average primary particle diameter of 100 nm or less, more preferably has an average primary particle diameter of 50 nm or less, further preferably has an average primary particle diameter of 30 nm or less, and particularly preferably 15 nm or less. The average primary particle diameter of the metal oxide nanoparticle before dispersed in the organic solvent can be determined by a method of directly measuring a size of the primary particle on an electron microscopic image. Specifically, a minor axis diameter and a major axis diameter of each primary particle are measured, and an average thereof is specified as a particle diameter of that particle. Then, on 100 or more particles, a volume (mass) of each particle is determined with approximating a cuboid having the determined particle diameter, and a volume-average particle diameter determined by the results is specified as an average particle diameter. Using any electron microscope of a transmission microscope (TEM), a scanning electron microscope (SEM), or a scanning transmission electron microscope (STEM) can yield the same result.

Within such a particle diameter range, the good dispersibility can be exhibited in the composition for forming a silicon-containing metal hard mask, and a silicon-containing metal oxide film having excellent filling/planarizing ability of a dense portion of a fine pattern structure can be formed.

The metal oxide nanoparticle (A) contained in the inventive composition for forming a silicon-containing metal hard mask preferably satisfies the above condition. A metal oxide nanoparticle obtained by buying a commercially available product or synthesized by a known method can be used.

Examples of the titania nanoparticle include: TTO series (TTO-51(A), TTO-51(C), etc.), TTO-S and V series (TTO-S-1, TTO-S-2, TTO-V-3, etc.), manufactured by ISHIHARA SANGYO KAISHA, LTD.; nanoparticles manufactured by TAYCA CORPORATION (MT-01, MT-05, MT-100SA, MT-500SA, NS405, etc.); and STR-100A-LP, manufactured by SAKAI CHEMICAL INDUSTRY CO., LTD.

Examples of the zirconia particle include: PCS (manufactured by Nihondenko Co., Ltd.); JS-01, JS-03, and JS-04 (manufactured by Nihondenko Co., Ltd.); UEP, UEP-50, and UEP-100 (manufactured by DAIICHI KIGENSO KAGAKU KOGYO CO., LTD.); PCPB-2-50-PGA and PCPA-2-502-PGA (manufactured by Pixelligent Technologies); $ZrO_2$ nanoparticles 915505 (manufactured by Sigma-Aldrich); and SZR-W, SZR-CW, SZR-K, and SZR-En10 (manufactured by SAKAI CHEMICAL INDUSTRY CO., LTD.).

Examples of the known synthetic method include: physical methods such as vapor deposition and laser ablation; and chemical methods such as a reduction method of a metal salt, a sol-gel method, and a pyrolysis method.

The metal oxide nanoparticle (A) contained in the inventive composition for forming a silicon-containing metal hard mask may be used singly, or may be used in combination of two or more kinds thereof. These nanoparticles can be selected with any combination depending on required performance. A content of the component (A) in the composition can be 5 to 1900 parts by mass relative to 100 parts by mass of the thermally crosslinkable polysiloxane.

<(B) Thermally Crosslinkable Polysiloxane>

The inventive thermally crosslinkable polysiloxane (Sx) has a structural unit having any one or more of a repeating unit represented by the following general formula (Sx-1), a repeating unit represented by the following general formula (Sx-2), and a partial structure represented by the following general formula (Sx-3).

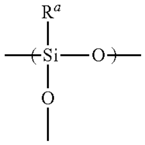
(Sx-1)

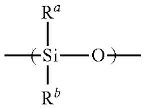
(Sx-2)

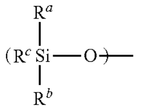
(Sx-3)

In the formulae, $R^a$ represents: an aromatic ring-free organic group having one or more of a silanol group, a hydroxy group, an ether group, an ester group, an alkoxy group, or a carboxyl group, or an aromatic ring-free organic group to generate one or more of a silanol group, a hydroxy group, an ether group, an ester group, an alkoxy group, or a carboxyl group with eliminating a protective group by either or both actions of an acid and heat. $R^b$ and $R^c$ each independently represent an organic group having no aromatic ring or a hydrogen atom.

The above $R^a$ is not particularly limited as long as it is: the organic group having one or more of a silanol group, a hydroxy group, an ether group, an ester group, an alkoxy group, or a carboxyl group, the organic group having no aromatic ring; or the organic group to generate one or more of the above groups with eliminating a protective group by any one or both actions of an acid and heat.

Examples of $R^a$ of such a thermally crosslinkable polysiloxane (Sx) include the following groups. In the following formulae, (Si) is shown to represent a bonding position to Si (the same applies hereinafter).

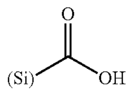
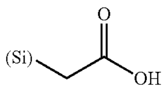
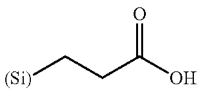
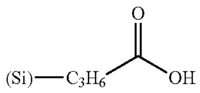
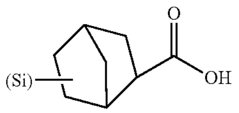
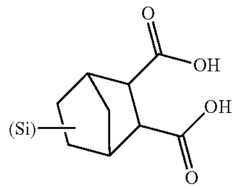
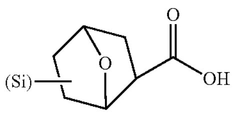
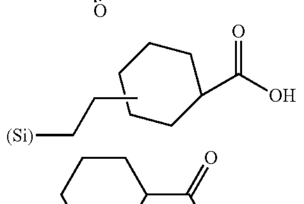
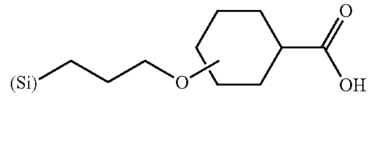
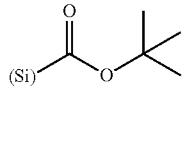

-continued
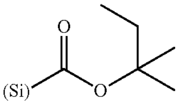
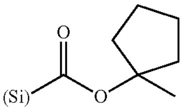
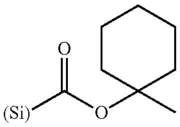
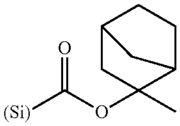
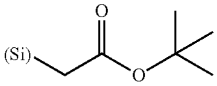
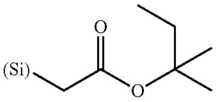
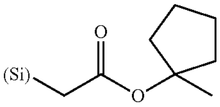
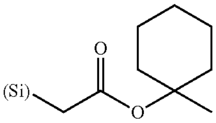
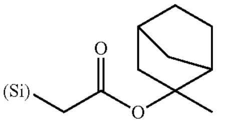
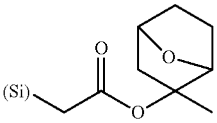
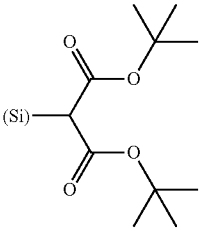
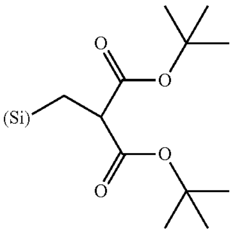
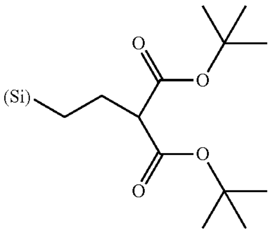
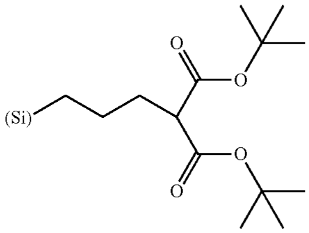
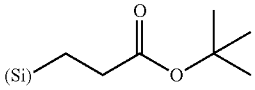
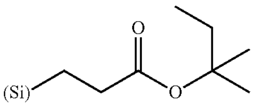
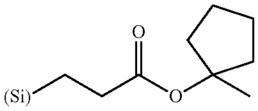
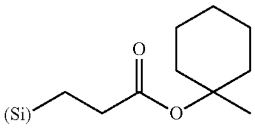
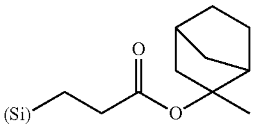
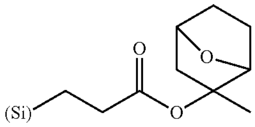
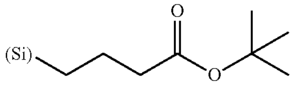
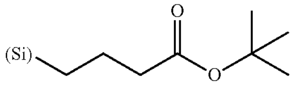
-continued
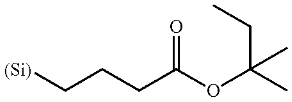
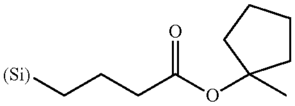
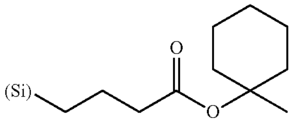
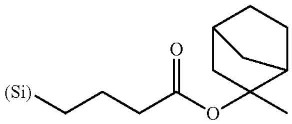
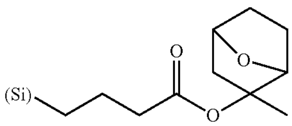
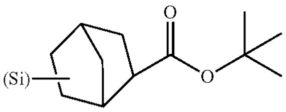
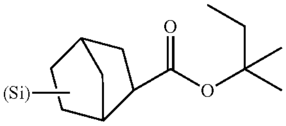
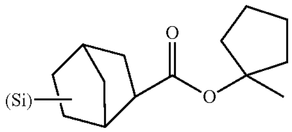
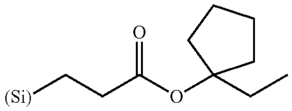
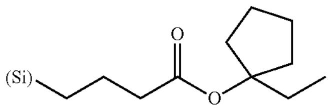
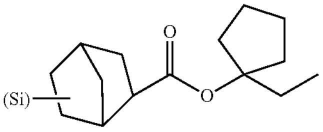
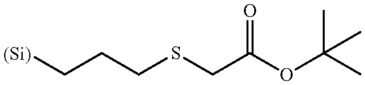
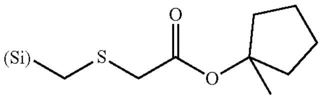
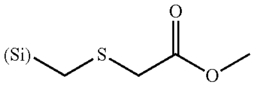
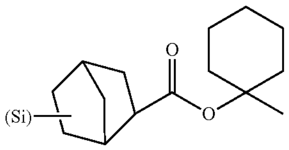
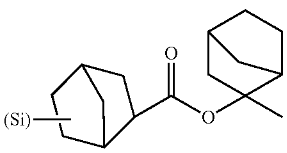

-continued
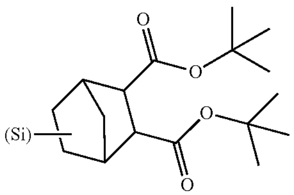
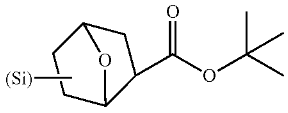
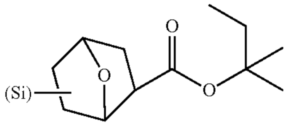
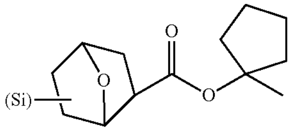
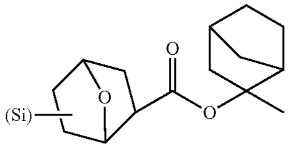
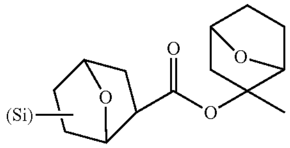
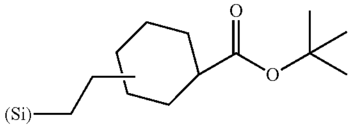
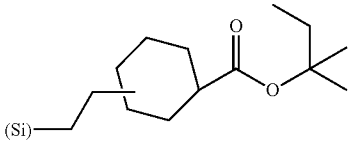
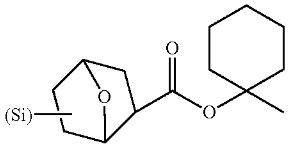
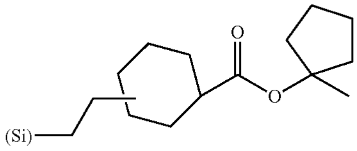
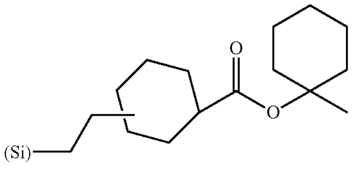
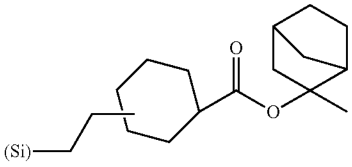
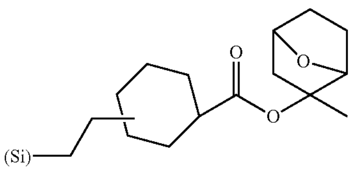
-continued
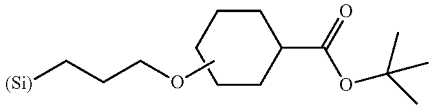
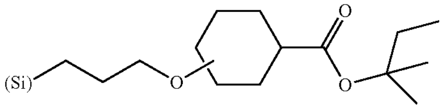
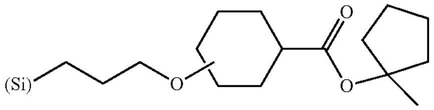
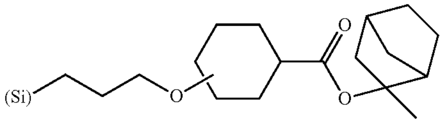
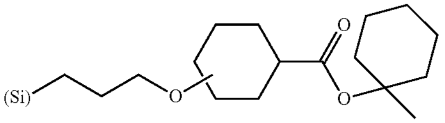
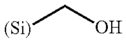
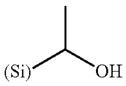
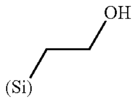
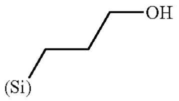
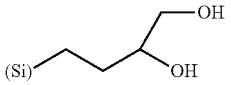
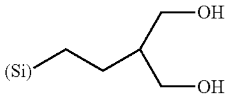
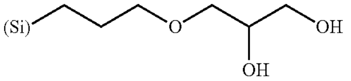
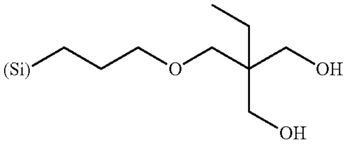
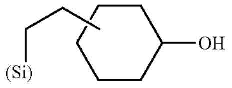
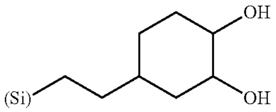
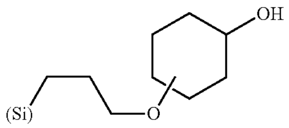
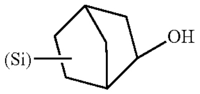
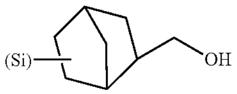
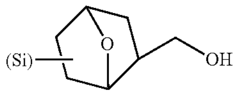
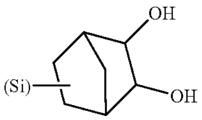
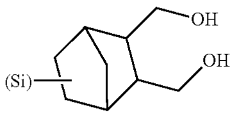
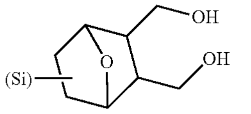
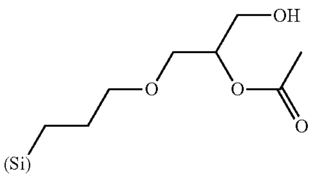

-continued
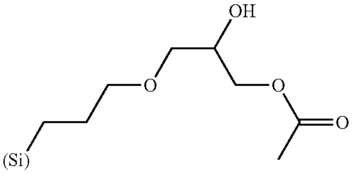
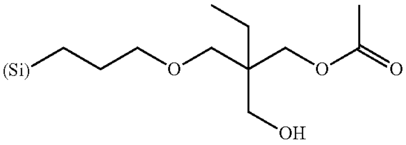
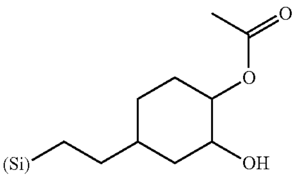
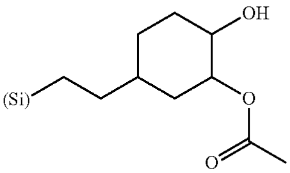
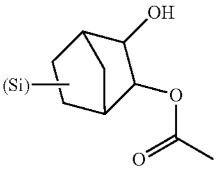
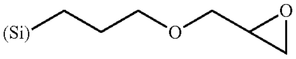
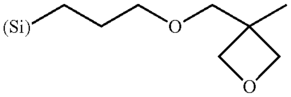
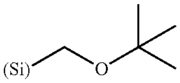
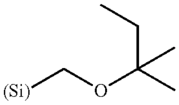
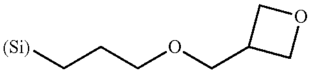
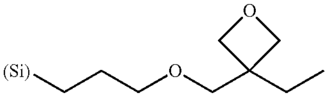
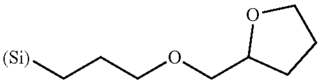
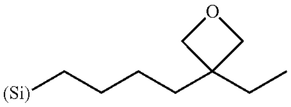
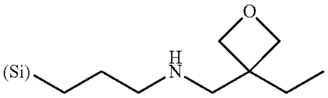
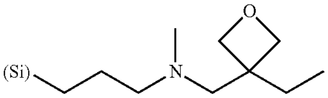
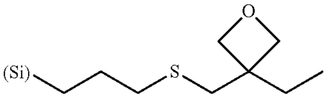
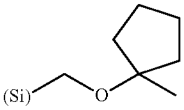
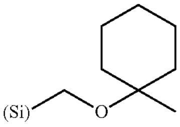
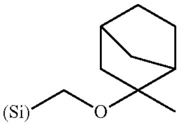
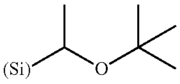
-continued
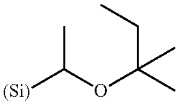
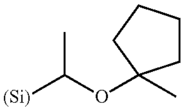
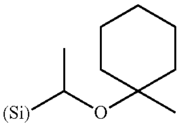
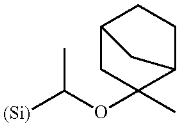
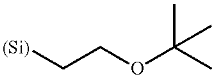
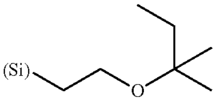
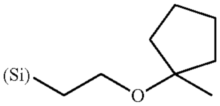
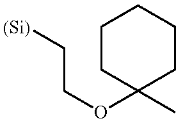
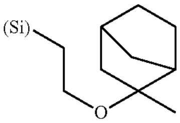
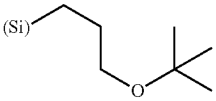
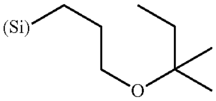
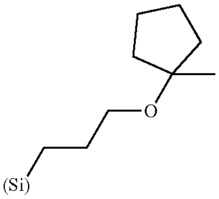
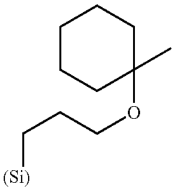
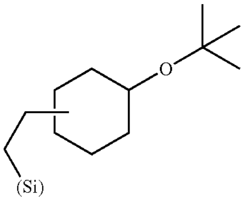
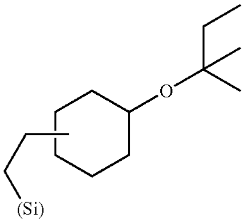
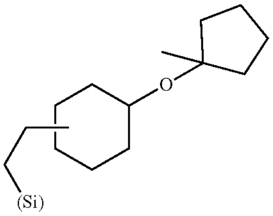
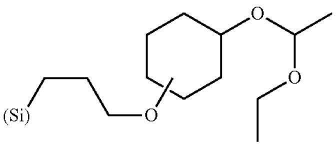
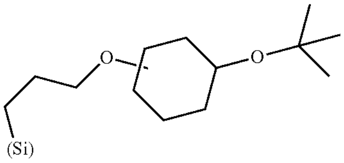

-continued
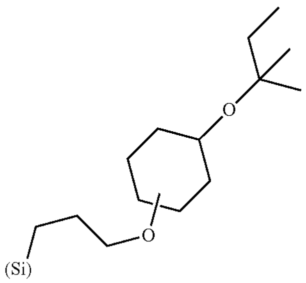
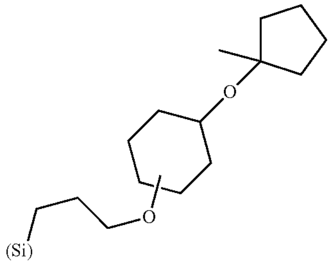
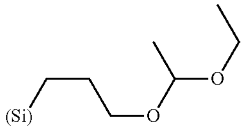
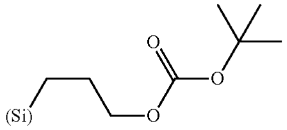
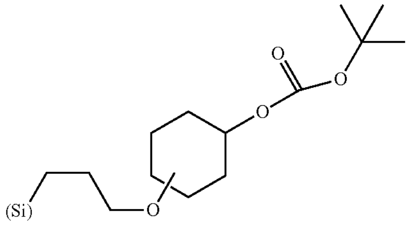
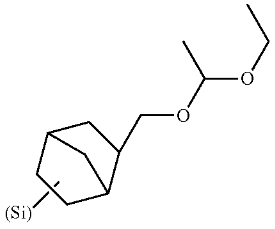
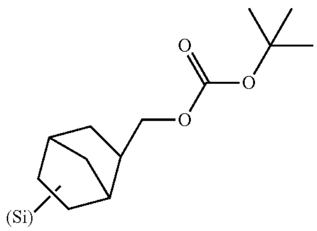
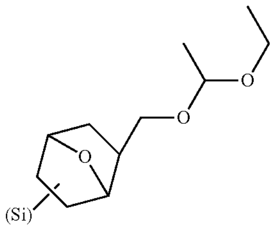
-continued
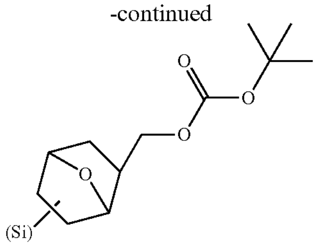
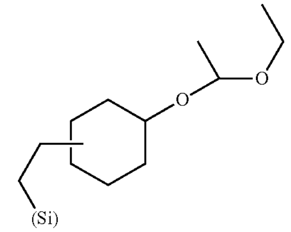
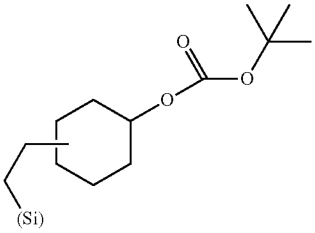
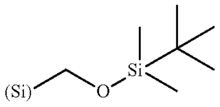
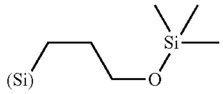
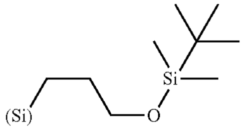
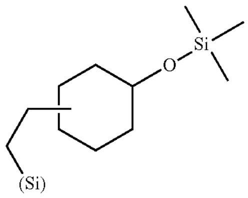
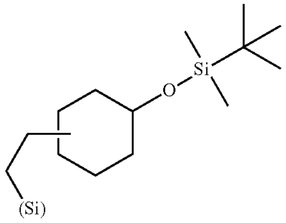
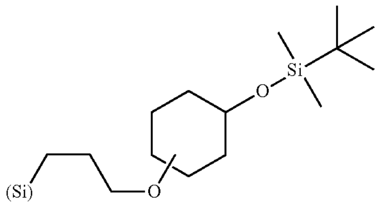
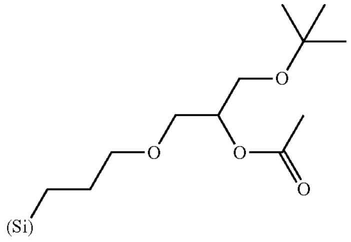
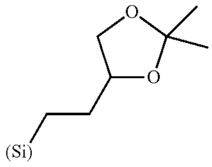
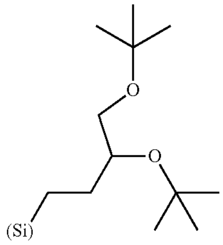

-continued

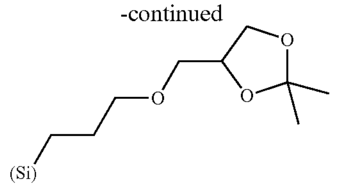

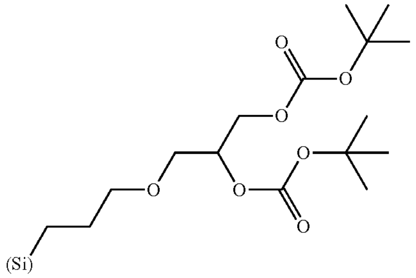

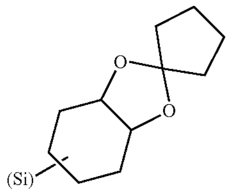

Among the above $R^a$, a group having an ester bond or an organic group having a cyclic ether is preferable. The ester bond means a —C(═O)—O— bond or a —O—C(═O)— bond. The cyclic ether specifically means an epoxy group, an oxetanyl group, a furanyl group, etc.

Containing the above organic group can exhibit good adhesiveness to the resist upper layer film in any resist pattern regardless of alkaline development (positive-type development) and organic solvent development (negative-type development). Since the solubility in a wet removing liquid containing a base is improved, the composition can be easily removed by wet etching (wet removal) using a removing liquid containing a nitrogen-containing cation. Furthermore, since the polysiloxane has no aromatic ring, a silicon-containing metal hard mask having excellent thermal flowability can be formed.

Usable as a hydrolysable monomer (Sm) as a raw material for forming the inventive structure is a monomer having: the above structure on the silicon; on the other hand, one, two, or three of chlorine, bromine, iodine, an acetoxy group, a methoxy group, an ethoxy group, a propoxy group, or a butoxy group as the hydrolysable group; and if present, a hydrogen atom or a monovalent organic group having 1 to 30 carbon atoms as $R^b$ and $R^c$. The monomer can be used singly, or can be used in combination of two or more kinds thereof.

Examples of the organic group represented by the above $R^b$ and $R^c$ include organic groups having no aromatic ring such as methyl, ethyl, vinyl, propyl, cyclopropyl, butyl, cyclobutyl, pentyl, cyclopentyl, hexyl, cyclohexyl, cyclohexenyl, cyclopentylmethyl, heptyl, cyclohexylmethyl, cyclohexenylmethyl, bicyclo[2,2,1]heptyl, octyl, cyclooctyl, cyclohexylethyl, decyl, adamantyl, and dodecyl. These groups may be same as or different from each other. $R^b$ and $R^c$ are preferably same as $R^a$.

Examples of other organic groups represented by the above $R^b$ and $R^c$ include organic groups having one or more of a carbon-oxygen single bond or a carbon-oxygen double bond and having no aromatic ring. Specific examples thereof include organic groups having one or more groups selected from the group consisting of an ether bond, an ester bond, an alkoxy group, a hydroxy group, etc. Examples thereof include groups represented by the following general formula (Sm-R).

$$(P\text{-}Q_1\text{-}(S_1)_{v1}\text{-}Q_2\text{-})_u\text{-}(T)_{v2}\text{-}Q_3\text{-}(S_2)_{v3}\text{-}Q_4\text{-} \qquad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbons. $Q_1$, $Q_2$, $Q_3$, and $Q_4$ each independently represent $—C_qH_{(2q-p)}P_p—$, wherein P represents same as above, "p" represents an integer of 0 to 3, and "q" represents an integer of 0 to 10, note that q=0 representing a single bond. "u" represents an integer of 0 to 3. Si and $S_2$ each independently represent —O—, —CO—, —OCO—, —COO—, or —OCOO—. "v1", "v2", and "v3" each independently represent 0 or 1. In addition to the above, T represents a divalent group composed of a divalent atom except for carbon, an aliphatic ring, or a hetero ring.

As T, examples of the aliphatic ring or a hetero ring optionally having a heteroatom such as oxygen atom will be described below. In T, positions at which $Q_2$ and $Q_3$ are bonded are not particularly limited, and can be appropriately selected with considering reactivity due to a steric factor, availability of a commercial reagent to be used for the reaction, etc.

T =

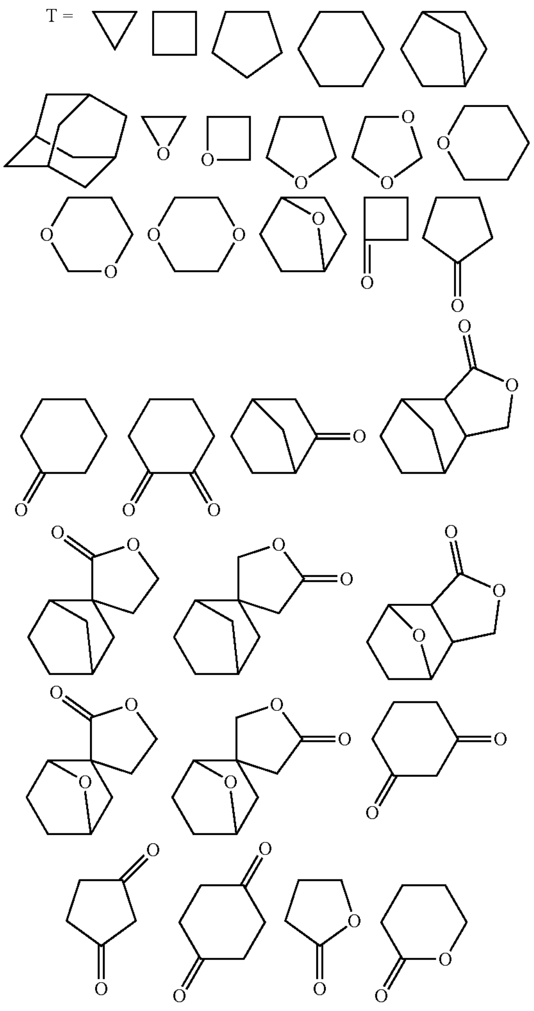

-continued
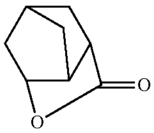
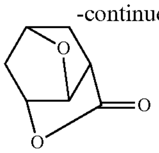
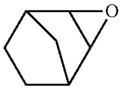
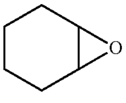
Preferable examples of the organic group having one or more of a carbon-oxygen single bond or a carbon-oxygen double bond in the general formula (Sm-R) include the following groups.
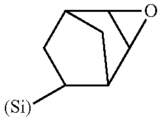
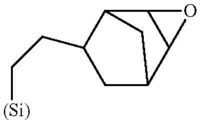
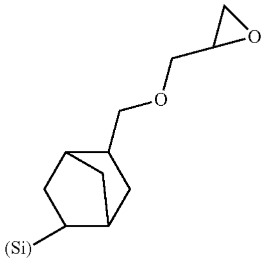
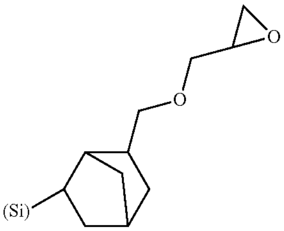
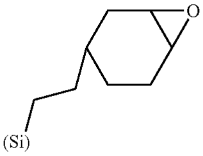
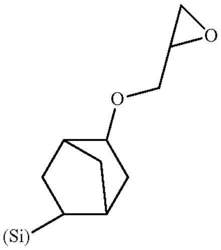
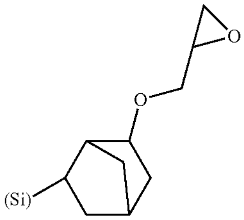
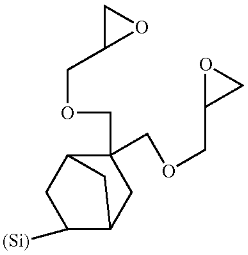
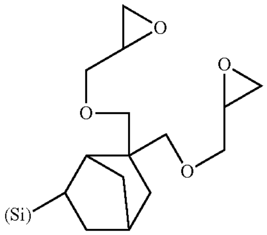
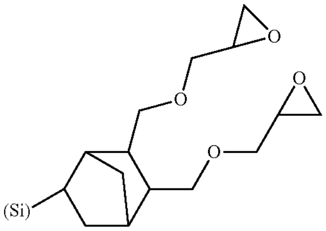
-continued
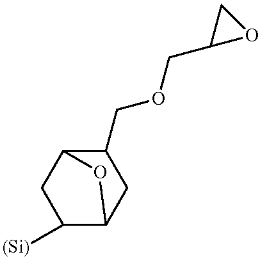
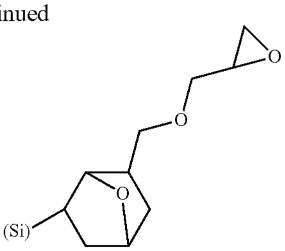
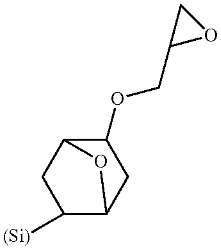
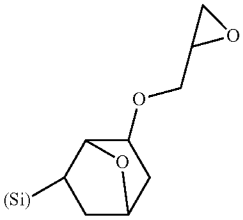
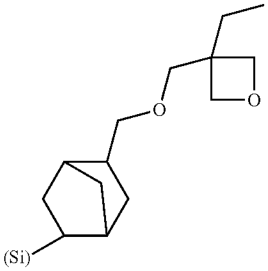
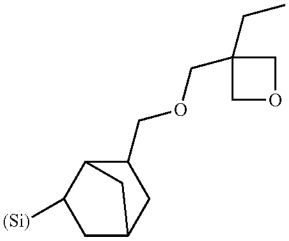
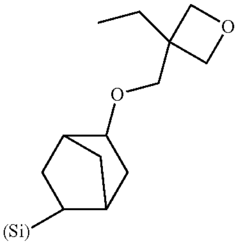
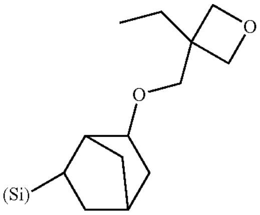
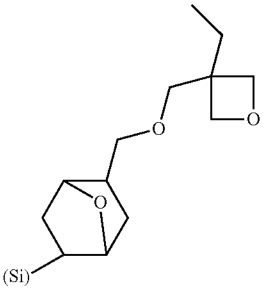
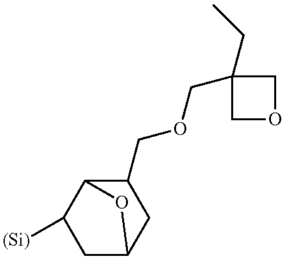
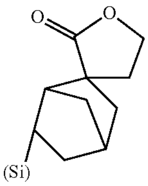
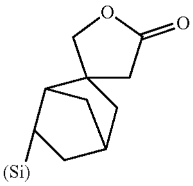
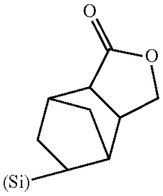
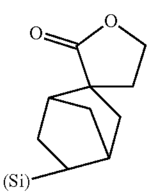
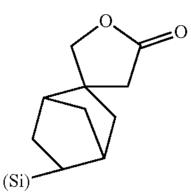
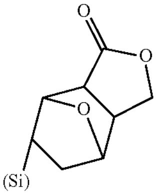

-continued
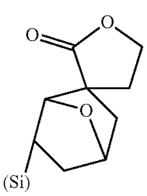 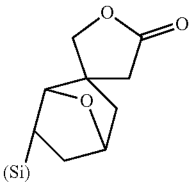 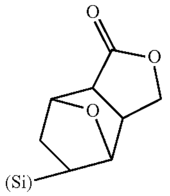
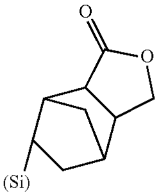 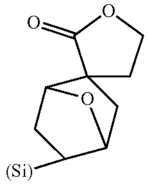 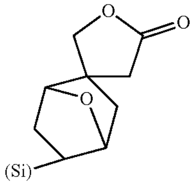
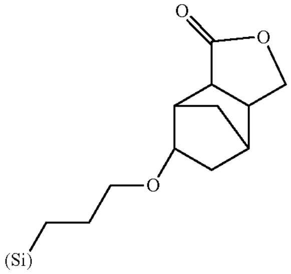 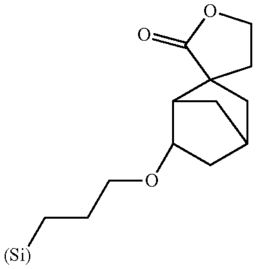
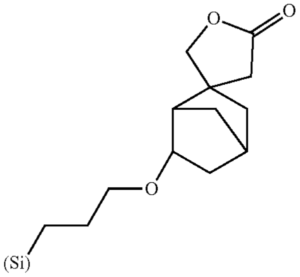 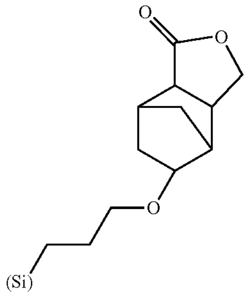
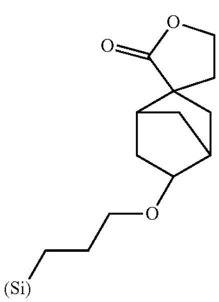 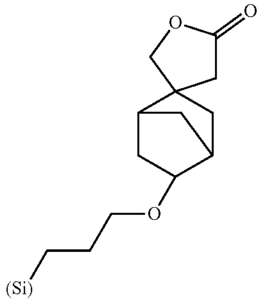
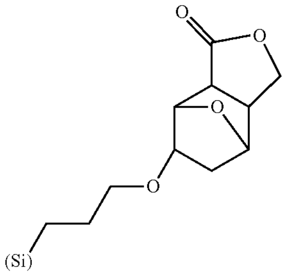 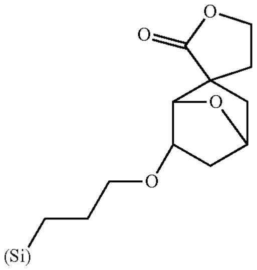
-continued
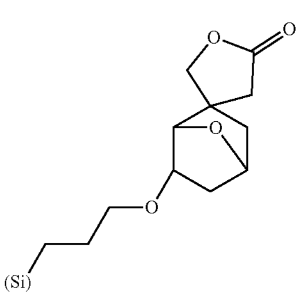 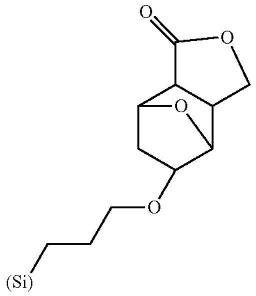
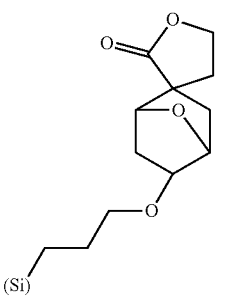 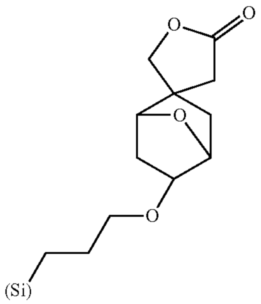
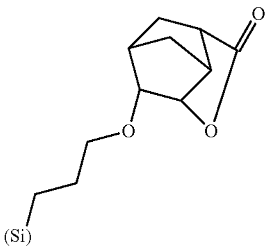
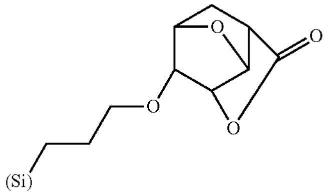
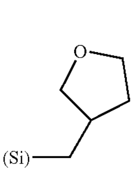 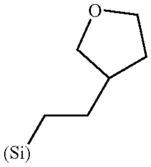 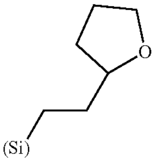
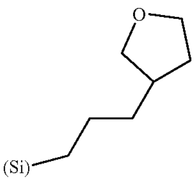 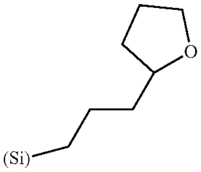
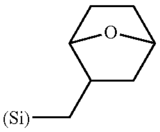 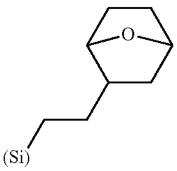 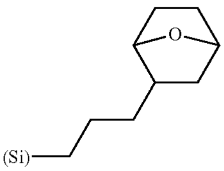

-continued
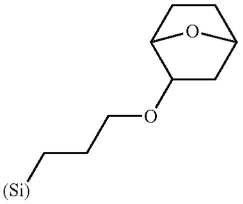
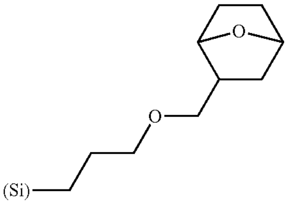
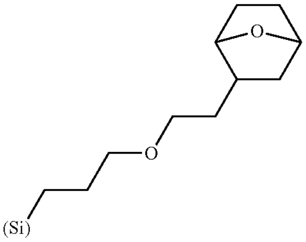
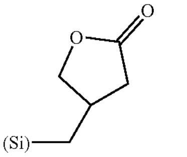
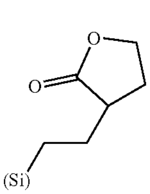
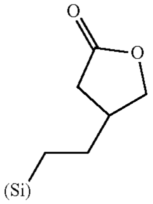
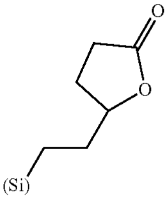
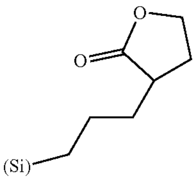
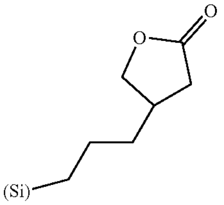
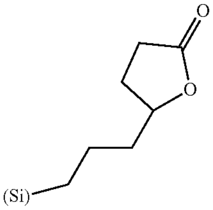
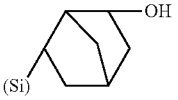
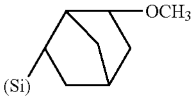
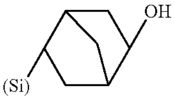
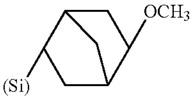
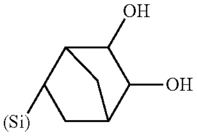
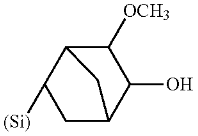
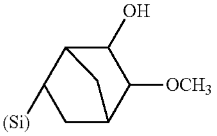
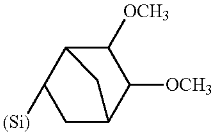
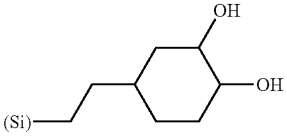
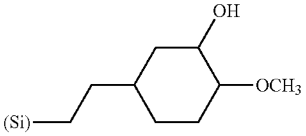
-continued
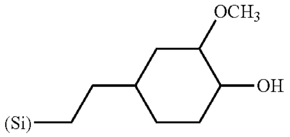
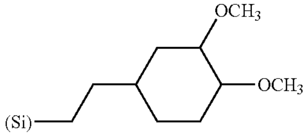
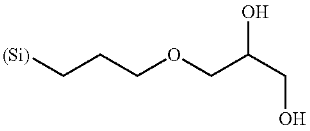
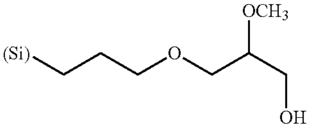
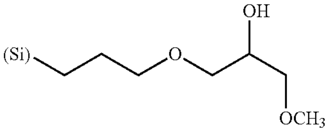
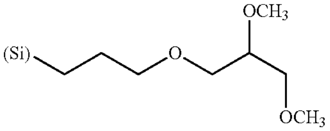
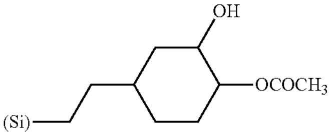
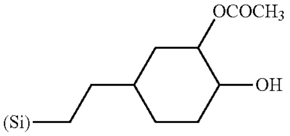
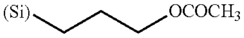
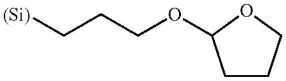
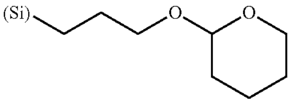
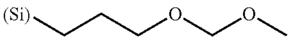
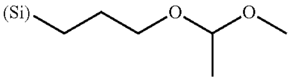
As examples of the organic group of $R^b$ and $R^c$, organic groups having a silicon-silicon bond can also be used. Specific examples thereof include the following groups.

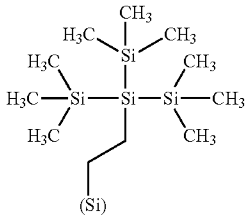

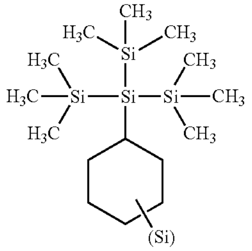

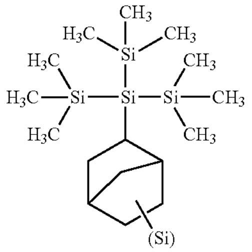

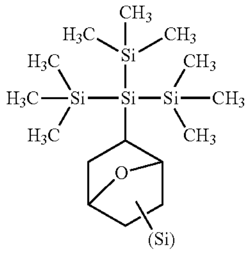

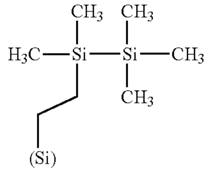

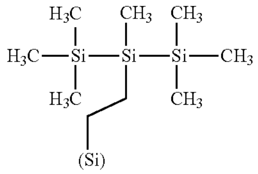

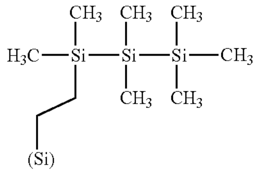

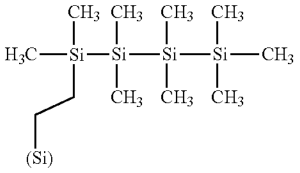

-continued

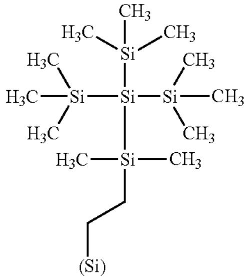

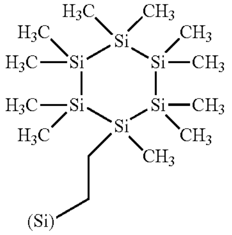

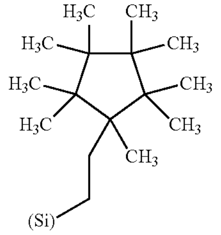

Furthermore, as examples of the organic group of $R^b$ and $R^c$, organic groups having a fluorine atom can also be used. Specific examples thereof include organic groups obtained from a silicon compound described in paragraph [0059] in JP 2012-53253 A.

In the above hydrolysable monomer (Sm), one, two, or three of chlorine, bromine, iodine, an acetoxy group, a methoxy group, an ethoxy group, a propoxy group, or a butoxy group are bonded as the hydrolysable group on the silicon represented by (Si) in the above partial structure.

The inventive thermally crosslinkable polysiloxane (Sx) can be manufactured by hydrolytically condensing a mixture containing the following hydrolysable monomer (Sm).

Specific examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxyxilane, propyltriethoxysilane, propyltripropoxysilane, propyltriisopropoxysilane, isopropyltrimethoxyxilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxyxilane, sec-butyltriethoxysilane, sec-butyltripropoxysilane, sec-butyltriisopropoxysilane, t-butyltrimethoxyxilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cycloprentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diehtyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-dibutyldiethoxysilane, di-sec-dibutyldipropoxysilane, di-sec-dibutyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane,
dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl) dimethoxysilane, bis(bicycloheptyl)diethoxysilane, bis (bicycloheptyl)dipropoxysilane, bis(bicycloheptyl) diisopropoxysilane, diadamantyldimethoxysilane, diadamantyldiethoxysilane, diadamantyldipropoxysilane, diadamantyldiisopropoxysilane, trimethylmethoxysilane, trimethylethoxysilane, dimethylethylmethoxysilane, and dimethylethylethoxysilane.

Examples of (Sm) also preferably include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, trimethylmethoxysilane, and dimethylethylmethoxysilane.

Method for Synthesizing Thermally Crosslinkable Polysiloxane (Sx)

(Synthetic Method 1: Acid Catalyst)

The inventive thermally crosslinkable polysiloxane (Sx) can be manufactured by hydrolytically condensing a mixture of one or more kinds of the hydrolysable monomer (Sm) (hereinafter, also simply referred to as "monomer") in the presence of an acid catalyst.

Examples of the acid catalyst used in this case include: organic acids, such as formic acid, acetic acid, oxalic acid, maleic acid, methanesulfonic acid, benzenesulfonic acid, and toluenesulfonic acid; and inorganic acids, such as hydrofluoric acid, hydrochloric acid, hydrobromic acid, sulfuric acid, nitric acid, perchloric acid, and phosphoric acid. A use amount of the catalyst is $1\times10^{-6}$ to 10 mol, preferably $1\times10^{-5}$ to 5 mol, and more preferably $1\times10^{-4}$ to 1 mol, relative to 1 mol of the monomer.

An amount of water added for obtaining the thermally crosslinkable polysiloxane by hydrolytically condensing these monomers is preferably 0.01 to 100 mol, more preferably 0.05 to 50 mol, and further preferably 0.1 to 30 mol, relative to 1 mol of the hydrolysable substituent bonded to the monomer. When the amount is 100 mol or less, an apparatus used for the reaction may be small, which is economical.

The procedure is as follows. The monomer is added into an aqueous solution of the catalyst to initiate the hydrolytic condensation reaction. In this case, an organic solvent may be added into the aqueous solution of the catalyst, the monomer may be previously diluted with an organic solvent, or both of them may be performed. The reaction temperature is 0 to 100° C., and preferably 5 to 80° C. A preferable method is maintaining the temperature to 5 to 80° C. during dropwise addition of the monomer, and then aging at 20 to 80° C.

Preferable organic solvents that can be added into the aqueous solution of the catalyst or that can dilute the monomer include methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, acetonitrile, tetrahydrofuran, and a mixture thereof.

Preferable solvents among these are water-soluble solvents. Examples thereof include: alcohols such as methanol, ethanol, 1-propanol, and 2-propanol; polyhydric alcohols, such as ethylene glycol and propylene glycol; polyhydric alcohols condensed derivatives, such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone; acetonitrile; and tetrahydrofuran. Particularly preferable solvents among these have a boiling point of 100° C. or lower.

An amount of the used organic solvent is preferably 0 to 1,000 ml, and particularly preferably 0 to 500 ml, relative to 1 mol of the monomer. When the amount of the used organic solvent is smaller, a reaction vessel may be smaller, which is economical.

Thereafter, neutralization reaction of the catalyst is performed as necessary to obtain an aqueous solution of the reaction mixture. In this case, an amount of an alkaline substance that can be used for the neutralization is preferably 0.1 to 2 equivalents relative to the used acid as the catalyst. This alkaline substance may be any substance as long as it exhibits alkalinity in water.

Subsequently, a byproduct, such as an alcohol, generated from the reaction mixture by the hydrolytic condensation reaction is preferably removed under reduced pressure, etc. In this time, a temperature at which the reaction mixture is heated is preferably 0 to 100° C., more preferably 10 to 90° C., and further preferably 15 to 80° C., depending on kinds of the added organic solvent and the alcohol generated in the reaction. A pressure reducing degree in this case is preferably the atmospheric pressure or lower, more preferably 80 kPa or lower on an absolute pressure, and further preferably 50 kPa or lower on an absolute pressure, which differs depending on kinds of the organic solvent and alcohol to be removed, a ventilation apparatus, a condensation apparatus, and the heating temperature. Although an amount of the removed alcohol in this case is difficult to be accurately determined, approximately 80 mass % or more of the generated alcohol is desirably removed.

Then, the acid catalyst used for the hydrolytic condensation may be removed from the reaction mixture. As a method for removing the acid catalyst, water and the solution of the thermally crosslinkable polysiloxane are mixed, and the thermally crosslinkable polysiloxane is extracted with an organic solvent. The organic solvent used in this case is preferably an organic solvent that can dissolve the thermally crosslinkable polysiloxane and that forms separated two layers with mixed with water. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and a mixture thereof.

Furthermore, a mixture of a water-soluble organic solvent and a water-hardly-soluble organic solvent can also be used. Examples of preferable mixtures include a methanol-ethyl acetate mixture, an ethanol-ethyl acetate mixture, a 1-propanol-ethyl acetate mixture, a 2-propanol-ethyl acetate mixture, a butanediol monomethyl ether-ethyl acetate mixture, a propylene glycol monomethyl ether-ethyl acetate mixture, an ethylene glycol monomethyl ether-ethyl acetate mixture, a butanediol monoethyl ether-ethyl acetate mixture, a propylene glycol monoethyl ether-ethyl acetate mixture, an ethylene glycol monoethyl ether-ethyl acetate mixture, a butanediol monopropyl ether-ethyl acetate mixture, a propylene glycol monopropyl ether-ethyl acetate mixture, an ethylene glycol monopropyl ether-ethyl acetate mixture, a methanol-methyl isobutyl ketone mixture, an ethanol-methyl isobutyl ketone mixture, a 1-propanol-methyl isobutyl ketone mixture, a 2-propanol-methyl isobutyl ketone mixture, a propylene glycol monomethyl ether-methyl isobutyl ketone mixture, an ethylene glycol monomethyl ether-methyl isobutyl ketone mixture, a propylene glycol monoethyl ether-methyl isobutyl ketone mixture, an ethylene glycol monoethyl ether-methyl isobutyl ketone mixture, a propylene glycol monopropyl ether-methyl isobutyl ketone mixture, an ethylene glycol monopropyl ether-methyl isobutyl ketone mixture, a methanol-cyclopentyl methyl ether mixture, an ethanol-cyclopentyl methyl ether mixture, a 1-propanol-cyclopentyl methyl ether mixture, a 2-propanol-cyclopentyl methyl ether mixture, a propylene glycol monomethyl ether-cyclopentyl methyl ether mixture, an ethylene glycol monomethyl ether-cyclopentyl methyl ether mixture, a propylene glycol monoethyl ether-cyclopentyl methyl ether mixture, an ethylene glycol monoethyl ether-cyclopentyl methyl ether mixture, a propylene glycol monopropyl ether-cyclopentyl methyl ether mixture, an ethylene glycol monopropyl ether-cyclopentyl methyl ether mixture, a methanol-propylene glycol methyl ether acetate mixture, an ethanol-propylene glycol methyl ether acetate mixture, a 1-propanol-propylene glycol methyl ether acetate mixture, a 2-propanol-propylene glycol methyl ether acetate mixture, a propylene glycol monomethyl ether-propylene glycol methyl ether acetate mixture, an ethylene glycol monomethyl ether-propylene glycol methyl ether acetate mixture, a propylene glycol monoethyl ether-propylene glycol methyl ether acetate mixture, an ethylene glycol monoethyl ether-propylene glycol methyl ether acetate mixture, a propylene glycol monopropyl ether-propylene glycol methyl ether acetate mixture, and an ethylene glycol monopropyl ether-propylene glycol methyl ether acetate mixture. The combination is not limited thereto.

A mixing ratio between the water-soluble organic solvent and the water-hardly-soluble organic solvent is appropriately selected, and is 0.1 to 1,000 parts by mass, preferably 1 to 500 parts by mass, and further preferably 2 to 100 parts by mass of the water-soluble organic solvent, relative to 100 parts by mass of the water-hardly-soluble organic solvent.

Subsequently, the reaction mixture may be washed with neutral water. As this water, so-called deionized water or ultrapure water is typically used. An amount of this water is 0.01 to 100 L, preferably 0.05 to 50 L, and more preferably 0.1 to 5 L, relative to 1 L of the solution of the thermally crosslinkable polysiloxane. In this washing method, the both are added into one vessel, and the mixture is stirred and left to stand to separate the aqueous layer. A washing time is one or more, and preferably one to approximately five because even ten times or more of washing may not yield an expected effect.

Examples of another method for removing the acid catalyst include: a method with an ion-exchange resin; and a method of neutralization with an epoxy compound such as ethylene oxide and propylene oxide, and then removing the neutralized product. These methods can be appropriately selected according to the acid catalyst used for the reaction.

This washing procedure with water may allow a part of the thermally crosslinkable polysiloxane to escape into the aqueous layer and yield an effect substantially same as a fractioning procedure. Thus, the washing time with water and the amount of washing water are appropriately selected with considering the effect of removing the catalyst and the effect of fractioning.

In any cases of the solution of the thermally crosslinkable polysiloxane with a remained acid catalyst and the solution of the thermally crosslinkable polysiloxane with removed acid catalyst, a final solvent is added and solvent exchange is performed under a reduced pressure to obtain a solution of the desired thermally crosslinkable polysiloxane. A temperature of the solvent exchange in this case is preferably 0 to 100° C., more preferably 10 to 90° C., and further preferably 15 to 80° C., depending on kinds of the reaction solvent and extraction solvent to be removed. A pressure reducing degree in this case is preferably the atmospheric pressure or lower, more preferably 80 kPa or lower on an absolute pressure, and further preferably 50 kPa or lower on an absolute pressure, which differs depending on a kind of the extraction solvent to be removed, a ventilation apparatus, a condensation apparatus, and the heating temperature.

In this case, the thermally crosslinkable polysiloxane may be destabilized by changing the solvent. This destabilization is caused by compatibility between the final solvent and the thermally crosslinkable polysiloxane. To prevent this destabilization, a monovalent or polyvalent alcohol having a cyclic ether as a substituent described in paragraphs (0181) to (0182) in JP 2009-126940 A may be added as a stabilizer. An amount of the stabilizer to be added is 0 to 25 parts by mass, preferably 0 to 15 parts by mass, and more preferably 0 to 5 parts by mass, relative to 100 parts by mass of the thermally crosslinkable polysiloxane in the solution before the solvent exchange. When the stabilizer is added, the amount is preferably 0.5 parts by mass or more. As necessary, the monovalent or polyvalent alcohol having a cyclic ether as a substituent is added into the solution before the solvent exchange, and then the solvent exchange procedure is performed.

The thermally crosslinkable polysiloxane has a risk of further proceeding the condensation reaction to change in an insoluble state in an organic solvent when condensed at a certain concentration or more. Thus, the thermally crosslinkable polysiloxane is preferably maintained as a solution state at an appropriate concentration. When the solution is too thin, the solvent amount becomes excessively large. Thus, the thermally crosslinkable polysiloxane is economically preferably maintained as a solution state at an appropriate concentration. The concentration in this case is preferably 0.1 to 20 mass %.

The final solvent added into the solution of the thermally crosslinkable polysiloxane is preferably alcoholic solvents. Particularly preferable alcoholic solvents are monoalkyl ether derivatives such as ethylene glycol, diethylene glycol, triethylene glycol, propylene glycol, dipropylene glycol, and butanediol. Specifically, preferable solvents include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, etc. Although being not the alcoholic solvent, propylene glycol monomethyl ether acetate can be used.

When these solvents are the main component, non-alcoholic solvents can be added as an auxiliary solvent. Examples of the auxiliary solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, and cyclopentyl methyl ether.

As another reaction procedure using the acid catalyst, water or a water-containing organic solvent is added into the monomer or an organic solution of the monomer to initiate the hydrolysis reaction. In this case, the catalyst may be added into the monomer or the organic solution of the monomer, or may be previously added into the water or the water-containing solvent. The reaction temperature is 0 to 100° C., and preferably 10 to 80° C. A preferable method is heating during dropwise addition of the water at 10 to 50° C., and then heating to age the reaction mixture at the elevated temperature of 20 to 80° C.

When being used, the organic solvent is preferably water-soluble. Examples thereof include methanol, ethanol, 1-propanol, 2-propanol, 1-butanol, 2-butanol, 2-methyl-1-propanol, acetone, tetrahydrofuran, acetonitrile, polyhydric alcohol condensed derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and a mixture thereof.

An amount of the used organic solvent is preferably 0 to 1,000 ml, and particularly preferably 0 to 500 ml, relative to 1 mol of the monomer. When the amount of the used organic solvent is smaller, a reaction vessel may be smaller, which is economical. The obtained reaction mixture can be after-treated in the same manner as the above method to obtain the thermally crosslinkable polysiloxane.

(Synthetic Method 2: Alkali Catalyst)

The thermally crosslinkable polysiloxane (Sx: thermally crosslinkable polysiloxane) can also be manufactured by hydrolytically condensing a mixture of one or more kinds of the hydrolysable monomer (Sm) in the presence of an alkali catalyst. Examples of the alkali catalyst used in this case include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethylmonoethanolamine, monomethyldiethanolamine, triethanolamine, diazabicyclooctane, diazabicyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. An amount of the used catalyst is $1\times10^{-6}$ to 10 mol, preferably $1\times10^{-5}$ to 5 mol, and more preferably $1\times10^{-4}$ to 1 mol, relative to 1 mol of the silicon monomer.

An amount of water added for obtaining the thermally crosslinkable polysiloxane by hydrolytically condensing these monomers is preferably 0.1 to 50 mol relative to 1 mol of the hydrolysable substituent bonded to the monomer. When the amount is 50 mol or less, an apparatus used for the reaction may be small, which is economical.

The procedure is as follows. The monomer is added into an aqueous solution of the catalyst to initiate the hydrolytic condensation reaction. In this case, an organic solvent may be added into the aqueous solution of the catalyst, the monomer may be previously diluted with an organic solvent, or both of them may be performed. The reaction temperature is 0 to 100° C., and preferably 5 to 80° C. A preferable method is maintaining the temperature at 5 to 80° C. during dropwise addition of the monomer, and then aging at 20 to 80° C.

Preferably used organic solvents that can be added into the aqueous solution of the alkali catalyst or that can dilute the monomer include organic solvents same as the exemplified organic solvent that can be added into the aqueous solution of the acid catalyst. An amount of the used organic solvent is preferably 0 to 1,000 ml relative to 1 mol of the monomer for proceeding economical reaction.

Thereafter, neutralization reaction of the catalyst is performed as necessary to obtain an aqueous solution of the reaction mixture. In this case, an amount of an acidic substance that can be used for the neutralization is preferably 0.1 to 2 equivalents relative to the used alkaline substance as the catalyst. This acidic substance may be any substance as long as it exhibits acidity in water.

Subsequently, a byproduct, such as an alcohol, generated from the reaction mixture by the hydrolytic condensation reaction is preferably removed under reduced pressure, etc. In this time, a temperature at which the reaction mixture is heated is preferably 0 to 100° C., more preferably 10 to 90° C., and further preferably 15 to 80° C., depending on kinds of the added organic solvent and alcohol generated in the reaction. A pressure reducing degree in this case is preferably the atmospheric pressure or lower, more preferably 80 kPa or lower on an absolute pressure, and further preferably 50 kPa or lower on an absolute pressure, which differs depending on kinds of the organic solvent and alcohol to be removed, a ventilation apparatus, a condensation apparatus, and the heating temperature. Although an amount of the removed alcohol in this case is difficult to be accurately determined, approximately 80 mass % or more of the generated alcohol is desirably removed.

Then, to remove the catalyst used for the hydrolytic condensation, the thermally crosslinkable polysiloxane is extracted with an organic solvent. The organic solvent used in this case is preferably an organic solvent that can dissolve the thermally crosslinkable polysiloxane and that forms separated two layers with mixed with water. Examples thereof include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and a mixture thereof.

Then, to remove the alkali catalyst used for the hydrolytic condensation, the thermally crosslinkable polysiloxane is extracted with an organic solvent. The organic solvent used in this case is preferably an organic solvent that can dissolve the thermally crosslinkable polysiloxane and that forms separated two layers with mixed with water. Furthermore, a mixture of a water-soluble organic solvent and a water-hardly-soluble organic solvent can also be used.

Specific examples of the organic solvent used for removing the alkali catalyst include: the specifically exemplified organic solvents used for removing the acid catalyst; and a mixture same as the mixture of the water-soluble organic solvent and the water-hardly soluble organic solvent.

A mixing ratio between the water-soluble organic solvent and the water-hardly-soluble organic solvent is appropriately selected, and is 0.1 to 1,000 parts by mass, preferably 1 to 500 parts by mass, and further preferably 2 to 100 parts by mass of the water-soluble organic solvent, relative to 100 parts by mass of the water-hardly-soluble organic solvent.

Subsequently, the reaction mixture is washed with neutral water. As this water, so-called deionized water or ultrapure water is typically used. An amount of this water is 0.01 to 100 L, preferably 0.05 to 50 L, and more preferably 0.1 to 5 L, relative to 1 L of the solution of the thermally crosslinkable polysiloxane. In this washing method, the both are added into one vessel, and the mixture is stirred and left to stand to separate the aqueous layer. A washing time is one or more, and preferably one to approximately five because even ten times or more of washing may not yield an expected effect.

Into the washed solution of the thermally crosslinkable polysiloxane, a final solvent is added and solvent exchange is performed under a reduced pressure to obtain a solution of the desired thermally crosslinkable polysiloxane. A temperature of the solvent exchange in this case is preferably 0 to 100° C., more preferably 10 to 90° C., and further preferably 15 to 80° C., depending on a kind of the extraction solvent to be removed. A pressure reducing degree in this case is preferably the atmospheric pressure or lower, more preferably 80 kPa or lower on an absolute pressure, and further preferably 50 kPa or lower on an absolute pressure, which differs depending on a kind of the extraction solvent to be removed, a ventilation apparatus, a condensation apparatus, and the heating temperature.

The final solvent added into the solution of the thermally crosslinkable polysiloxane is preferably alcoholic solvents. Particularly preferable alcoholic solvents are monoalkyl ethers of ethylene glycol, diethylene glycol, triethylene glycol, etc.; and monoalkyl ethers of propylene glycol, dipropylene glycol, etc. Specifically, preferable solvents include propylene glycol monomethyl ether, ethylene glycol monomethyl ether, propylene glycol monoethyl ether, ethylene glycol monoethyl ether, propylene glycol monopropyl ether, ethylene glycol monopropyl ether, and diacetone alcohol.

As another reaction procedure using the alkali catalyst, water or a water-containing organic solvent is added into the monomer or an organic solution of the monomer to initiate the hydrolysis reaction. In this case, the catalyst may be added into the monomer or the organic solution of the monomer, or may be previously added into the water or the water-containing solvent. The reaction temperature is 0 to 100° C., and preferably 10 to 80° C. A preferable method is heating at 10 to 50° C. during dropwise addition of the water, and then heating to age the reaction mixture at the elevated temperature of 20 to 80° C.

The usable organic solvent as the organic solution of the monomer or the water-containing organic solvent is preferably water-soluble. Examples thereof include methanol, ethanol, 1-propanol, 2-propanol, 1-butanol, 2-butanol, 2-methyl-1-propanol, acetone, tetrahydrofuran, acetonitrile, polyhydric alcohol condensed derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; and a mixture thereof.

A molecular weight of the thermally crosslinkable polysiloxane obtained by the above synthetic method 1 or 2 can be regulated by not only selecting the monomer but also controlling the reaction condition of the polymerization. A preferably used thermally crosslinkable polysiloxane has a weight-average molecular weight (Mw) of 100,000 or less, more preferably 200 to 50,000, further preferably 300 to 30,000. When the thermally crosslinkable polysiloxane having a weight-average molecular weight of 100,000 or less is used, no foreign matter nor coating unevenness occurs.

Note that, data on the above weight-average molecular weight indicates the molecular weight in terms of polystyrene by gel permeation chromatography (GPC) using tetrahydrofuran as an eluent solvent, using RI as a detector, and using polystyrene as a standard substance.

The thermally crosslinkable polysiloxane used in the present invention has different physical properties depending on kinds of the acid or alkali catalyst used in the hydrolytic condensation and the reaction condition. Thus, the catalyst and the reaction condition can be appropriately selected according to a target performance of the silicon-containing metal oxide film.

A content of the thermally crosslinkable polysiloxane (Sx) (B) is preferably 5 to 1900 parts by mass relative to 100 parts by mass of the metal oxide nanoparticle (A).

A weight ratio between the metal oxide nanoparticle (A) and the thermally crosslinkable polysiloxane (B) in the inventive composition for forming a silicon-containing metal hard mask is preferably 5/95 to 95/5, and more preferably 10/90 to 90/10.

Regulating the ratio between the metal oxide nanoparticle (A) and the thermally crosslinkable polysiloxane (B) within the above range can highly exhibit dry etching resistance, filling/planarizing ability, and adhesiveness to an ultrafine resist pattern. For improved dry etching resistance, the proportion of the metal oxide nanoparticle (A) is increased. For improved filling/planarizing ability and adhesiveness to a resist pattern, the proportion of the thermally crosslinkable polysiloxane (B) is increased. These proportions can be regulated to any proportions according to the required performance.

Other Components (Crosslinking Catalyst)

In the present invention, a crosslinking catalyst (Xc) may be blended with the composition for forming a silicon-containing metal hard mask. Examples of the crosslinking catalyst (Xc) that can be blended include compounds represented by the following general formula (Xc0).

$$L_aH_bA \quad \text{(Xc0)}$$

In the formula, L represents lithium, sodium, potassium, rubidium, cesium, a sulfonium, an iodonium, a phosphonium, or an ammonium. A represents a non-nucleophilic counterion. "a" represents an integer of 1 or more, "b" represents an integer of 0 or 1 or more, and "a+b" represents a valency of the non-nucleophilic counterion.

Examples of the crosslinking catalyst (Xc) as specific (Xc0) used in the present invention include sulfonium salts represented by the following general formula (Xc-1), iodonium salts represented by the following general formula (Xc-2), phosphonium salts represented by the following general formula (Xc-3), ammonium salts represented by the following general formula (Xc-4), and alkali metal salts.

Examples of the sulfonium salts (Xc-1), the iodonium salts (Xc-2), and the phosphonium salts (Xc-3) include the following salts.

(Xc-1)

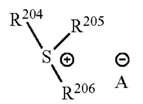

(Xc-2)

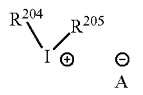

(Xc-3)

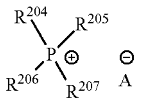

Examples of the ammonium salts (Xc-4) include the following salts.

(Xc-4)

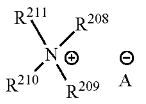

In the formula, $R^{204}$, $R^{205}$, $R^{206}$, and $R^{207}$ each represent a linear, branched, or cyclic alkyl group, an alkenyl group, an oxoalkyl group, or an oxoalkenyl group having 1 to 12 carbon atoms, a substituted or unsubstituted aryl group having 6 to 20 carbon atoms, or an aralkyl group or an aryloxoalkyl group having 7 to 12 carbon atoms. A part or all of hydrogen atoms of these groups are optionally substituted with an alkoxy group, etc. $R^{201}$ and $R^{206}$ optionally form a ring, and when forming the ring, $R^{201}$ and $R^{206}$ each represent an alkylene group having 1 to 6 carbon atoms. $A^-$ represents a non-nucleophilic counterion. $R^{208}$, $R^{209}$, $R^{210}$, and $R^{211}$ represent same as $R^{204}$, $R^{205}$, $R^{206}$, and $R^{207}$, or may be a hydrogen atom. $R^{208}$ and $R^{209}$, and $R^{208}$, $R^{209}$, and $R^{210}$ optionally form a ring and when forming the ring, $R^{208}$ and $R^{209}$, and $R^{208}$, $R^{209}$, and $R^{210}$ each represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be same as or different from each other. Specific examples thereof include: alkyl groups, such as a methyl group, an ethyl group, a propyl group, an isopropyl group, an n-butyl group, a sec-butyl group, a tert-butyl group, a pentyl group, a hexyl group, a heptyl group, and an octyl group; and a cyclopentyl group, a cyclohexyl group, a cycloheptyl group, a cyclopropylmethyl group, a 4-methylcyclohexyl group, a cyclohexylmethyl group, a norbornyl group, and an adamantyl group. Examples of the alkenyl group include a vinyl group, an allyl group, a propenyl group, a butenyl group, a hexenyl group, and a cyclohexenyl group. Examples of the oxoalkyl group include a 2-oxocyclopentyl group, a 2-oxocyclohexyl group, a 2-oxopropyl group, a 2-cyclopentyl-2-oxoethyl group, a 2-cyclohexyl-2-oxoethyl group, and a 2-(4-methylcyclohexyl)-2-oxoethyl group. Examples of the aryl group include: a phenyl group and a naphthyl group; alkoxylphenyl groups, such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups, such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups, such as a methylnaphthyl group and an ethylnaphthyl group; alkoxynaphthyl groups, such as a methoxynaphthyl group and an ethoxynaphthyl group; dialkylnaphthyl groups, such as a dimethylnaphthyl group and a diethylnaphthyl group; and dialkoxynaphthyl groups, such as a dimethoxynaphthyl group and a diethoxynaphthyl group. Examples of the aralkyl group include a benzyl group, a phenylethyl group, and a phenethyl group. Examples of the aryloxoalkyl group include 2-aryl-2-oxoethyl groups, such as a 2-phenyl-2-oxoethyl group, a 2-(1-naphthyl)-2-oxoethyl group, and a 2-(2-naphthyl)-2-oxoethyl group.

Examples of $A^-$ being the non-nucleophilic counterion include: monovalent ions, such as a hydroxide ion, a formate ion, an acetate ion, a propionate ion, a butanoate ion, a pentanoate ion, a hexanoate ion, a heptanoate ion, an octanoate ion, a nonanoate ion, a decanoate ion, an oleate ion, a stearate ion, a linoleate ion, a linolenate ion, a benzoate ion, a phthalate ion, an isophthalate ion, a terephthalate ion, a salicylate ion, a trifluoroacetate ion, a monochloroacetate ion, a dichloroacetate ion, a trichloroacetate ion, a fluoride ion, a chloride ion, a bromide ion, an iodide ion, a nitrate ion, a nitrite ion, a chlorate ion, a bromate ion, a methanesulfonate ion, a paratoluenesulfonate ion, and a monomethylsulfate ion; and a monovalent or divalent ion of oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate, and sulfate ion.

Examples of the alkali metal salt include monovalent salts, such as hydroxide salts, formate salts, acetate salts, propionate salts, butanoate salts, pentanoate salts, hexanoate salts, heptanoate salts, octanoate salts, nonanoate salts, decanoate salts, oleate salts, stearate salts, linoleate salts, linolenate salts, benzoate salts, phthalate salts, isophthalate salts, terephthalate salts, salicylate salts, trifluoroacetate salts, monochloroacetate salts, dichloroacetate salts, and trichloroacetate salts, and monovalent or divalent salts of oxalate salts, malonate salts, methylmalonate salts, ethylmalonate salts, propylmalonate salts, butylmalonate salts, dimethylmalonate salts, diethylmalonate salts, succinate salts, methylsuccinate salts, glutarate salts, adipate salts, itaconate salts, maleate salts, fumarate salts, citraconate salts, citrate salts, carbonate, and sulfate salts, each of which is any salt of lithium, sodium, potassium, cesium, magnesium, and calcium.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, and bistriphenylsulfonium carbonate.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, and bisdiphenyliodonium carbonate.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, and bistetraphenylphosphonium carbonate.

Specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenylammonium dichloroacetate, benzyldimethylphenylammonium trichloroacetate, benzyldimethylphenylammonium hydroxide, benzyldimethylphenylammonium nitrate, benzyldimethylphenylammonium chloride, benzyldimethylphenylammonium bromide, benzyldimethylphenylammonium iodide, benzyldimethylphenylammonium methanesulfonate benzyldimethylphenylammonium monomethylsulfate, benzyldimethylphenylammonium oxalate, benzyldimethylphenylammonium malonate, benzyldimethylphenylammonium maleate, benzyldimethylphenylammonium fumarate, benzyldimethylphenylammonium citraconate, benzyldimethylphenylammonium citrate, benzyldimethylphenylammonium carbonate, bisbenzyldimethylphenylammonium oxalate, bisbenzyldimethylphenylammonium malonate, bisbenzyldimethylphenylammonium maleate, bisbenzyldimethylphenylammonium fumarate, bisbenzyldimethylphenylammonium citraconate, bisbenzyldimethylphenylammonium citrate, and bisbenzyldimethylphenylammonium carbonate.

Examples of the alkali metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, and potassium carbonate.

In the present invention, a polysiloxane (Xc-10) having an ammonium salt, a sulfonium salt, a phosphonium salt, or an iodonium salt at a part of the structure may be blended with the composition for forming a silicon-containing metal hard mask as the crosslinking catalyst (Xc).

As a raw material used for manufacturing the used (Xc-10), a compound represented by the following general formula (Xm) can be used.

$$R^{1A}{}_{A1}R^{2A}{}_{A2}R^{3A}{}_{A3}Si(OR^{0A})_{(4-A1-A2-A3)} \quad (Xm)$$

In the formula, $R^{0A}$ represents a hydrocarbon group having 1 to 6 carbon atom. At least one of $R^{1A}$, $R^{2A}$, and $R^{3A}$ represents an organic group having the ammonium salt, the sulfonium salt, the phosphonium salt, or the iodonium salt, and the others represent a hydrogen atom or a monovalent organic group having 1 to 30 carbon atoms. A1, A2, and A3 represent 0 or 1, and $1 \leq A1+A2+A3 \leq 3$.

Examples of $R^{0A}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

Examples of Xm include a compound being a hydrolysable silicon compound having a sulfonium salt as a part of the structure and represented by the following formula (Xm-1).

(Xm-1)

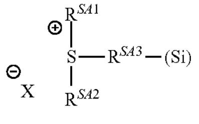

In the formula, $R^{SA1}$ and $R^{SA2}$ each represent a linear, branched, or cyclic alkyl group, an alkenyl group, an oxoalkyl group, or an oxoalkenyl group having 1 to 20 carbon atoms, a substituted or unsubstituted aryl group having 6 to 20 carbon atoms, or an aralkyl group or an aryloxoalkyl group having 7 to 20 carbon atoms. These groups represent a monovalent organic group in which a part or all of hydrogen atoms of these groups are optionally substituted with an alkoxy group, an amino group, an alkylamino group, a halogen atom, etc. $R^{SA1}$ and $R^{SA2}$ optionally form a ring together with the sulfur atom to which $R^{SA1}$ and $R^{SA2}$ are bonded, and when forming the ring, $R^{SA1}$ and $R^{SA2}$ each represent an alkylene group having 1 to 6 carbon atoms. $R^{SA3}$ represents a linear, branched, or cyclic alkylene group or an alkenylene group having 1 to 20 carbon atoms, a substituted or unsubstituted arylene group having 6 to 20 carbon atoms, or a divalent organic group in which a part or all of hydrogen atoms of the groups are optionally substituted with an alkoxy group, an amino group, an alkylamino group, etc.

In the formula (Xm-1), (Si) is shown to represent a bonding position to Si.

Examples of $X^-$ include a hydroxide ion, a fluoride ion, a chloride ion, a bromide ion, an iodide ion, a formate ion, an acetate ion, a propionate ion, a butanoate ion, a pentanoate ion, a hexanoate ion, a heptanoate ion, an octanoate ion, a nonanoate ion, a decanoate ion, an oleate ion, a stearate ion, a linoleate ion, a linolenate ion, a benzoate ion, a p-methylbenzoate ion, a p-t-butylbenzoate ion, a phthalate ion, an isophthalate ion, a terephthalate ion, a salicylate ion, a trifluoroacetate ion, a monochloroacetate ion, a dichloroacetate ion, a trichloroacetate ion, a nitrate ion, a chlorate ion, a perchlorate ion, a bromate ion, an iodate ion, a methanesulfonate ion, a benzenesulfonate ion, a toluenesulfonate ion, and a monomethylsulfate ion, a hydrogen sulfate ion, an oxalate ion, a malonate ion, a methylmalonate ion, an ethylmalonate ion, a propylmalonate ion, a butylmalonate ion, a dimethylmalonate ion, a diethylmalonate ion, a succinate ion, a methylsuccinate ion, a glutarate ion, an adipate ion, an itaconate ion, a maleate ion, a fumarate ion, a citraconate ion, a citrate ion, and a carbonate ion.

Specific examples of the cation portion of the compound represented by the general formula (Xm-1) include the following ions.

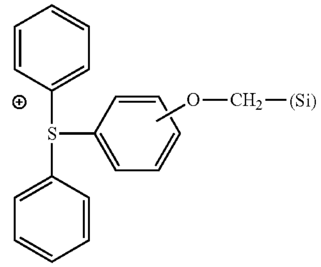

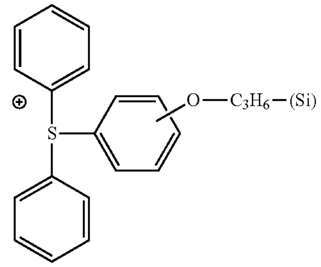

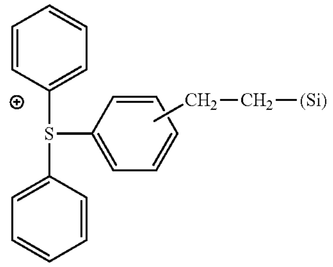

-continued

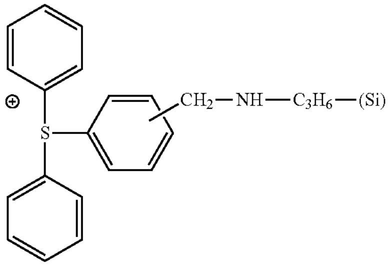

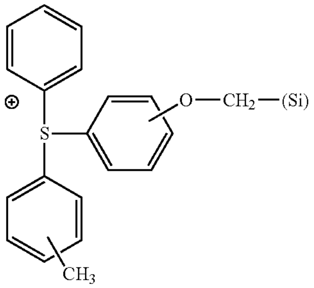

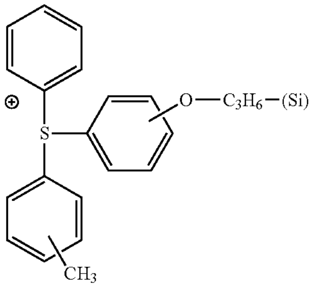

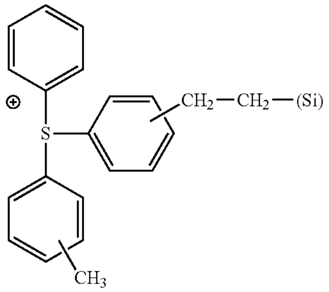

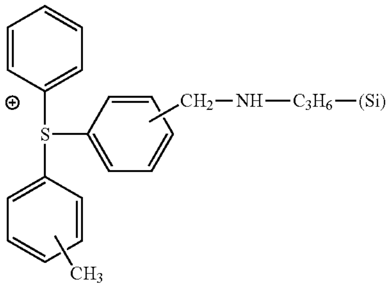

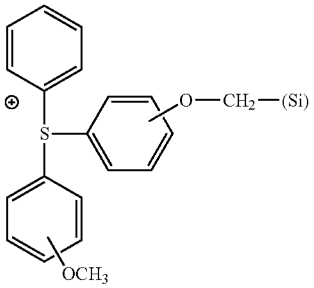

-continued
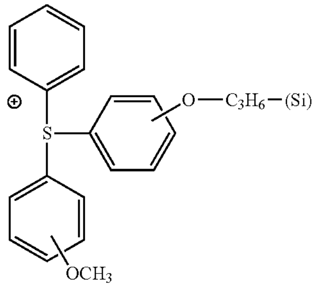
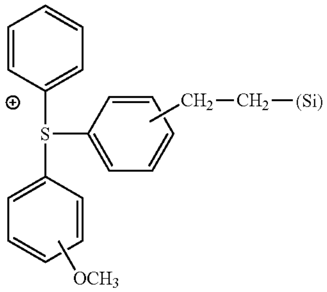
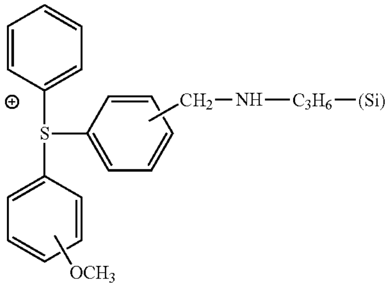
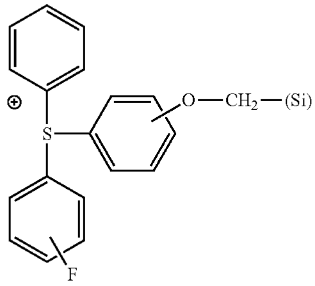
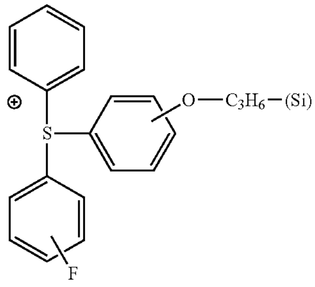
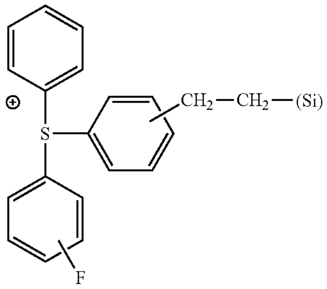
-continued
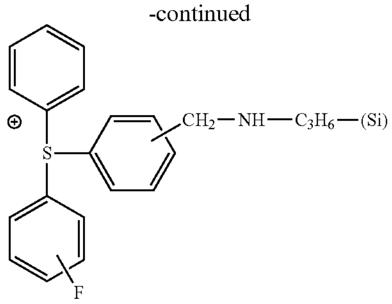
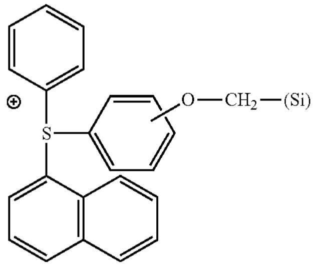
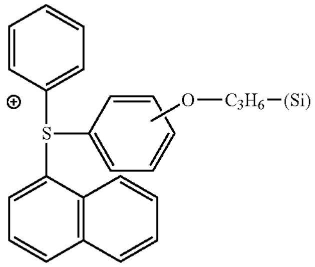
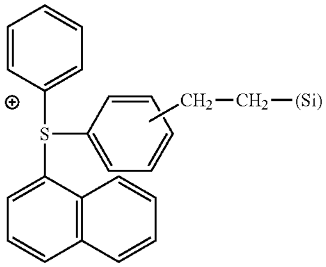
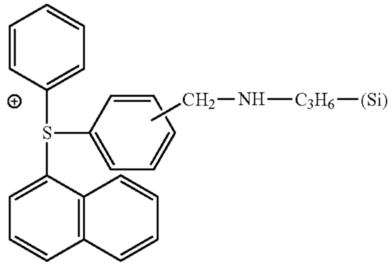
Examples of the hydrolysable silicon compound having an iodonium salt as a part of the structure include the following general formula (Xm-2).
(Xm-2)
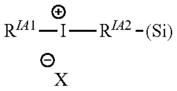
In the formula, $R^{IA1}$ represents a linear, branched, or cyclic alkyl group, an alkenyl group, an oxoalkyl group, or an oxoalkenyl group having 1 to 20 carbon atoms, a substituted or unsubstituted aryl group having 6 to 20 carbon atoms, or an aralkyl group or an aryloxoalkyl group having 7 to 20 carbon atoms. These groups represent a monovalent organic group in which a part or all of hydrogen atoms of these groups are optionally substituted with an alkoxy group, an amino group, an alkylamino group, a halogen atom, etc. $R^{IA2}$ represents a linear, branched, or cyclic alkylene group or an alkenylene group having 1 to 20 carbon atoms, a substituted or unsubstituted arylene group having 6 to 20 carbon atoms, or a divalent organic group in which a part or all of hydrogen atoms of these groups are optionally substituted with an alkoxy group, an amino group, an alkylamino group, etc.

In the general formula (Xm-2), (Si) is shown to represent a bonding position to Si. $X^-$ represents the same as above.

Specific examples of the cation portion of the compound represented by the general formula (Xm-2) include the following ions.

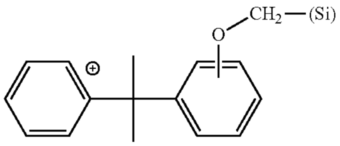

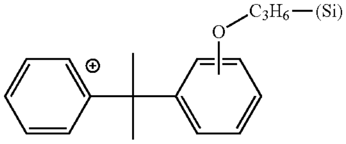

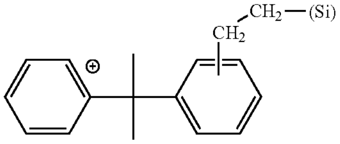

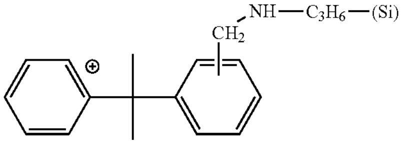

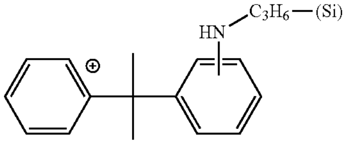

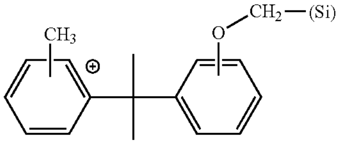

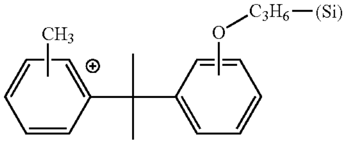

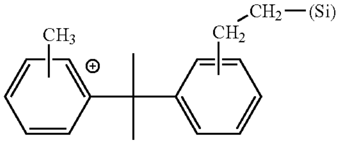

-continued

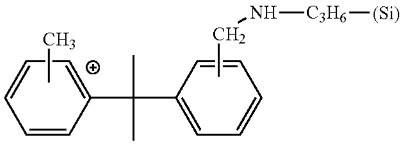

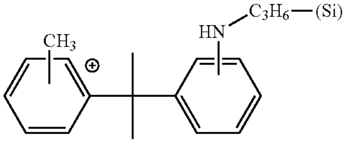

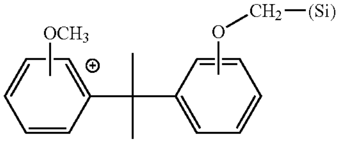

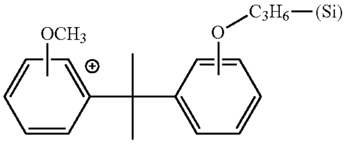

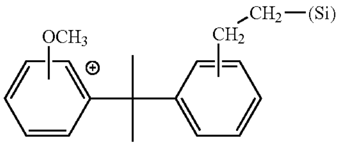

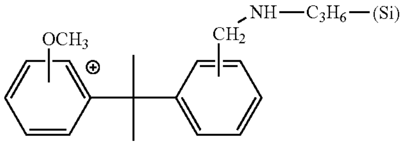

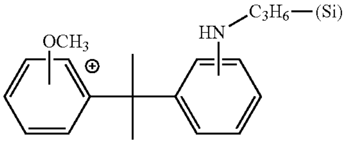

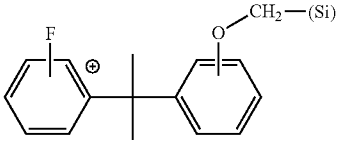

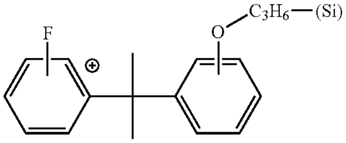

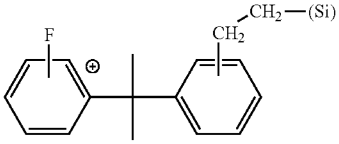

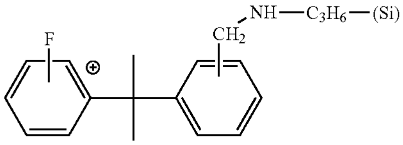

-continued

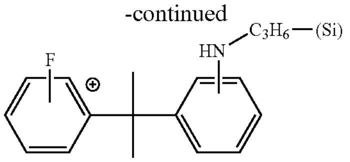

Examples of the hydrolysable silicon compound having a phosphonium salt as a part of the structure include the following general formula (Xm-3).

(Xm-3)

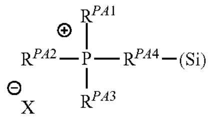

In the formula, $R^{PA1}$, $R^{PA2}$, and $R^{PA3}$ each represent a linear, branched, or cyclic alkyl group, an alkenyl group, an oxoalkyl group, or an oxoalkenyl group having 1 to 20 carbon atoms, a substituted or unsubstituted aryl group having 6 to 20 carbon atoms, or an aralkyl group or an aryloxoalkyl group having 7 to 20 carbon atoms. A part or all of hydrogen atoms of these groups are optionally substituted with an alkoxy group, an amino group, an alkylamino group, a halogen atom, etc. $R^{PA1}$ and $R^{PA2}$ optionally form a ring together with the phosphorus atom to which $R^{PA1}$ and $R^{PA2}$ are bonded, and when forming the ring, $R^{PA1}$ and $R^{PA2}$ each represent an alkylene group having 1 to 6 carbon atoms. $R^{PA4}$ represents a linear, branched, or cyclic alkylene group or an alkenylene group having 1 to 20 carbon atoms, or a substituted or unsubstituted arylene group having 6 to 20 carbon atoms. A part or all of hydrogen atoms of these groups are optionally substituted with an alkoxy group, an amino group, an alkylamino group, etc.

In the formula (Xm-3), (Si) is shown to represent a bonding position to Si. $X^-$ represents the same as above.

Specific examples of the cation portion of the compound represented by the general formula (Xm-3) include the following ions.

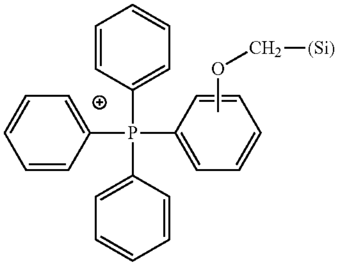

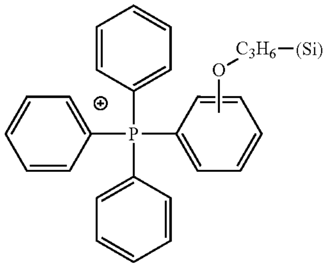

-continued

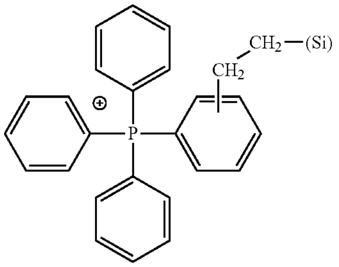

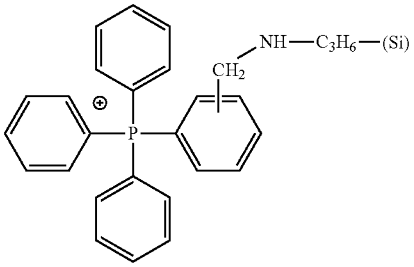

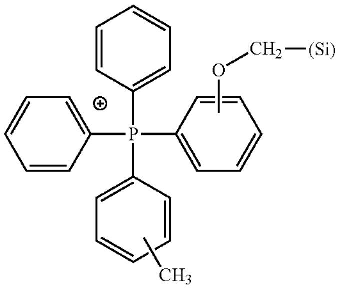

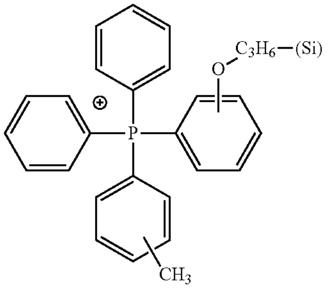

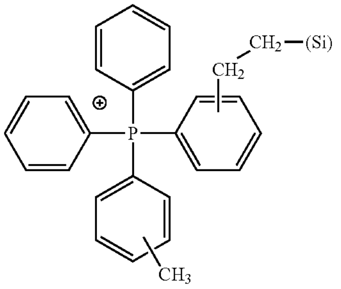

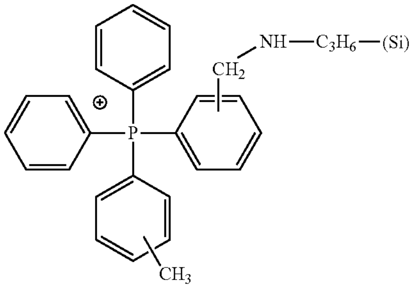

-continued
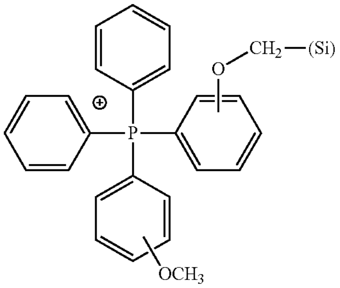
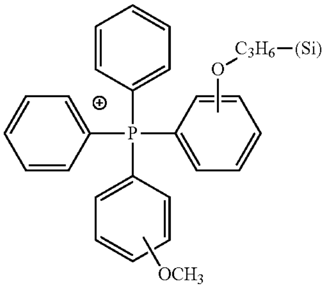
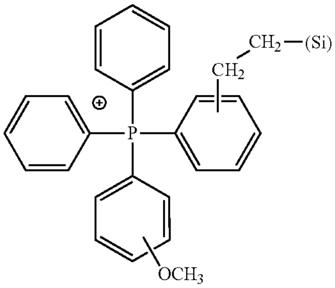
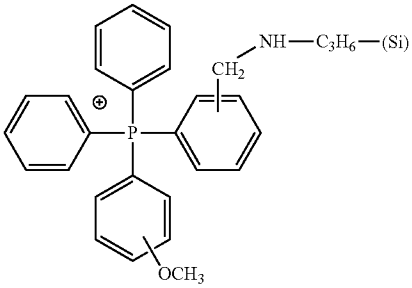
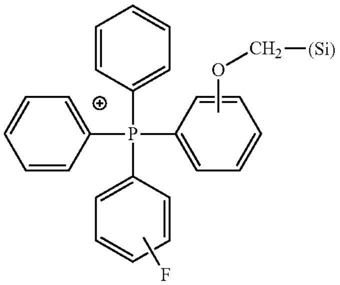
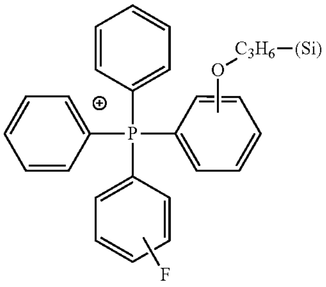
-continued
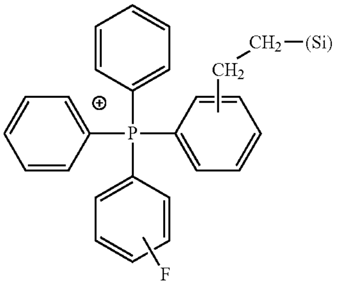
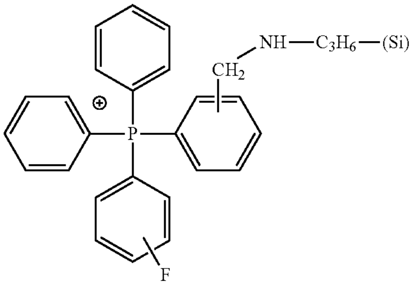
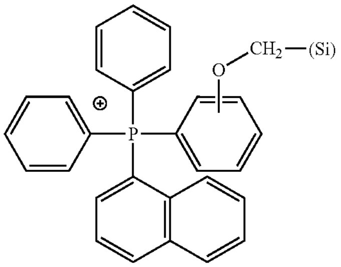
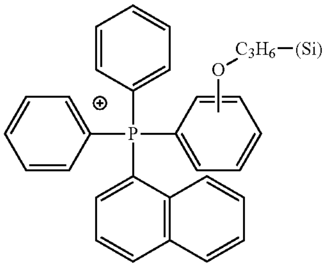
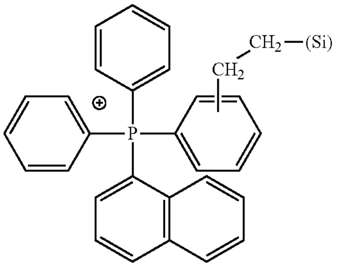
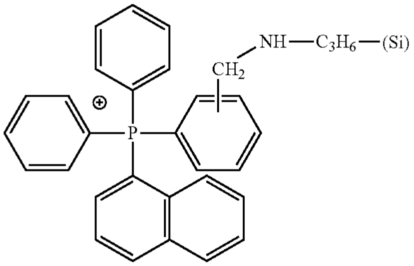

-continued

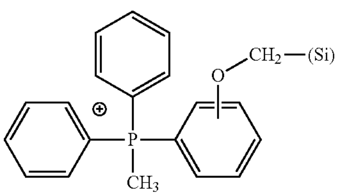

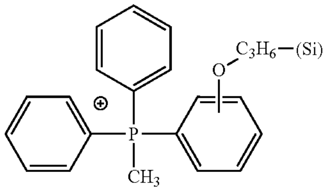

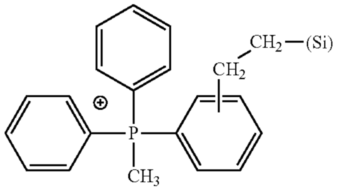

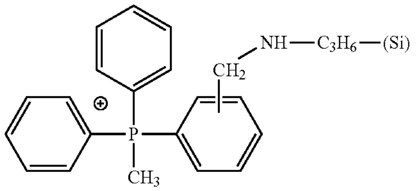

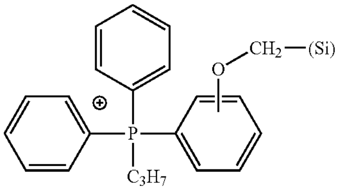

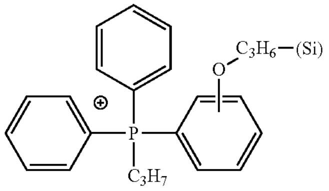

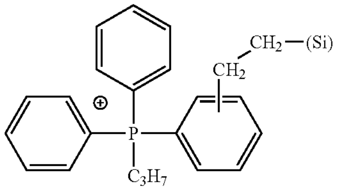

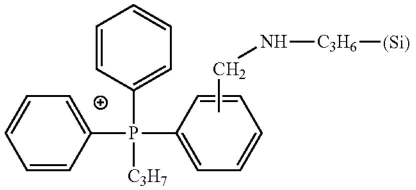

-continued

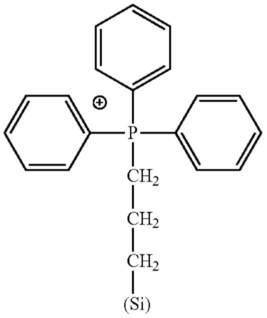

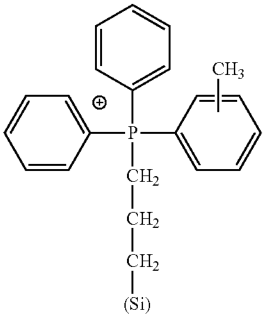

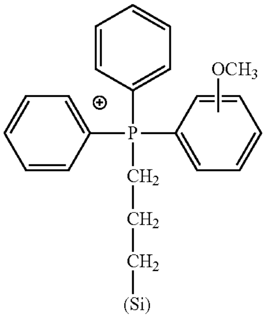

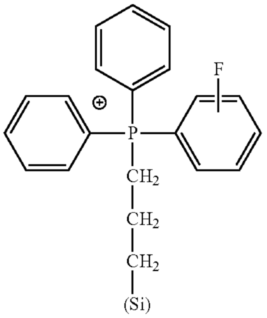

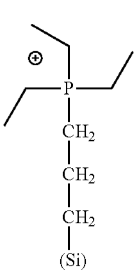

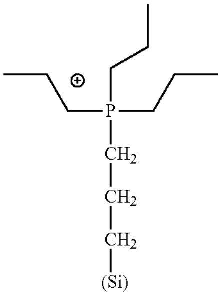

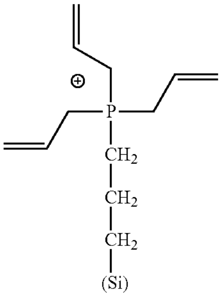

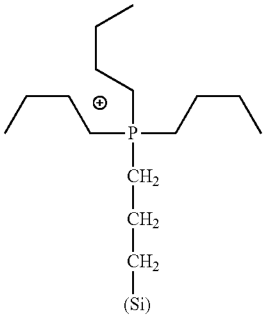

Examples of the hydrolysable silicon compound having an ammonium salt as a part of the structure include the following general formula (Xm-4).

(Xm-4)

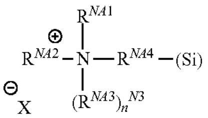

In the formula, $R^{NA1}$, $R^{NA2}$, and $R^{NA3}$ each represent hydrogen, a linear, branched, or cyclic alkyl group, an alkenyl group, an oxoalkyl group, or an oxoalkenyl group having 1 to 20 carbon atoms, a substituted or unsubstituted aryl group having 6 to 20 carbon atoms, or an aralkyl group or an aryloxoalkyl group having 7 to 20 carbon atoms. These groups represent a monovalent organic group in which a part or all of hydrogen atoms of these groups are optionally substituted with an alkoxy group, an amino group, an alkylamino group, etc. $R^{NA1}$ and $R^{NA2}$ optionally form a ring together with the nitrogen atom to which $R^{NA1}$ and $R^{NA2}$ are bonded, and when forming the ring, $R^{NA1}$ and $R^{NA2}$ each represent an alkylene group having 1 to 6 carbon atoms, a nitrogen-containing cyclic hetero ring or heteroaromatic ring. $R^{NA4}$ represents a linear, branched, or cyclic alkylene group or an alkenylene group having 1 to 30 carbon atoms, a substituted or unsubstituted arylene group having 6 to 30 carbon atoms. These groups represent a divalent organic group in which a part or all of hydrogen atoms of these groups are optionally substituted with an alkoxy group, an amino group, an alkylamino group, etc. In a case where $R^{NA1}$ and $R^{NA2}$ or $R^{NA1}$ and $R^{NA4}$ form a cyclic structure and further have an unsaturated nitrogen, $n^{N3}$=0. In the other case, $n^{N3}$=1.

In the formula (Xm-4), (Si) is shown to represent a bonding position to Si. $X^-$ represents the same as above.

Specific examples of the cation portion of the compound represented by the general formula (Xm-4) include the following ions.

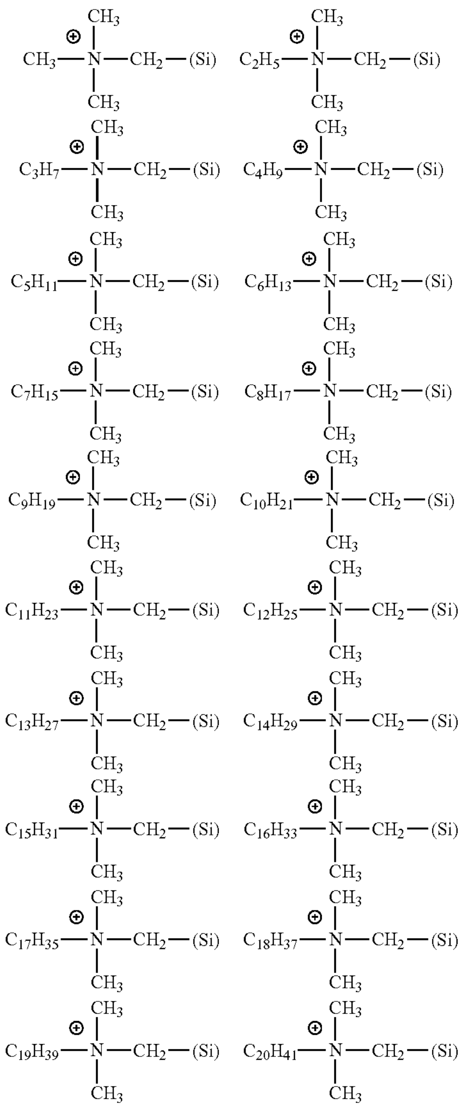

-continued

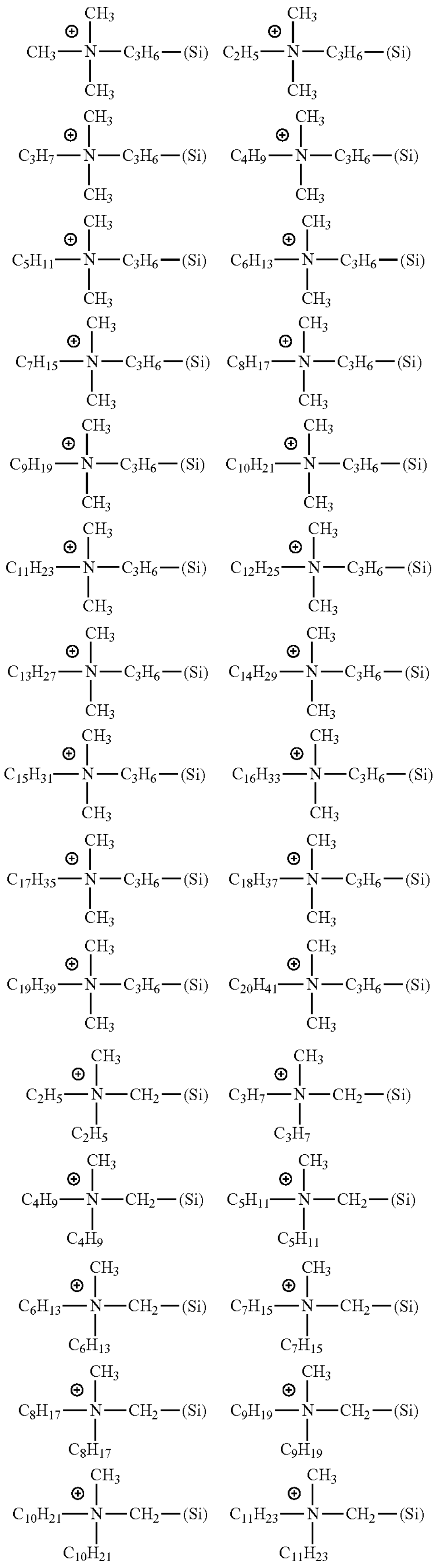

-continued
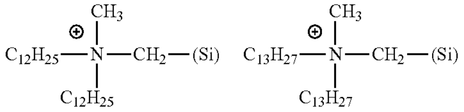
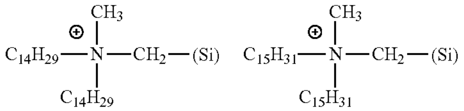
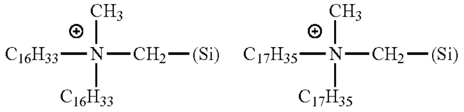
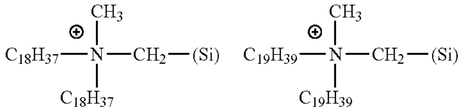
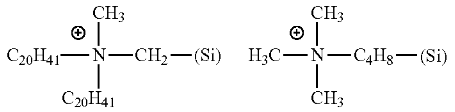
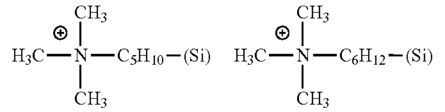
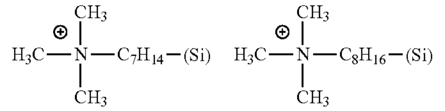
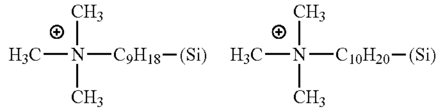
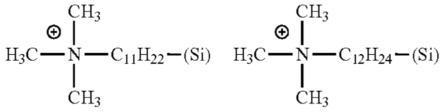
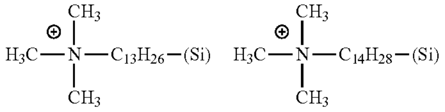
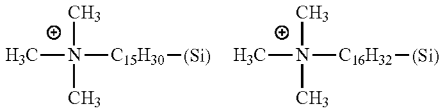
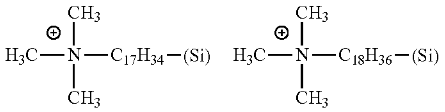
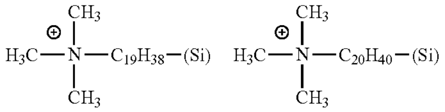
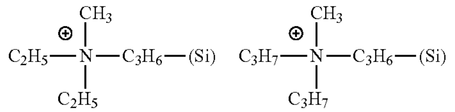
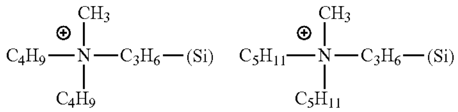
-continued
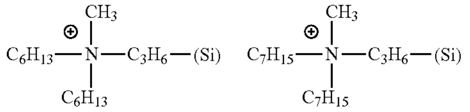
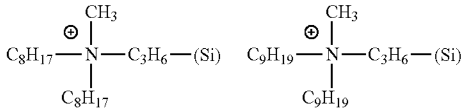
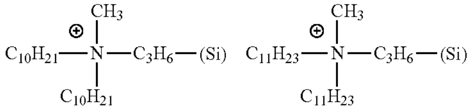
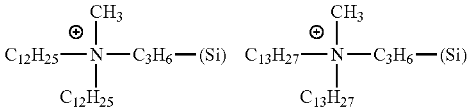
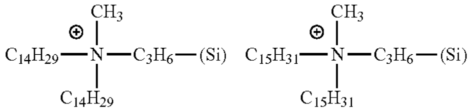
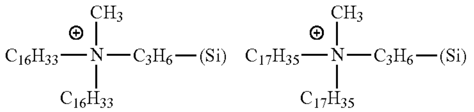
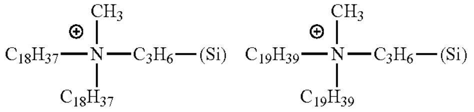
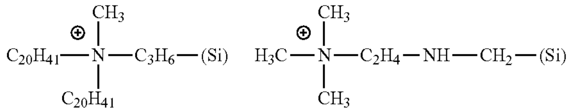
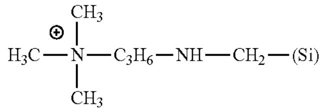
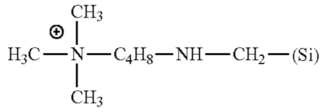
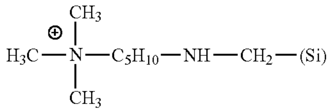
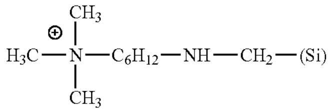
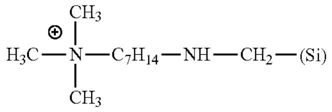
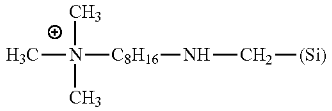
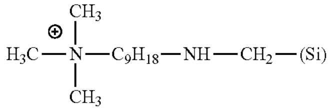

-continued
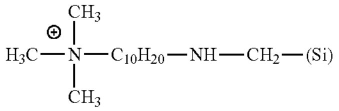
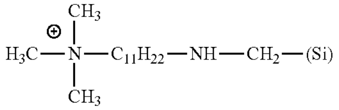
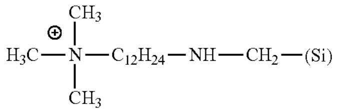
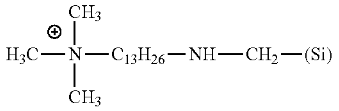
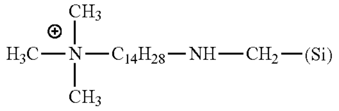
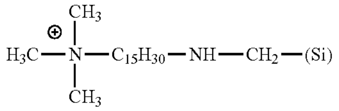
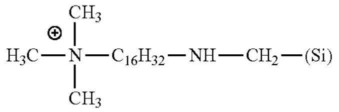
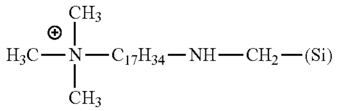
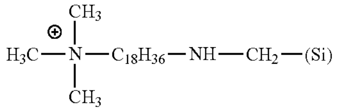
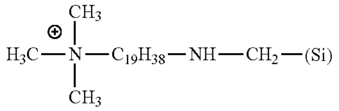
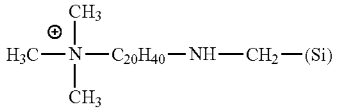
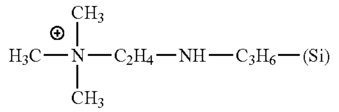
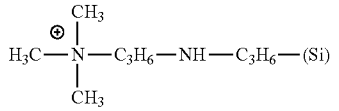
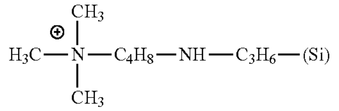
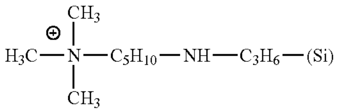
-continued
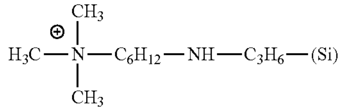
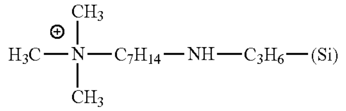
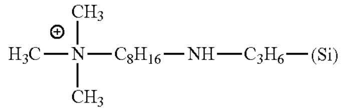
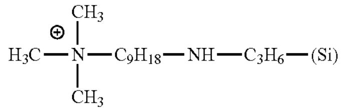
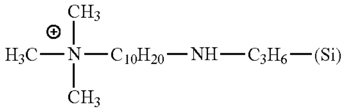
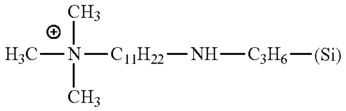
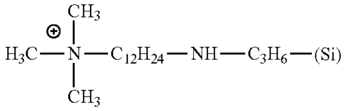
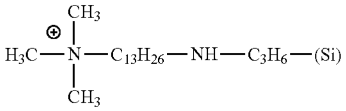
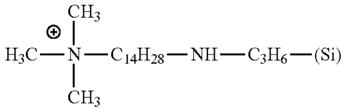
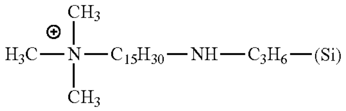
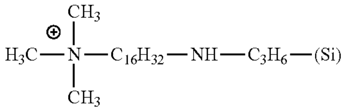
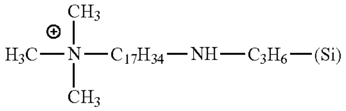
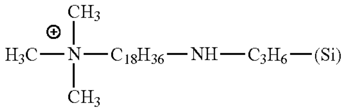
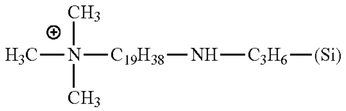

-continued
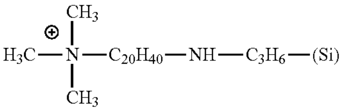
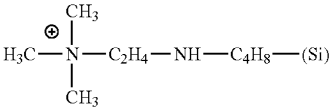
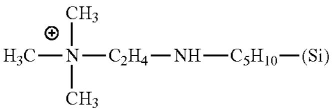
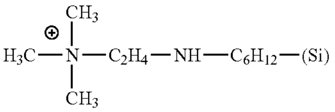
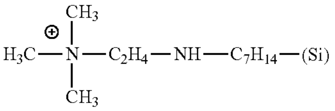
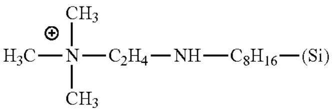
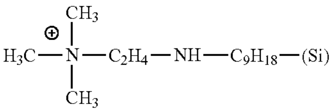
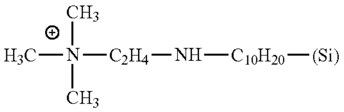
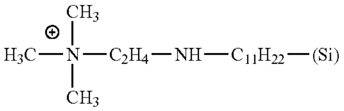
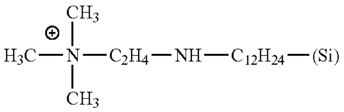
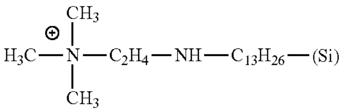
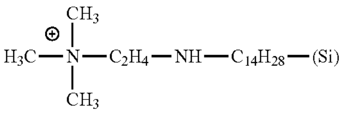
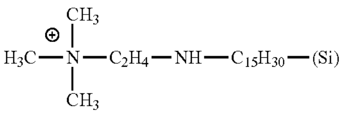
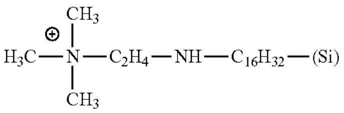
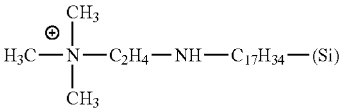
-continued
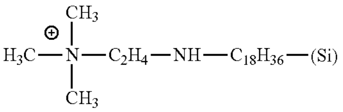
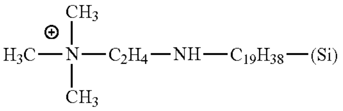
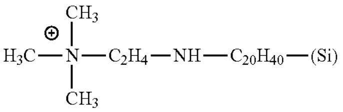
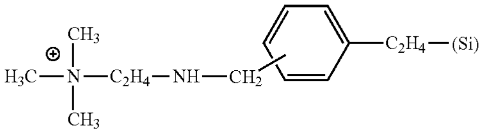
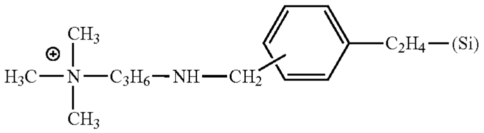
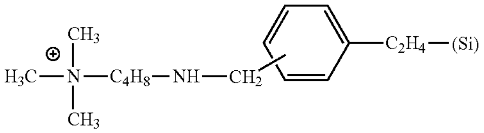
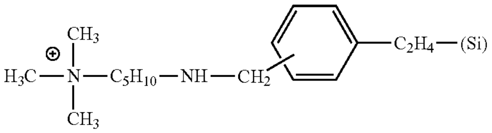
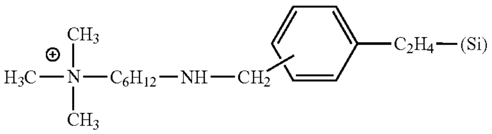
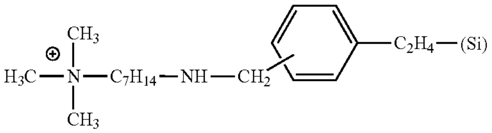
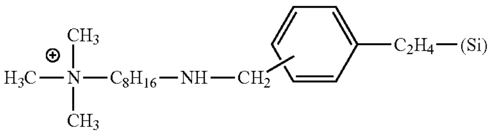
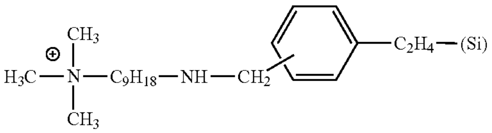
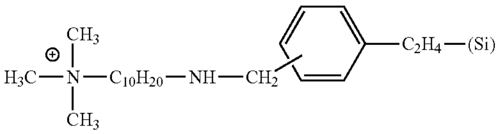
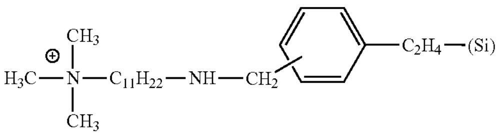

-continued
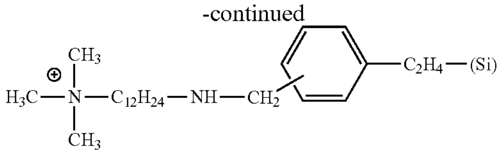
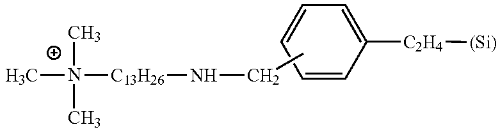
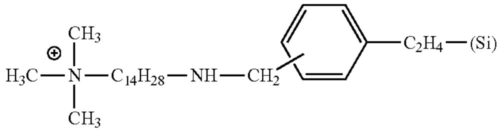
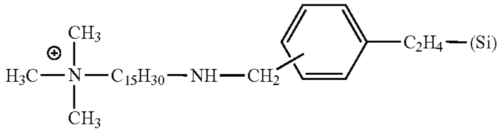
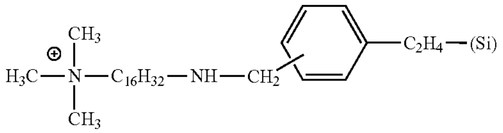
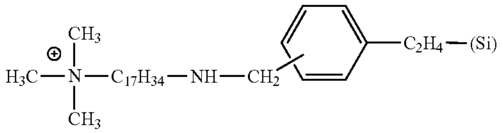
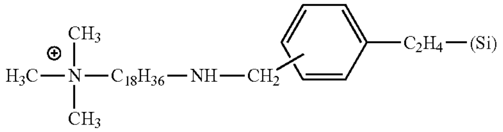
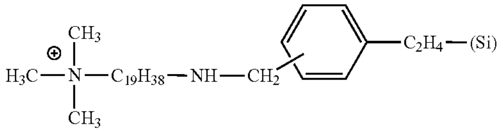
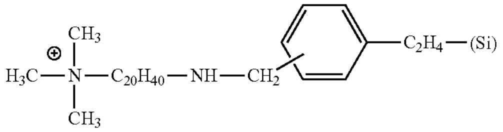
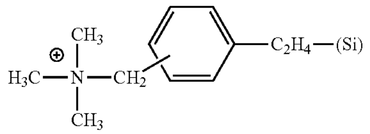
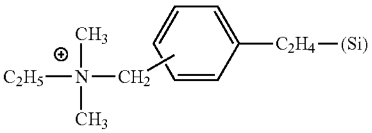
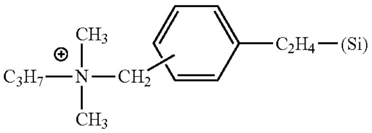
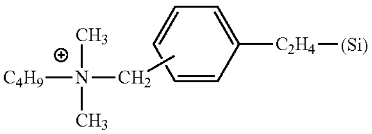
-continued
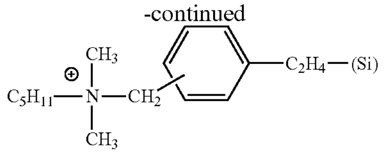
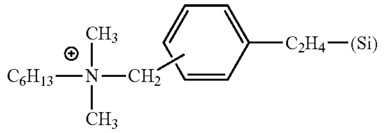
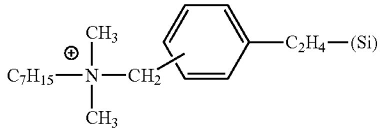
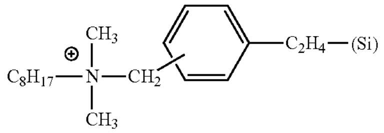
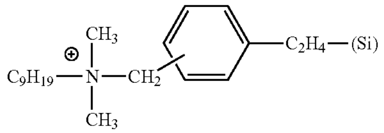
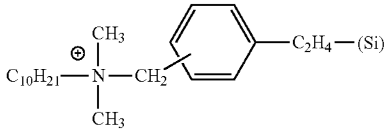
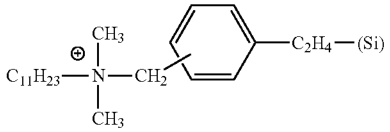
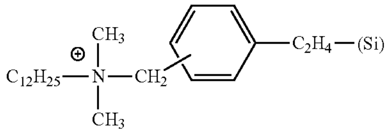
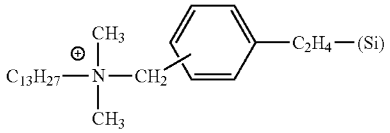
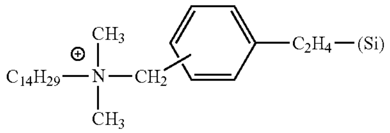
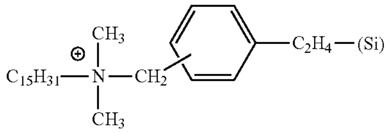
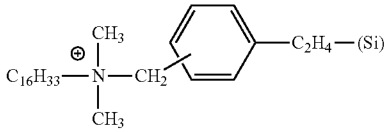
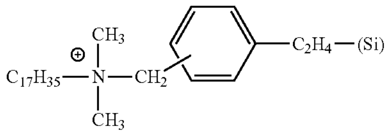

-continued
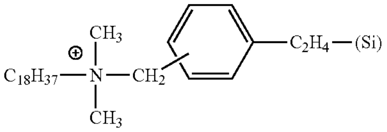
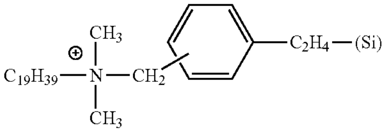
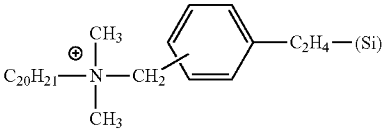
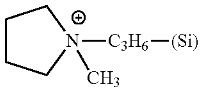
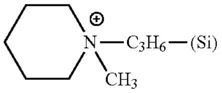
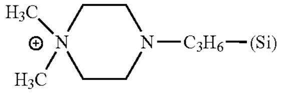
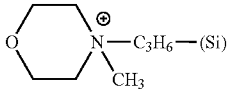
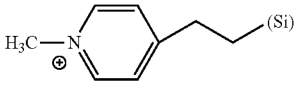
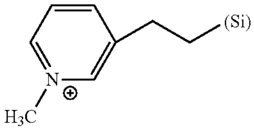
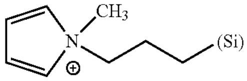
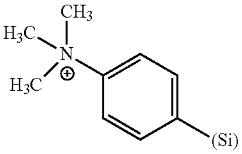
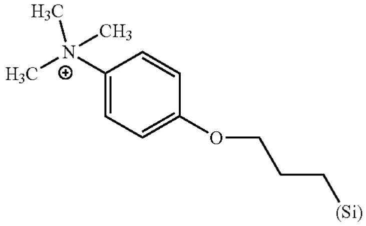
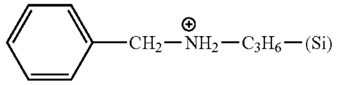
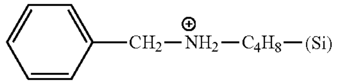
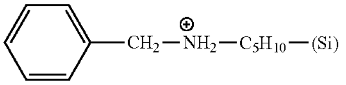
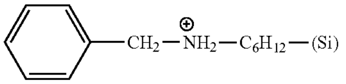
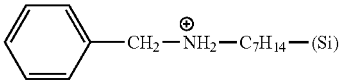
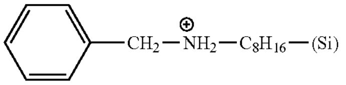
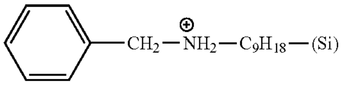
-continued
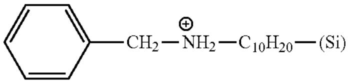
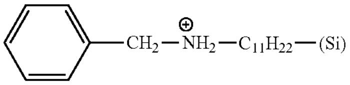
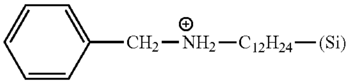
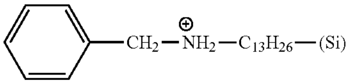
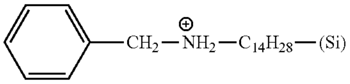
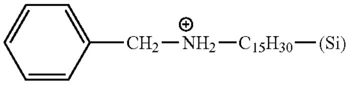
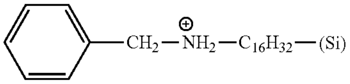
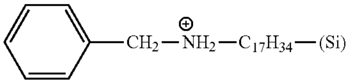
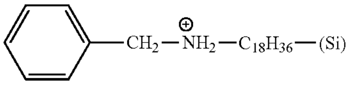
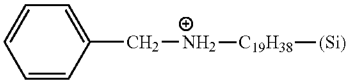
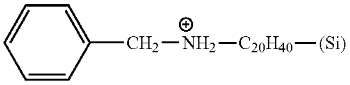
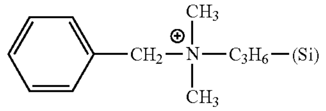
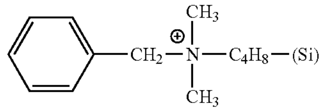
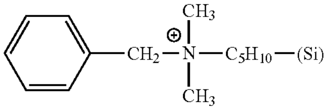
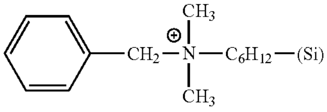
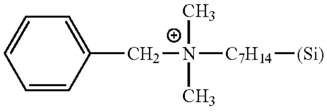
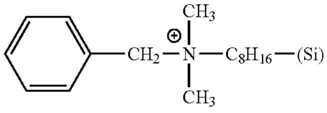
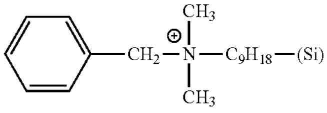

-continued
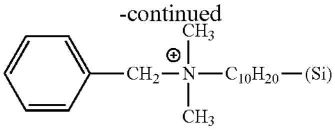
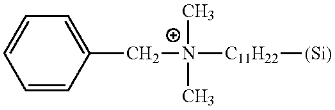
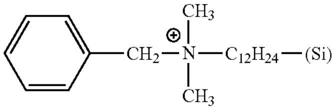
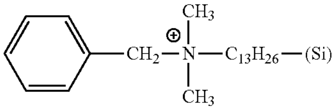
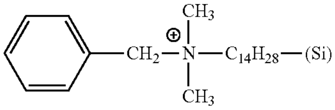
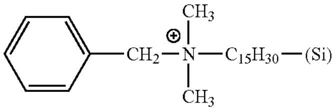
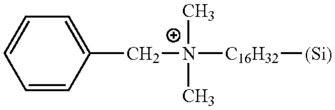
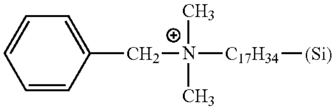
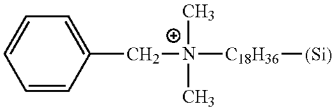
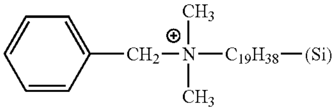
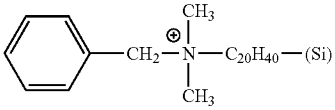
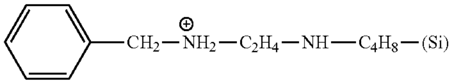
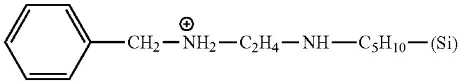
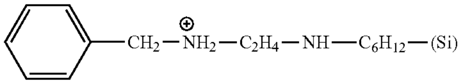
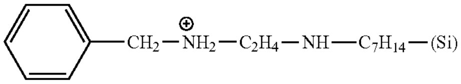
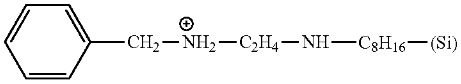
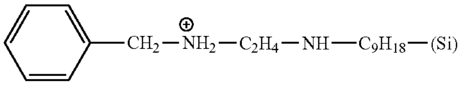
-continued
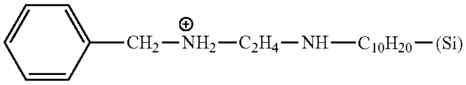
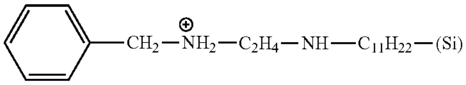
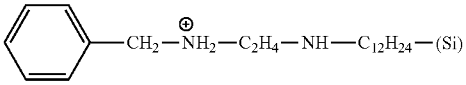
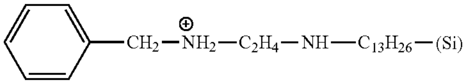
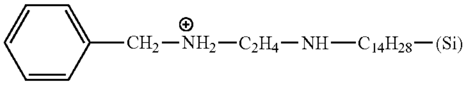
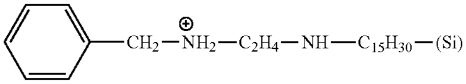
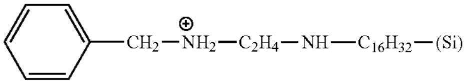
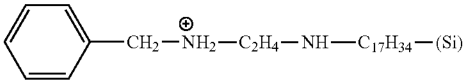
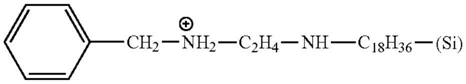
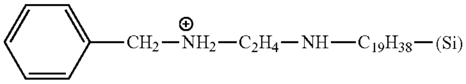
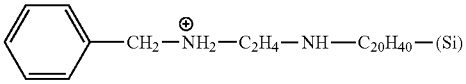
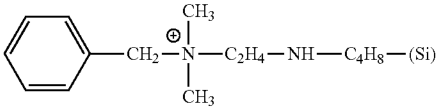
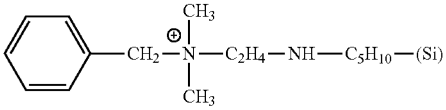
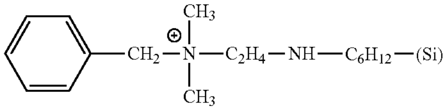
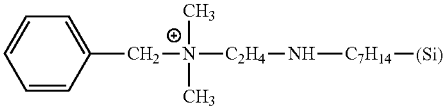
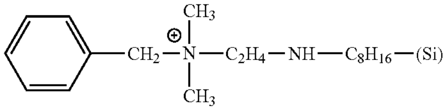
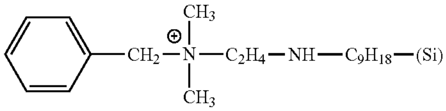

-continued
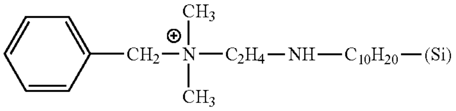
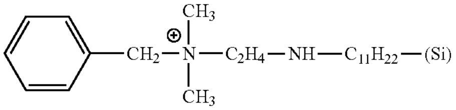
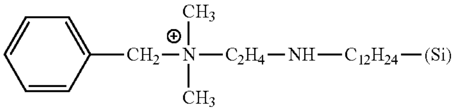
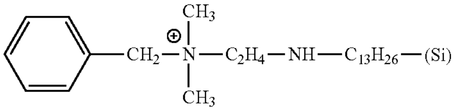
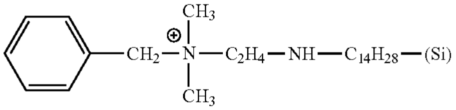
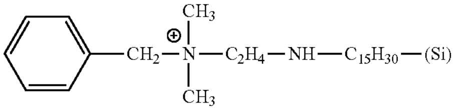
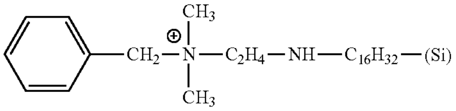
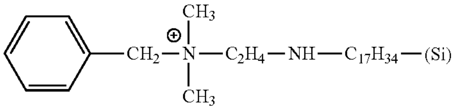
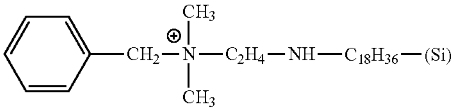
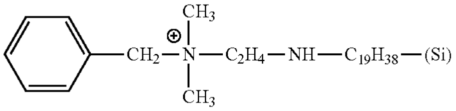
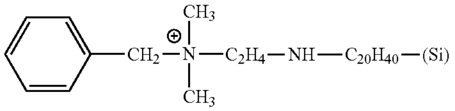
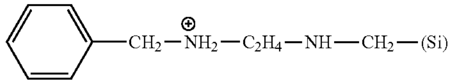
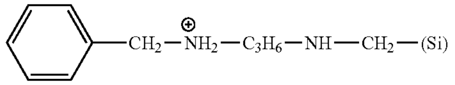
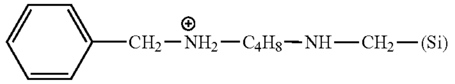
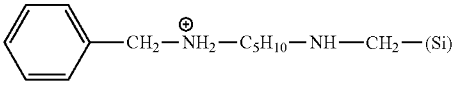
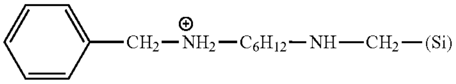
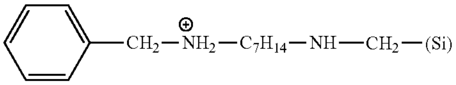
-continued
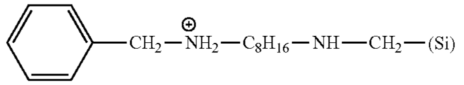
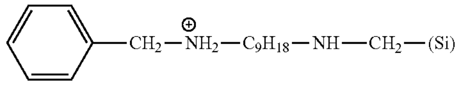
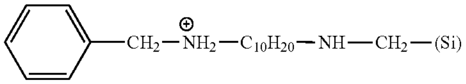
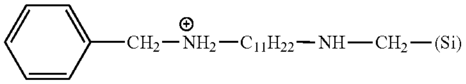
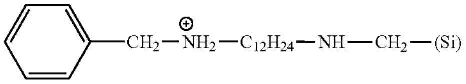
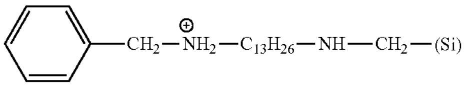
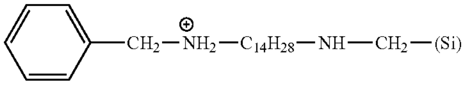
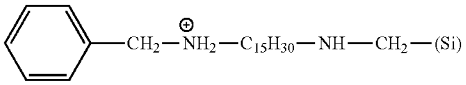
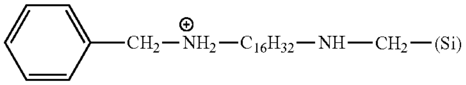
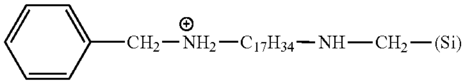
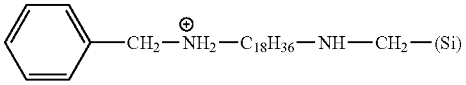
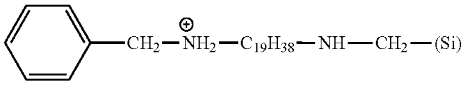
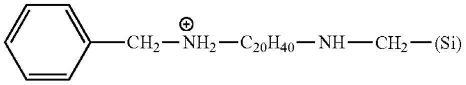
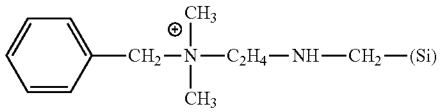
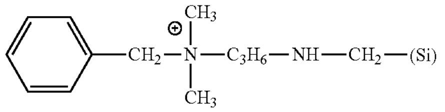
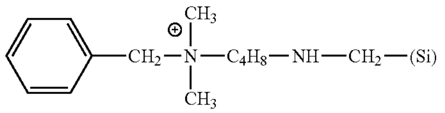
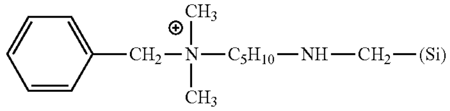
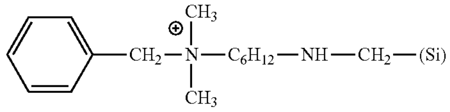

-continued
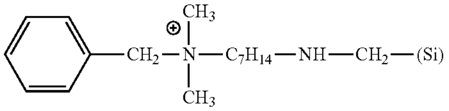
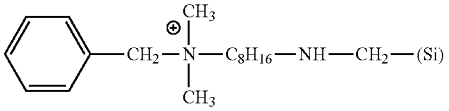
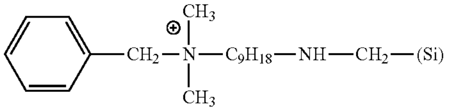
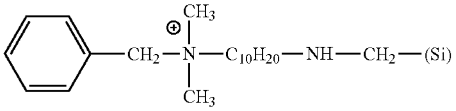
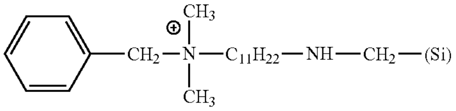
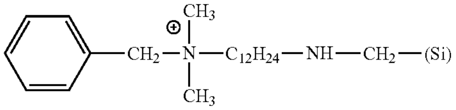
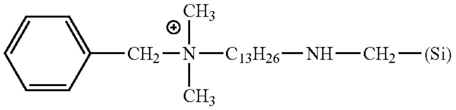
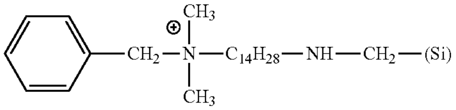
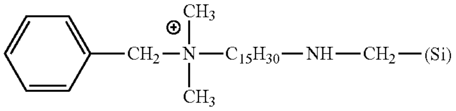
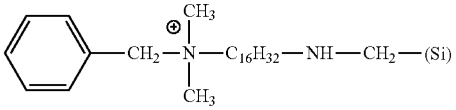
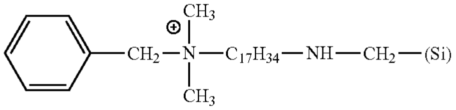
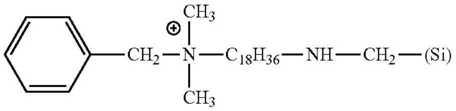
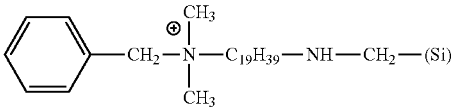
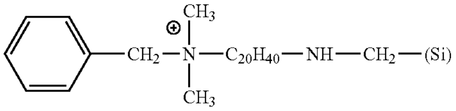
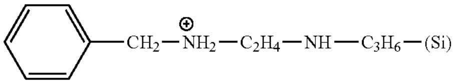
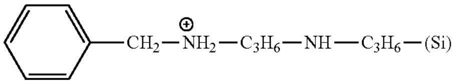
-continued
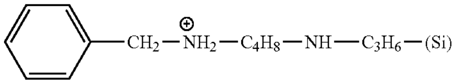
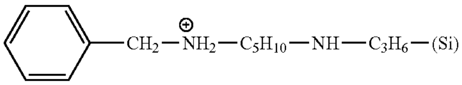
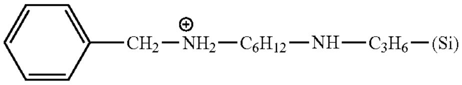
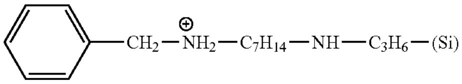
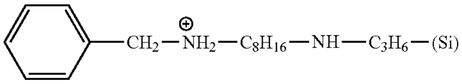
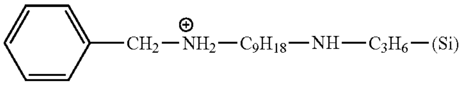
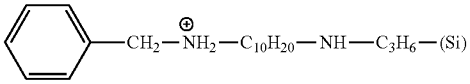
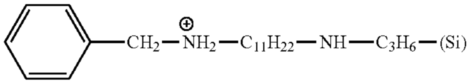
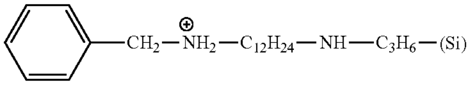
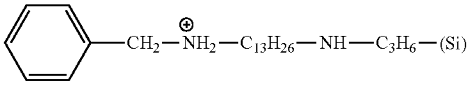
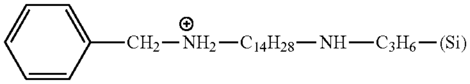
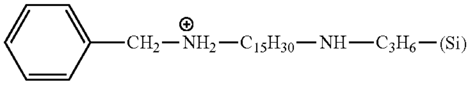
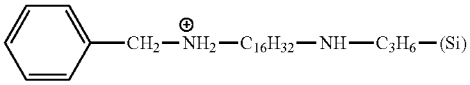
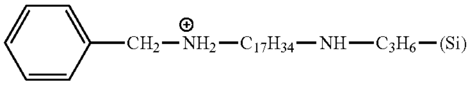
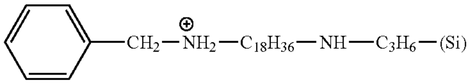
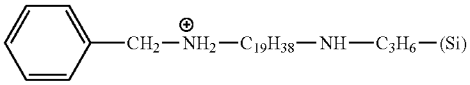
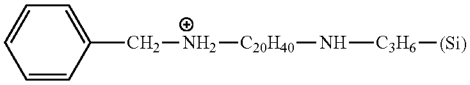
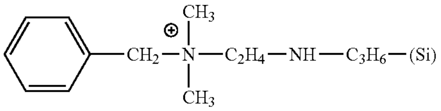
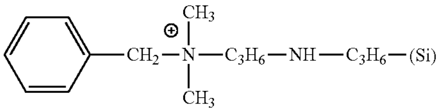

-continued
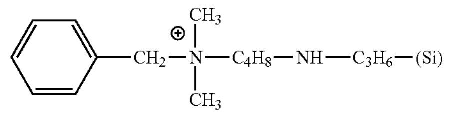
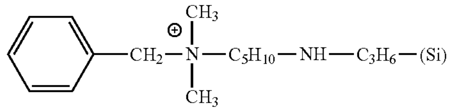
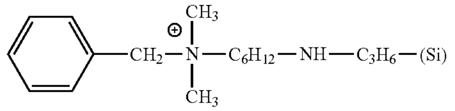
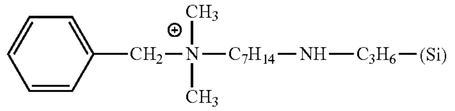
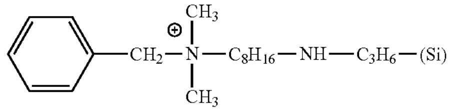
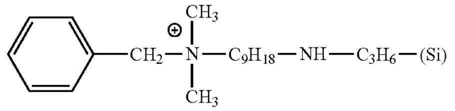
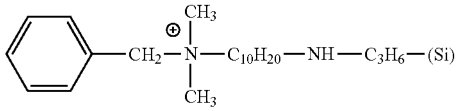
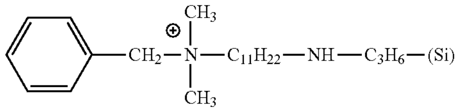
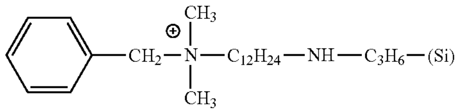
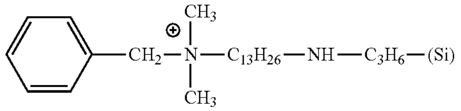
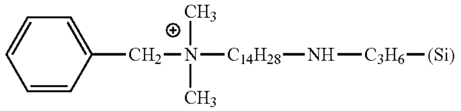
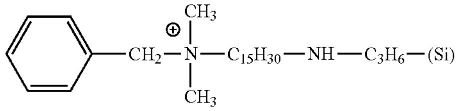
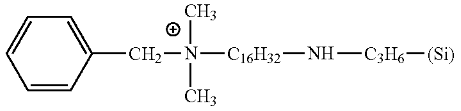
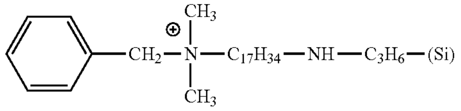
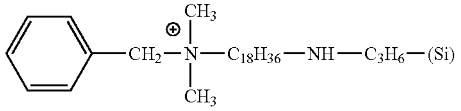
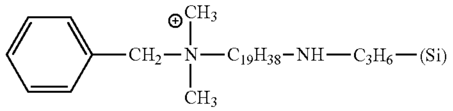
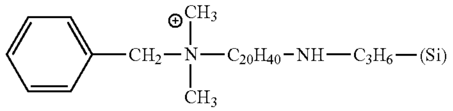
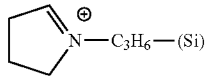
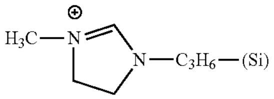
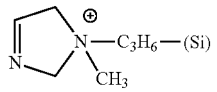
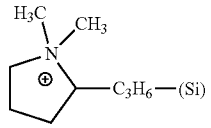
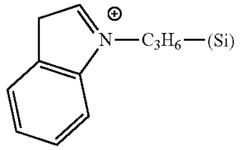
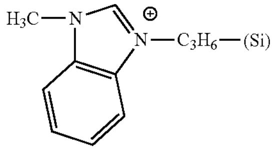
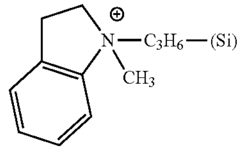
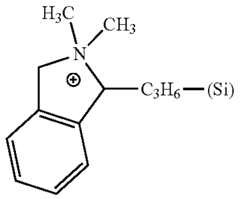
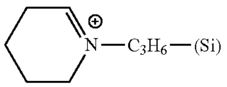
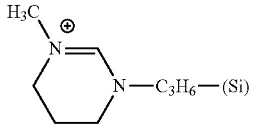
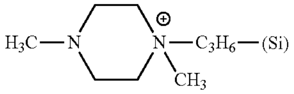
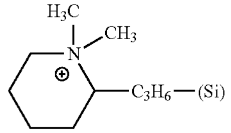
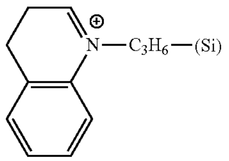
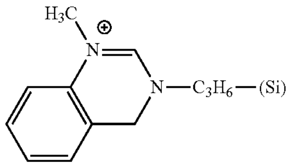
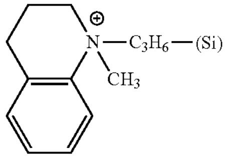
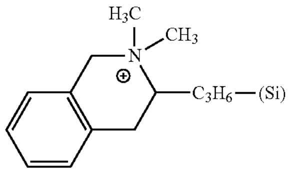
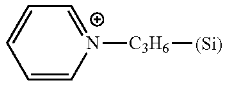
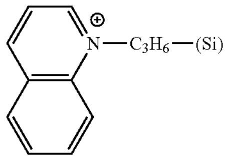

-continued

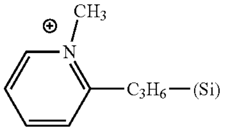 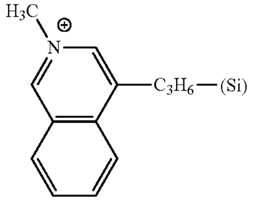

Examples of the hydrolysable silicon compound used for manufacturing (Xc-10) together with the above (Xm-1), (Xm-2), (Xm-3), or (Xm-4) include the above (Sm).

One or more of the monomers (Xm-1), (Xm-2), (Xm-3), and (Xm-4) described as above, and one or more (Sm) are selected and mixed before or during the reaction to be the reaction raw material to form (Xc-10). The reaction condition may be the same method as the synthetic method of the thermally crosslinkable polysiloxane (Sx).

A molecular weight of the obtained silicon-containing compound (Xc-10) can be regulated by not only selecting the monomer but also controlling the reaction condition of the polymerization. Using the silicon-containing compound having a weight-average molecular weight of no more than 100,000 yields no foreign matter nor coating unevenness. The silicon-containing compound having a weight-average molecular weight of 100,000 or less, more preferably 200 to 50,000, further 300 to 30,000, is preferably used. Note that, data on the above weight-average molecular weight indicates the molecular weight in terms of polystyrene by gel permeation chromatography (GPC) using tetrahydrofuran as an eluent solvent, using RI as a detector, and using polystyrene as a standard substance.

The crosslinking catalysts (Xc-1), (Xc-2), (Xc-3), (Xc-4), and (Xc-10) may be used singly, or may be used in combination of two or more kinds thereof. An amount of the added crosslinking catalyst is preferably 0.01 to 50 parts by mass, more preferably 0.1 to 40 parts by mass, and further preferably 0.1 to 10 parts by mass, relative to 100 parts by mass of the base polymer (thermally crosslinkable polysiloxane (Sx) obtained by the above method).

From the viewpoint of the flowability, when the hydrolysable silicon compound (Xc-10) is used, the organic group more preferably has no aromatic ring, and a smaller addition amount thereof is more preferable.

(Organic Acid)

To improve the stability of the inventive composition for forming a silicon-containing metal hard mask, a monovalent or polyvalent organic acid having 1 to 30 carbon atoms may be added. Preferably added acids in this case include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid diethylmalonic acid, succinic acid, methylsuccinic acid, glutaric acid, adipic acid, itaconic acid, maleic acid, fumaric acid, citraconic acid, and citric acid. In particular, oxalic acid, maleic acid, formic acid, acetic acid, propionic acid, citric acid, etc. are preferable. To maintain the stability, two or more kinds of the acid may be mixed to use. An amount of the added organic acid is 0.001 to 25 parts by mass, preferably 0.01 to 15 parts by mass, and more preferably 0.1 to 5 parts by mass, relative to 100 parts by mass of silicon contained in the inventive composition for forming a silicon-containing resist underlayer film.

Alternatively, the organic acid is favorably blended at an amount converted to a pH of the inventive composition for forming a silicon-containing metal hard mask so as to be $0 \le pH \le 7$, more preferably $0.3 \le pH \le 6.5$, further preferably $0.5 \le pH \le 6$.

<(C) Solvent>

A usable solvent for the inventive composition for forming a silicon-containing metal hard mask is not particularly limited as long as the solvent disperses the metal oxide nanoparticle (A) and dissolves the thermally crosslinkable polysiloxane (B), and if contained, the crosslinking catalyst, the organic acid, the photoacid generator, the stabilizer, the surfactant, and other additives. The solvent particularly preferably has a boiling point of lower than 180° C. Specifically, preferable are butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and a mixture of two or more kinds thereof.

In the present invention, water may be added into the composition. Since the thermally crosslinkable polysiloxane compound in the inventive composition for forming a silicon-containing metal hard mask is hydrated by adding water, the lithographic performance is improved. A content rate of water in the solvent component of the inventive composition for forming a silicon-containing metal hard mask is more than 0 mass % and less than 70 mass %, and preferably 0.1 to 30 mass %. When the amount of the added water is within the above range, uniformity of the silicon-containing metal hard mask is not deteriorated, and no repellency occurs.

The inventive composition for forming a silicon-containing metal hard mask containing water enables to be used as a pattern collapse inhibitor for a resist pattern formed by positive-type development. That is, the composition containing water can favorably substitute for the positive-type developing liquid such as an aqueous solution of tetramethylammonium hydroxide (TMAH) and pure water being a rinsing liquid thereof, can fill a gap of the resist pattern formed by the positive-type development without pattern collapse, and can be used as a reversing agent of the resist pattern as it is.

A blending amount of the entire solvent including water is 100 to 100,000 parts by mass, and particularly preferably 200 to 50,000 parts by mass, relative to 100 parts by mass of the metal oxide nanoparticle (A).

(High Boiling-Point Solvent)

A high boiling-point solvent having a boiling point of 180° C. or higher can be blended with the solvent having a boiling point of lower than 180° C. Such a mixed solvent, which is a mixture of a solvent having a boiling point of lower than 180° C. and a solvent having a boiling point of 180° C. or higher, could be included as the organic solvent in the inventive composition for forming a silicon-containing metal hard mask. The high boiling-point solvent is not particularly limited to hydrocarbons, alcohols, ketones, esters, ethers, and chlorine-based solvents as long as the solvent can disperse the metal oxide nanoparticle (A) and dissolve the thermally crosslinkable polysiloxane (B), and if contained, the crosslinking catalyst, the organic acid, the photoacid generator, the stabilizer, the surfactant, and other additives. Specific examples thereof include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butyl methyl ether, triethylene glycol dimethyl ether, triethylene glycol monomethyl ether, triethylene glycol n-butyl ether, triethylene glycol butyl methyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, and dibutyl adipate. These solvents may be used singly, or may be mixed to use.

The boiling point of the high boiling-point solvent is appropriately selected depending on a temperature at which the composition for forming a silicon-containing metal hard mask is heat-treated. The boiling point of the added high boiling-point solvent is preferably 180° C. to 300° C., and more preferably 200° C. to 300° C. Such a boiling point has no risk of exceedingly fast evaporation during baking (heat treatment) due to exceedingly low boiling point, and yields the sufficient thermal flowability. In addition, such a boiling point eliminates the remains of the solvent in the film which fails to evaporate even after the baking due to excessively high boiling point, and thereby has no risk of adverse effect on the film properties such as the etching resistance.

When the above high boiling-point solvent is used, a blending amount of the high boiling-point solvent is preferably 1 to 30 parts by mass relative to 100 parts by mass of the solvent having a boiling point of lower than 180° C. Such a blending amount can impart sufficient thermal flowability, causes the solvent not to remain in the film, and yields good film properties such as the etching resistance.

Such a composition for forming a silicon-containing metal hard mask imparts the thermal flowability with adding the high boiling-point solvent to the above composition, resulting in the composition also having higher filling/planarizing ability.

(Photoacid Generator)

In the present invention, a photoacid generator may be added into the composition. Specifically, as the photoacid generator used for the present invention, materials described in paragraphs (0160) to (0179) of JP 2009-126940 A may be added. A blending amount of the photoacid generator is preferably 0.05 to 50 parts by mass, and more preferably 0.1 to 10 parts by mass, relative to 100 parts by mass of the metal oxide nanoparticle.

(Stabilizer)

In the present invention, a stabilizer can be further added into the composition. As the stabilizer, monohydric or polyhydric alcohols having a cyclic ether as a substituent can be added. Specifically, adding a stabilizer described in paragraphs (0181) to (0182) of JP 2009-126940 A can improve the stability of the composition for forming a silicon-containing metal hard mask. A blending amount of the stabilizer is preferably 0.05 to 50 parts by mass, and more preferably 0.1 to 10 parts by mass, relative to 100 parts by mass of the metal oxide nanoparticle.

(Surfactant)

In the present invention, a surfactant can be further blended into the composition as necessary. Specifically, materials described in a paragraph (0185) of JP 2009-126940 A can be added. A blending amount of the surfactant is preferably 0.01 to 10 parts by mass, and more preferably 0.05 to 5 parts by mass, relative to 100 parts by mass of the metal oxide nanoparticle.

(Dispersant)

A dispersant can be further added into the inventive composition for forming a silicon-containing metal hard mask. A kind of the used dispersant is not particularly limited, and known dispersants can be used. Examples thereof include: low molecular-weight dispersants, such as an alkylamine, an alkanethiol, an alkanediol, and a phosphate ester; polymer dispersants having various functional groups; and silane coupling agents. Examples of the polymer dispersant include styrene-based resins (such as styrene-(meth)acrylic acid copolymer and styrene-maleic anhydride copolymer), acrylic resins (such as (meth)acrylic acid-based resins such as methyl (meth)acrylate-(meth)acrylic acid copolymer and poly(meth)acrylic acid), water-soluble urethane resins, water-soluble acrylurethane resins, water-soluble epoxy resins, water-soluble polyester-based resins, cellulose derivatives (such as: nitrocellulose; and cellulose ethers, such as alkylcelluloses such as ethylcellulose, alkyl-hydroxyalkylcelluloses such as ethylhydroxyethylcellulose, hydroxyalkylcelluloses such as hydroxyethylcellulose and hydroxypropylcellulose; and carboxyalkylcelluloses, such as carboxymethylcellulose), polyvinyl alcohol, polyalkylene glycols (such as liquid polyethylene glycol and polypropylene glycol), natural polymers (such as saccharides, such as gelatin, dextrin, gum arabic, and casein), polyethylenesulfonic acid or a salt thereof, polystyrenesulfonic acid or a salt thereof, a formalin condensed product of naphthalenesulfonic acid, nitrogen atom-containing polymer compounds [for example, polymer compounds having an amino group, such as a polyalkylene imine (such as polyethylene imide), polyvinylpyrrolidone, polyallylamine, and a polyether polyamine (such as a polyoxyethylene polyamine).

Although the metal nanoparticle is typically covered with an organic protective film to prevent aggregation, adding the dispersant can further improve the aggregation prevention of the metal nanoparticle. A blending amount of the dispersant is preferably 0.1 to 100 parts by mass, and more preferably 0.1 to 50 parts by mass, relative to 100 parts by mass of the metal oxide nanoparticle.

Patterning Process

The present invention also provides, as a patterning process with the two-layer resist process using the above composition for forming a silicon-containing metal hard mask, a patterning process comprising:

(I-1) a step of applying the above composition for forming a silicon-containing metal hard mask on a substrate to be processed, then heat-treating the composition, and forming a silicon-containing metal hard mask;

(I-2) a step of forming a resist upper layer film on the silicon-containing metal hard mask by using a photoresist material;

(I-3) a step of pattern-exposing the resist upper layer film, and then developing the pattern with a developing liquid to form a pattern in the resist upper layer film;

(I-4) a step of transferring the pattern to the silicon-containing metal hard mask by dry etching while using the resist upper layer film having the formed pattern as a mask; and (I-5) a step of forming a pattern in the substrate to be processed by processing the substrate to be processed while using the silicon-containing metal hard mask having the formed pattern as a mask.

Since the resist upper layer film of the above two-layer resist process has etching resistance against a chlorine-based gas and a fluorocarbon-based gas, the dry etching of the silicon-containing metal hard mask while using the resist upper layer film as a mask is preferably performed by using an etching gas mainly composed of the chlorine-based gas or the fluorocarbon-based gas in the above two-layer resist process.

The present invention also provides, as a patterning process with the three-layer resist process using the above composition for forming a silicon-containing metal hard mask, a patterning process comprising:

(II-1) a step of forming an organic resist underlayer film on a substrate to be processed;

(II-2) a step of applying the above composition for forming a silicon-containing metal hard mask on the organic resist underlayer film, then heat-treating the composition, and forming a silicon-containing metal hard mask;

(II-3) a step of forming a resist upper layer film on the silicon-containing metal hard mask by using a photoresist material;

(II-4) a step of pattern-exposing the resist upper layer film, and then developing the pattern with a developing liquid to form a pattern in the resist upper layer film;

(II-5) a step of transferring the pattern to the silicon-containing metal hard mask by dry etching while using the resist upper layer film having the formed pattern as a mask;

(II-6) a step of transferring the pattern to the organic resist underlayer film by dry etching while using the silicon-containing metal hard mask having the transferred pattern as a mask; and (II-7) a step of forming a pattern in the substrate to be processed by processing the substrate to be processed while using the organic resist underlayer film having the formed pattern as a mask.

An example of the three-layer resist process will be specifically described as follows by using FIG. 1. In a case of the three-layer resist process, as illustrated in FIG. 1(A), an organic resist underlayer film 3 is formed on a layer 2 to be processed laminated on a substrate 1 to be processed, then a silicon-containing metal hard mask 4 is formed on the film 3, and a resist upper layer film 5 is formed on the mask 4.

Then, as illustrated in FIG. 1(B), an exposure portion 6 in the resist upper layer film 5 is exposed, and PEB (post exposure bake) and development are performed to form a resist upper layer film pattern 5*a* (FIG. 1(C)). While using this obtained resist upper layer film pattern 5*a* as a mask, the silicon-containing metal hard mask 4 is processed by etching using a CF-based gas to form a silicon-containing metal hard mask pattern 4*a* (FIG. 1(D)). After the resist upper layer film pattern 5*a* is removed, while using this obtained silicon-containing metal hard mask pattern 4*a* as a mask, the organic resist underlayer film 3 is etched by oxygen plasma to form an organic resist underlayer film pattern 3*a* (FIG. 1(E)). After the silicon-containing metal hard mask pattern 4*a* is removed, while using the organic resist underlayer film pattern 3*a* as a mask, the layer 2 to be processed is processed by etching to form a pattern 2*a* formed in the layer 2 (FIG. 1(F)).

Since the silicon-containing metal hard mask of the above three-layer resist process has etching resistance against an oxygen-based gas, the dry etching of the organic resist underlayer film while using the silicon-containing metal hard mask as a mask is preferably performed by using an etching gas mainly containing the oxygen-based gas in the above three-layer resist process.

Organic resist underlayer films usable for the above three-layer resist process include: already known materials as an underlayer film for the three-layer resist method or for the underlayer film for the two-layer resist method using a silicone resist composition; and known various resins for a resist underlayer film material of the two-layer resist method and the three-layer resist method represented by novolac resins, such as 4,4'-(9-fluorenylidene)bisphenol novolac resin (molecular weight of 11,000) described in JP 2005-128509 A. For improved heat resistance compared with common novolac resins, a polycyclic skeleton such as 6,6'-(9-fluorenylidene)-di(2-naphthol) novolac resin can be introduced, and a polyimide-based resin can also be selected (for example, JP 2004-153125 A).

The organic resist underlayer film can be formed on the substrate to be processed using a composition solution by a spin-coating method, etc., similar to the photoresist composition. After the organic underlayer film is formed by the spin-coating method, baking is preferably performed to evaporate the organic solvent. The baking temperature is preferably within a range of 80 to 300° C., and the baking time is preferably within a range of 10 to 300 seconds.

Instead of the above organic resist underlayer film, an organic hard mask formed by a CVD method or an ALD method can be applied.

The present invention also provides, as a patterning process with the four-layer resist process using the above composition for forming a silicon-containing metal hard mask, a patterning process comprising:

(III-1) a step of forming an organic resist underlayer film on a substrate to be processed;

(III-2) a step of applying the above composition for forming a silicon-containing metal hard mask on the organic resist underlayer film, then heat-treating the composition, and forming a silicon-containing metal hard mask;

(III-3) a step of forming a BARC or an adhesive film on the silicon-containing metal hard mask by using a composition for forming an organic thin film;

(III-4) a step of forming a resist upper layer film on the BARC or the adhesive film by using a photoresist material;

(III-5) a step of pattern-exposing the resist upper layer film, and then developing the pattern with a developing liquid to form a pattern in the resist upper layer film;

(III-6) a step of transferring the pattern to the BARC or the adhesive film, and the silicon-containing metal hard mask by dry etching while using the resist upper layer film having the formed pattern as a mask;

(III-7) a step of transferring the pattern to the organic resist underlayer film by dry etching while using the silicon-containing metal hard mask having the transferred pattern as a mask; and (III-8) a step of forming a pattern in the substrate to be processed by processing the substrate to be processed while using the organic resist underlayer film having the formed pattern as a mask.

As noted above, the organic anti-reflective film (BARC) or the adhesive film may be formed on the silicon-containing metal hard mask by spin-coating, and the photoresist film may be formed thereon. In particular, the two-layer anti-reflective films of the silicon-containing metal hard mask and the BARC can inhibit the reflection even with immersion exposure with high NA of more than 1.0.

The resist upper layer film in the above multi-layer resist process may be any of positive-type or negative-type, and a material same as commonly used photoresist compositions can be used. After the photoresist composition is applied by spin-coating, the pre-baking is performed. The prebaking is preferably performed within a range at 60 to 180° C. for 10 to 300 seconds. Thereafter, the exposure, then post exposure bake (PEB), and development are performed in accordance with a common method to obtain the resist pattern. A thickness of the resist upper layer film is not particularly limited, and preferably 30 to 500 nm, particularly preferably 50 to 400 nm.

Examples of the exposure light include high-energy ray having a wavelength of 300 nm or less, and specifically, excimer laser light with 248 nm, 193 nm, or 157 nm, soft X-ray with 3 to 20 nm, electron beam, and X-ray.

The resist upper layer film is preferably formed by photolithography using light having a wavelength of 5 nm or more and 300 nm or less, direct writing with electron beam, nanoimprinting, or a combination thereof.

When the circuit pattern is formed in the resist upper layer film by using the above method, a fine pattern can be formed in the substrate to be processed with higher precision.

The development in the patterning process is preferably performed with alkali development or development with an organic solvent.

In the patterning process, the exposure and development are performed to form the circuit pattern in the resist upper layer film, and the development is preferably performed with alkali development or development with an organic solvent.

Using the alkali development or the development with an organic solvent can form a fine pattern in the substrate to be processed with higher precision.

Then, etching is performed while using the obtained resist pattern as a mask. The etching of the silicon-containing metal hard mask in the two-layer resist process is performed by using a chlorine-based or fluorocarbon-based gas while using the upper layer resist pattern as a mask. This etching forms a silicon-containing metal hard mask pattern. Then, in the case of the three-layer resist process, the organic resist underlayer film is etched while using the obtained silicon-containing metal hard mask pattern as a mask. The organic resist underlayer film is preferably etched by using an oxygen-based gas.

The subsequent etching of the substrate to be processed can be performed in accordance with a common method. For example, when the substrate to be processed has a $SiO_2$, SiN, or silica-based low dielectric-constant insulative film, the etching is performed using gas mainly composed of a fluorocarbon-based gas.

The body to be processed (substrate to be processed) is not particularly limited, and a substrate such as Si, α-Si, p-Si, $SiO_2$, SiN, SiON, W, TiN, and Al; and a substrate in which a layer to be processed is formed on the above substrate are used. As the layer to be processed, various low-k films such as Si, $SiO_2$, SiON, SiN, p-Si, α-Si, W, W—Si, Al, Cu, and Al—Si, and stopper films thereof are used. The layer to be processed can be formed to have a thickness of typically 50 to 10,000 nm, particularly 100 to 5,000 nm. When the layer to be processed is formed, the substrate and the layer to be processed having different materials are used.

The inventive patterning process preferably uses a substrate to be processed having a structure or step with 30 nm or more in height. As noted above, the inventive composition for forming a silicon-containing metal hard mask has excellent filling/planarizing ability, and thereby a plane cured film can be formed even in the presence of a structure or step with 30 nm or more in height (concavity and convexity) on the substrate to be processed. The height of the structure or step on the substrate to be processed is preferably 30 nm or more, more preferably 50 nm or more, and further preferably 100 nm or more. In the method for processing the stepped substrate having a pattern with the above height, filling/planarizing is performed by forming a film of the inventive composition for forming a silicon-containing metal hard mask. This can uniformize the film thickness of the resist upper layer film formed thereafter. Thus, the exposure depth margin (DOF) is easily achieved during the photolithography, which is extremely preferable.

The present invention also provides a tone-reversing patterning process for forming a pattern in a substrate to be processed by reversing a resist pattern using the above composition for forming a silicon-containing metal hard mask, comprising:

(IV-1) a step of forming a photoresist film on a substrate to be processed by using a photoresist material;

(IV-2) a step of pattern-exposing the photoresist film, and then developing the pattern with a developing liquid to form a pattern in the photoresist film;

(IV-3) a step of applying the above composition for forming a silicon-containing metal hard mask on the photoresist film pattern, heat-treating the composition, covering a silicon-containing metal hard mask, and filling a gap of the photoresist film pattern with the silicon-containing metal hard mask;

(IV-4) a step of etching back the silicon-containing metal hard mask by a chemical stripper or dry etching, the mask covering the photoresist film having the formed pattern, and uncovering an upper surface of the photoresist film having the formed pattern;

(IV-5) a step of removing the photoresist film pattern having the uncovered surface by dry etching to form a reversed pattern to the original pattern on the silicon-containing metal hard mask; and (IV-6) a step of forming a tone-reversed pattern in the substrate to be processed by processing the substrate to be processed while using the silicon-containing metal hard mask having the formed reversed pattern as a mask.

An example of the method for forming a reversed resist pattern is specifically described as follows by using FIG. 2. As illustrated in FIG. 2(G), a photoresist film 5' is formed on a layer 2 to be processed laminated on a substrate to be processed 1. Then, as illustrated in FIG. 2(H), exposure portion 6 in the photoresist film 5' is exposed, and PEB and development are performed to form a photoresist film pattern 5*a*' (FIG. 2(I)).

The inventive composition for forming a silicon-containing metal hard mask is applied on the photoresist film pattern 5*a*', then the composition is heat-treated. This forms a coating of a silicon-containing metal hard mask 7 filling the resist pattern, and a gap of the photoresist film pattern 5*a*' is filled with the mask 7 (FIG. 2(J)). Then, the mask 7 covering the photoresist film pattern 5*a*' is etch backed by a chemical stripper or dry etching to uncover the upper surface of the photoresist film pattern 5*a*' (FIG. 2(K)). Thereafter, the photoresist film pattern 5*a*' having the uncovered surface is removed by dry etching to form a silicon-containing metal hard mask pattern 7*a* having a revered pattern to the resist pattern (FIG. 2(L)). Then, the layer 2 to be processed is processed by etching while using the mask pattern 7*a* having the reversed resist pattern as a mask to form a pattern 2*a* to be formed in the layer to be processed (FIG. 2(M)).

In the above resist-reversed patterning process, after the silicon-containing metal hard mask covers the obtained resist upper layer film, the upper layer of the silicon-containing metal hard mask is preferably removed by dry etching using a chlorine-based gas or a fluorocarbon-based gas to uncover the upper surface of the resist upper layer film. Thereafter, the resist upper layer film pattern having the uncovered surface is removed by dry etching with an oxygen-based gas to form a silicon-containing metal oxide film pattern, and the substrate to be processed is etched while using this silicon-containing metal oxide film pattern as a mask.

Not only the above resist pattern but also a pattern formed with a material having etching selectivity to the silicon-containing metal hard mask formed with the inventive composition can form a reversed pattern with the above composition for forming a silicon-containing metal hard mask. Specifically, the pattern includes a pattern composed of: a polysiloxane-based silicon-containing intermediate film; an inorganic hard mask such as a silicon oxide film, a silicon nitride film, and a silicon oxynitride film (SiON film) formed by a CVD method, ALD method, etc.; an organic resist underlayer film formed by a spin-coating method; and a resist underlayer film formed by a CVD method or an ALD method.

In the reversing patterning process, the pattern being original of the reversed pattern preferably has a structure or step with 30 nm or more in height. As noted above, the inventive composition for forming a silicon-containing metal hard mask has excellent filling/planarizing ability, and thereby a planarizing metal hard mask can be formed even in the presence of a structure or step with 30 nm or more in height (concavity and convexity) on the substrate to be processed. The height of the structure or step of the pattern is preferably 30 nm or more, and more preferably 50 nm or more. In the method for reversing a pattern having a pattern with the above height, filling/planarizing is performed by forming a film of the composition for forming a silicon-containing metal hard mask having excellent resistance against etching using an oxygen-based gas and a fluorocarbon-based gas. This can reverse/transfer a pattern with high precision.

The present invention also provides a patterning process for forming a pattern in a substrate to be processed by reversing a pattern obtained by nanoimprinting, comprising:

(V-1) a step of forming a pattern on a substrate to be processed by nanoimprinting;

(V-2) a step of applying the above composition for forming a silicon-containing metal hard mask on the pattern, heat-treating the composition, covering a silicon-containing metal hard mask, and then filling a gap of the nanoimprint pattern with the silicon-containing metal hard mask;

(V-3) a step of etching back the silicon-containing metal hard mask by a chemical stripper or dry etching, the mask covering the pattern formed by nanoimprinting, and uncovering an upper surface of the nanoimprint pattern film having the formed pattern;

(V-4) a step of removing the nanoimprint pattern having the uncovered surface by dry etching to form a reversed pattern to the original pattern on the silicon-containing metal hard mask; and (V-5) a step of forming a tone-reversed pattern in the substrate to be processed by processing the substrate to be processed while using the silicon-containing metal hard mask having the formed reversed pattern as a mask.

In the above method for reversing a pattern obtained by nanoimprinting, the obtained nanoimprint pattern is covered with the silicon-containing metal hard mask, then the upper layer of the silicon-containing metal hard mask is preferably removed by dry etching using a chlorine-based gas or a fluorocarbon-based gas to uncover the upper surface of the pattern obtained by nanoimprinting. Thereafter, the nanoimprint pattern having the uncovered surface is removed by dry etching with an oxygen-based gas to form the silicon-containing metal hard mask pattern. Then, this pattern is used as a mask to etch the substrate to be processed.

The present invention also provides a patterning process for forming a pattern in a substrate to be processed by reversing a resist pattern, comprising:

(VI-1) a step of forming a photoresist film on a substrate to be processed by using a photoresist material;

(VI-2) a step of pattern-exposing the photoresist film and then developing the photoresist film with a developing liquid, and a step of further rinsing the developed film with a rinsing liquid as necessary;

(VI-3) a step of substituting the developing liquid or the rinsing liquid with the above composition for forming a silicon-containing metal hard mask, heat-treating the composition, covering a silicon-containing metal hard mask, and then filling a gap of the photoresist film pattern with the silicon-containing metal hard mask;

(VI-4) a step of etching back the silicon-containing metal hard mask by a chemical stripper or dry etching, the mask covering the photoresist film having the formed pattern, and uncovering an upper surface of the photoresist film having the formed pattern;

(IV-5) a step of removing the photoresist film pattern having the uncovered surface by dry etching to form a reversed pattern to the original pattern on the silicon-containing metal hard mask; and (IV-6) a step of forming a tone-reversed pattern in the substrate to be processed by processing the substrate to be processed while using the silicon-containing metal hard mask having the formed reversed pattern as a mask.

An example of the method for forming a reversed resist pattern by substituting the resist developing liquid or the rinsing liquid will be specifically described as follows by using FIG. 3. As illustrated in FIG. 3(G), a photoresist film 5' is formed on a layer 2 to be processed laminated on a substrate 1 to be processed. Then, as illustrated in FIG. 3(H), an exposure portion 6 in the photoresist film 5' is exposed, and PEB and development are performed. The rinsing treatment with the rinsing liquid is further performed as necessary. The photoresist film pattern **5*a*' is covered with the developing liquid or the rinsing liquid 6*a* (FIG. 3**(N)).

Then, the developing liquid or the rinsing liquid **6*a* is substituted with the inventive composition for forming a silicon-containing metal hard mask, the composition is heat-treated. This forms a coating of a silicon-containing metal hard mask 8 filling the resist pattern, and a gap of the photoresist film pattern 5*a*' is filled with the mask 8 (FIG. 3(O)). Then, the mask 8 covering the photoresist film pattern 5*a*' is etch backed by a chemical striper or dry etching to uncover the upper surface of the photoresist film pattern 5*a*' (FIG. 3**(P)).

Thereafter, the photoresist film pattern **5*a*' having the uncovered surface is removed by dry etching to form a silicon-containing metal hard mask pattern 8*a* having the reversed resist pattern (FIG. 3(Q)). Then, the layer 2 to be processed is processed by etching while using the mask pattern 8*a* having the reversed resist pattern as a mask to form a pattern 2*a* to be formed in the layer to be processed (FIG. 3**(R)).

In the resist-reversing patterning process, after the silicon-containing metal hard mask covers the obtained photoresist film pattern, the upper layer of the silicon-containing metal hard mask is preferably removed by dry etching using a chlorine-based gas or a fluorocarbon-based gas to uncover the upper surface of the photoresist film pattern. Thereafter, the photoresist film pattern having the uncovered surface is removed by dry etching with an oxygen-based gas to form a silicon-containing metal hard mask pattern, and the substrate to be processed is etched while using this silicon-containing metal hard mask pattern as a mask.

In the above inventive composition for forming a silicon-containing metal hard mask, the solvent composition can be appropriately regulated to have good compatibility with the developing liquid to develop the resist, and can form the reversed pattern by the developing liquid substitution with any of positive type and negative type.

When the resist film is formed by using a positive-type resist solution, examples of the developing liquid used for developing the exposed resist film include an aqueous solution of alkalis, such as: inorganic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and methyldiethylamine; alcoholamines, such as dimethylethanolamine and triethanolamine; quaternary ammonium salts, such as tetramethylammonium hydroxide, tetraethylammonium hydroxide, and choline; and cyclic amines, such as pyrrole and piperidine. Into the aqueous solution of the alkalis, an appropriate amount of alcohols, such as isopropyl alcohol, and surfactants, such as nonion-type surfactant, can be added to use. Among these, a preferable developing liquid is an aqueous solution of a quaternary ammonium salt, and more preferable is an aqueous solution of tetramethylammonium hydroxide.

When the resist film is formed by using a negative-type resist solution, usable as the developing liquid for developing the exposed resist film is a developing liquid, etc. containing one or more components selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, for example. A developing liquid having 50 mass % or more of one or more of the developing liquid components is preferably used from the viewpoints of improvement of pattern collapse, etc.

When the resist film is formed by using a positive-type resist solution, a solvent composition of the above composition for forming a silicon-containing metal hard mask is preferably a mixed composition of water and an alcohol solvent. The content rate of water is more than 0 mass % to less than 70 mass %, and preferably 0.1 to 30 mass %. Particularly preferable alcohol solvents are monoalkyl ether derivatives of ethylene glycol, diethylene glycol, triethylene glycol, propylene glycol, dipropylene glycol, butanediol, etc. Specifically, preferable are butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, and diacetone alcohol.

When the resist film is formed by using a negative-type resist solution, a solvent composition of the above composition for forming a silicon-containing metal hard mask is preferably a composition containing no water. Specifically, preferable are butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol, acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and a mixture of two or more kinds thereof.

The present invention also provides a patterning process for forming a pattern in a substrate to be processed, comprising:

(VII-1) a step of forming an organic resist underlayer film on a substrate to be processed, applying the above composition for forming a silicon-containing metal hard mask thereon, then heat-treating the composition to from a silicon-containing metal hard mask, and further forming a resist upper layer film thereon;

(VII-2) a step of exposing and developing the resist upper layer film to form a resist upper layer film pattern;

(VII-3) a step of transferring the resist upper layer film pattern to the silicon-containing metal hard mask by dry etching while using the resist upper layer film pattern as a mask, and further transferring the resist upper layer film pattern to the organic resist underlayer film by dry etching while using the silicon-containing metal hard mask having the transferred resist upper layer film pattern as a mask, the transferring being performed with remaining a part of the silicon-containing metal hard mask on the organic resist underlayer film, and then forming an organic resist underlayer film pattern;

(VII-4) a step of removing the remained silicon-containing metal hard mask on the organic resist underlayer film pattern with a removing liquid;

(VII-5) a step of forming an inorganic silicon film composed of any one of polysilicon, amorphous silicon, silicon oxide, silicon nitride, silicon oxynitride, silicon carbide, or a composite material thereof so as to cover the organic resist underlayer film pattern by a CVD method or an ALD method;

(VII-6) a step of removing a part of the inorganic silicon film by dry etching, and uncovering an upper part of the organic resist underlayer film pattern; and (VII-7) a step of removing the organic resist underlayer film pattern to form an inorganic silicon film pattern having a pattern pitch being ½ of a pattern pitch of the resist upper layer film.

An example of the method for forming a resist pattern using the side-wall spacer method will be specifically described by using FIG. 4 as follows. As illustrated in FIG. 4(A), an organic resist underlayer film 3 is formed on a layer 2 to be processed laminated on a substrate 1 to be processed. Then, a silicon-containing metal hard mask 4 is formed, and a resist upper layer film 5 is formed thereon.

Then, as illustrated in FIG. 4(B), an exposure portion 6 in the resist upper layer film 5 is exposed, and PEB and development are performed to form a resist upper layer film pattern 5*a* (FIG. 4(C)). While using this obtained resist upper layer film pattern 5*a* as a mask, the silicon-containing metal hard mask 4 is processed by dry etching using a CF-based gas to form a silicon-containing metal hard mask pattern 4*a* (FIG. 4(D)). After the resist upper layer film pattern 5*a* is removed, while using this obtained silicon-containing metal hard mask pattern 4*a* as a mask, the organic resist underlayer film 3 is etched with oxygen plasma to form an organic resist underlayer film pattern 3*a* (FIG. 4(E)). The silicon-containing metal hard mask pattern 4*a* is then removed by wet removal (FIG. 4(S)).

Then, an inorganic silicon film 9 is formed so as to cover the organic resist underlayer film pattern 3*a* (FIG. 4(T)), the inorganic silicon film 9 is etch backed by dry etching, and an etch-backed inorganic silicon film 9*a* is formed to uncover an upper surface of the organic resist underlayer film pattern 3*a* (FIG. 4(U)). Then, the organic resist underlayer film pattern 3*a* is removed to form an inorganic silicon film pattern 9*b* having a pattern pitch being ½ of a pattern pitch of the resist upper layer film pattern (FIG. 4(V)). While using the inorganic silicon film pattern 9*b* having a pattern pitch being ½ of a pattern pitch of the resist upper layer film pattern as a mask, the layer 2 to be processed is processed by etching to form a pattern 2*a* to be formed on the layer to be processed (FIG. 4(W)).

In the above patterning process, the silicon-containing metal hard mask is etched with a chlorine-based gas or a fluorocarbon-based gas while using the resist upper layer film as a mask, and etched with an oxygen-based gas while using the obtained silicon-containing metal hard mask as a mask. Then, after the silicon-containing metal hard mask is wet-etched with wet removing liquid from the obtained resist underlayer film pattern, the inorganic silicon film is formed by using a CVD method or an ALD method on the organic resist underlayer film pattern. Thereafter, the upper layer of the inorganic silicon film is etched by using a fluorocarbon-based gas to uncover the upper surface of the organic resist underlayer film pattern. The uncovered organic resist underlayer film pattern is removed to form the inorganic silicon film pattern having a pattern pitch being ½ of a pattern pitch of the above resist pattern.

If a residue on the resist underlayer film is removed by dry etching, the substrate to be processed may be damaged to be a cause of a defect. However, in the patterning process using the inventive composition for forming a silicon-containing metal hard mask, the silicon-containing metal hard mask is easily removed by wet removal with a removing liquid. Thus, a fine pattern can be formed by using the side-wall spacer method without damaging the substrate.

The above silicon-containing metal hard mask remained on the organic resist underlayer film is washed and removed by a wet treatment using a removing liquid. Preferable as the removing liquid used in this case is a fluoride-ion-containing removing liquid and nitrogen-containing-cation-containing removing liquid. Commonly known are diluted hydrofluoric acid, an aqueous solution of ammonium fluoride, SC1, an aqueous solution of a tetraalkylammonium, an organic solvent containing a tetraalkylammonium, a water-containing organic solvent containing a tetraalkylammonium, etc., and the removing liquid is selected depending on a substrate material. An aqueous solution of a tetraalkylammonium and an organic solvent containing a tetraalkylammonium are most preferable because of a wide range of choice of the substrate material. An aqueous solution containing fluoride ion and SC1 can be used in a case of an appropriate substrate material.

EXAMPLE

Hereinafter, the present invention will be specifically described with showing Synthesis Examples, Examples, and Comparative Examples, but the present invention is not limited by these descriptions. In the following examples, "%" represents "mass %", and a molecular weight Mw means a weight-average molecular weight in terms of polystyrene by GPC measurement.

(A) Metal Oxide Nanoparticle

For a composition for forming a metal oxide film, the following metal oxide nanoparticles were used.

(A1): $ZrO_2$ nanoparticles (average primary particle diameter: 5 nm, 915505, Sigma-Aldrich Corp.)

(A2) Titanium oxide dispersion (average primary particle diameter: 6 nm, NS405, manufactured by TAYCA CORPORATION)

(A) Comparative Metal Oxide Compound (A3)

A comparative metal oxide compound (A3) used for a comparative composition for forming a metal oxide film was synthesized by the following procedure with reference to [Synthesis Example A-I] in JP 6196165 B.

Into a mixture of 28.4 g of titanium tetraisopropoxide and 50 g of isopropyl alcohol (IPA), a mixture of 2.7 g of pure water and 50 g of IPA was added dropwise. After the dropwise addition, the mixture was stirred for 3 hours. Then, 11.8 g of 2-(butylamino)ethanol was added, and the mixture was stirred for 17 hours. Furthermore, 30.4 g of 1,2-propanediol was added, and the mixture was heated under reflux for 2 hours. Into the mixture, 150 g of PGMEA was added, and the mixture was concentrated under a reduced pressure to obtain 130 g of a PGMEA solution of a titanium-containing compound (A3). This titanium-containing compound (A3), which is a hydrolytically condensed product of the metal alkoxide, becomes a polymer having a polymetaloxane main chain, so that this compound is structurally distinguished clearly from a metal oxide nanoparticle. Thus, this compound was used for Comparative Examples.

(A) Comparative Metal Oxide Compound (A4)

A comparative metal oxide compound (A4) used for a comparative composition for forming a metal oxide film was synthesized by the following procedure with reference to [Synthesis Example A-II] in JP 5756134 B. Into a mixture of 32.7 g of zirconium tetraisopropoxide, 50 g of isopropyl alcohol, and 50 g of acetylacetone, a mixture of 2.7 g of pure water and 50 g of isopropyl alcohol was added dropwise. After the dropwise addition, the mixture was stirred for 2 hours for hydrolytic condensation, and further heated under reflux for 2 hours. Into the mixture, 200 g of PGMEA was added, and the mixture was concentrated under a reduced pressure to obtain 250 g of a PGMEA solution of a zirconium-containing compound (A4). This zirconium-containing compound (A4), which is a hydrolytically condensed product of the metal alkoxide, is not a metal oxide nanoparticle similar to the above (A3). Thus, this compound was used for Comparative Examples.

Synthesis Example B1

Into a mixture of 120 g of methanol, 0.1 g of methanesulfonic acid, and 60 g of deionized water, a mixture of 20.4 g of a monomer 100, 45.7 g of a monomer 101, and 13.9 g of a monomer 103 was added. The mixture was maintained at 40° C. for 12 hours to proceed hydrolytic condensation. After the reaction, 200 g of propylene glycol methyl ether acetate (PGMEA) was added, and water used for the hydrolytic condensation and an alcohol byproduct were evaporated under a reduced pressure to obtain 170 g of a PGMEA solution of a polysiloxane compound B1 (compound concentration: 20%). A molecular weight of the polysiloxane compound B1 in terms of polystyrene was measured to found Mw=2,500.

Synthesis Examples B2 to B11

In the same manner as in Synthesis Example B1, [Synthesis Example B2] to [Synthesis Example B11] were performed by using monomers shown in Table 1 to obtain each target product B2 to B11.

TABLE 1

| Synthesis Example | Reaction raw material | Mw |
|---|---|---|
| B1 | monomer 100: 20.4 g, monomer 101: 45.7 g, monomer 103: 13.9 g | 2500 |
| B2 | monomer 100: 20.4 g, monomer 101: 45.7 g, monomer 104: 15.2 g | 2300 |
| B3 | monomer 100: 20.4 g, monomer 101: 45.7 g, monomer 105: 15.8 g | 2400 |
| B4 | monomer 100: 20.4 g, monomer 101: 45.7 g, monomer 106: 15.5 g | 2600 |

TABLE 1-continued

| Synthesis Example | Reaction raw material | Mw |
|---|---|---|
| B5 | monomer 100: 20.4 g, monomer 101: 45.7 g, monomer 107: 12.7 g | 2400 |
| B6 | monomer 100: 20.4 g, monomer 101: 45.7 g, monomer 108: 11.8 g | 2500 |
| B7 | monomer 100: 20.4 g, monomer 101: 45.7 g, monomer 109: 13.9 g | 2500 |
| B8 | monomer 100: 20.4 g, monomer 101: 45.7 g, monomer 110: 13.2 g | 2300 |
| B9 | monomer 100: 20.4 g, monomer 101: 45.7 g, monomer 111: 14.7 g | 2400 |
| B10 | monomer 100: 20.4 g, monomer 101: 45.7 g, monomer 112: 16.3 g | 2500 |
| B11 | monomer 100: 20.4 g, monomer 101: 45.7 g, monomer 102: 9.9 g | 2400 |

The compounds used in Examples and Comparative Examples will be shown below. Ph represents a phenyl group.

Monomer 100 . . . $CH_3Si(OCH_3)_3$

Monomer 101 . . . $Si(OCH_3)_4$

Monomer 102 . . . $PhSi(OCH_3)_3$

Monomer 103

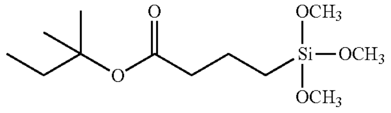

Monomer 104

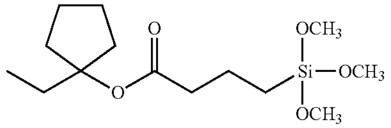

Monomer 105

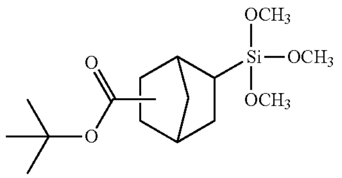

Monomer 106

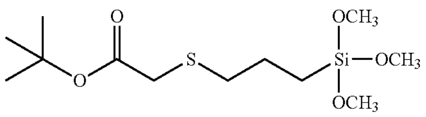

Monomer 107

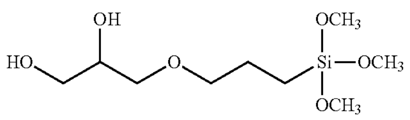

Monomer 108

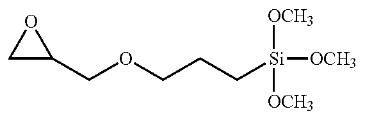

Monomer 109

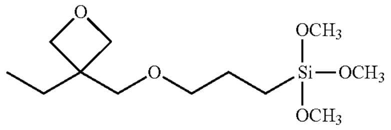

-continued

Monomer 110

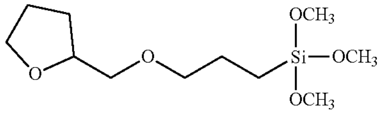

Monomer 111

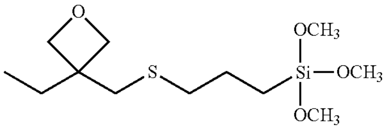

Monomer 112

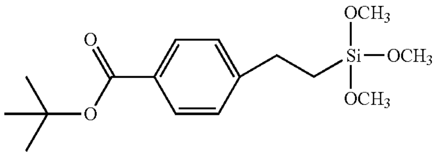

Examples and Comparative Examples

The metal oxide nanoparticles (A1 and A2), the comparative metal oxide compounds (A3 and A4), the polysiloxane compounds B1 to B11 obtained in Synthesis Examples, a crosslinking catalyst, a photoacid generator, and a solvent were mixed at proportions shown in Table 2, and the mixture was filtered through a 0.1 μm filter made of a fluororesin to prepare compositions for forming a silicon-containing metal hard mask (UDL-1 to 15 and Comparative UDL-1 to 6). (Composition for Forming Silicon-Containing Metal Hard Mask)

TPS-NO3: Triphenylsulfonium nitrate
TPSMA: Mono(triphenylsulfonium) maleate
TPSNf: Triphenylsulfonium nonafluorobutanesulfonate
PAG-1: See the following formula.

PAG-1

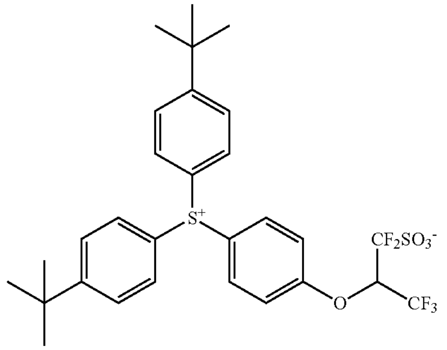

D1: 1,6-Diacetoxyhexane (boiling point: 260° C.)
PGMEA: Propylene glycol monomethyl ether acetate
PGEE: Propylene glycol monoethyl ether

[Evaluation of Filling Ability] (Examples 1-1 to 1-15 and Comparative Examples 1-1 to 1-6)

The above compositions for forming a silicon-containing metal hard mask (UDL-1 to 15 and Comparative UDL-1 to 6) were each applied on a $SiO_2$ wafer substrate having a dense line-and-space pattern (line width: 40 nm, line depth: 150 nm, distance between centers of adjacent two lines: 80 nm). The coated substrate was heated at 350° C. for 60

TABLE 2

| Composition for forming silicon-containing metal hard mask | (A)Metal oxide nanoparticle (parts by mass) | (B) Thermally crosslinkable polysiloxane (parts by mass) | Crosslinking catalyst (parts by mass) | Photoacid generator (parts by mass) | Additive (high boiling-point solvent) (parts by mass) | Solvent (parts by mass) |
|---|---|---|---|---|---|---|
| UDL-1 | A1 (50) | B1 (50) | — | — | — | PGMEA(550)/PGEE(550) |
| UDL-2 | A1 (50) | B2 (50) | — | — | — | PGMEA(550)/PGEE(550) |
| UDL-3 | A1 (50) | B3 (50) | — | — | — | PGMEA(550)/PGEE(550) |
| UDL-4 | A1 (50) | B4 (50) | — | — | — | PGMEA(550)/PGEE(550) |
| UDL-5 | A1 (50) | B5 (50) | — | — | — | PGMEA(550)/PGEE(550) |
| UDL-6 | A1 (50) | B6 (50) | — | — | — | PGMEA(550)/PGEE(550) |
| UDL-7 | A1 (50) | B7 (50) | — | — | — | PGMEA(550)/PGEE(550) |
| UDL-8 | A1 (50) | B8 (50) | — | — | — | PGMEA(550)/PGEE(550) |
| UDL-9 | A1 (50) | B9 (50) | — | — | — | PGMEA(550)/PGEE(550) |
| UDL-10 | A2 (50) | B1 (50) | — | — | — | PGMEA(550)/PGEE(550) |
| UDL-11 | A2 (90) | B1 (10) | — | — | — | PGMEA(550)/PGEE(550) |
| UDL-12 | A2 (10) | B1 (90) | — | — | — | PGMEA(550)/PGEE(550) |
| UDL-13 | A1 (50) | B1 (50) | TPS-NO3 (1.0) | TPSNf (1.0) | — | PGMEA(550)/PGEE(550) |
| UDL-14 | A1 (50) | B2 (50) | TPSMA (1.0) | PAG-1 (1.0) | — | PGMEA(550)/PGEE(550) |
| UDL-15 | A1 (50) | B3 (50) | — | — | D1 (10) | PGMEA(500)/PGEE(500) |
| Comparative UDL-1 | A1 (100) | — | — | — | — | PGMEA(550)/PGEE(550) |
| Comparative UDL-2 | — | B1 (100) | TPS-NO3 (1.0) | — | — | PGMEA(550)/PGEE(550) |
| Comparative UDL-3 | A1 (50) | B10 (50) | — | — | — | PGMEA(550)/PGEE(550) |
| Comparative UDL-4 | A1 (50) | B11 (50) | — | — | — | PGMEA(550)/PGEE(550) |
| Comparative UDL-5 | A3 (50) | B3 (50) | — | — | — | PGMEA(550)/PGEE(550) |
| Comparative UDL-6 | A4 (50) | B3 (50) | — | — | — | PGMEA(550)/PGEE(550) |

seconds by using a hot plate to form a metal oxide film with 100 nm in film thickness. The used substrate was a base substrate 10 ($SiO_2$ wafer substrate) having the dense line-and-space pattern illustrated in FIG. 5(X) (overhead view) and (Y) (sectional view). The sectional shape of each of the obtained wafer substrate was observed by using an electron microscope (S-4700), manufactured by Hitachi, Ltd., to check whether there is no void (space) inside the silicon-containing metal hard mask filling the gap of the lines. Table 3 shows the results. When a composition for forming a silicon-containing metal hard mask having poor filling ability is used, voids are generated inside the metal hard mask filling the gap of the lines in this evaluation. When a composition for forming a silicon-containing metal hard mask having good filling ability is used, filled is a silicon-containing metal oxide film 11 having no void inside the silicon-containing metal hard mask filling the gap of the lines of the base substrate 10 having the dense line-and-space pattern, as illustrated in FIG. 5(Z), in this evaluation.

TABLE 3

| | Metal hard mask Composition | Filling Void |
|---|---|---|
| Example 1-1 | UDL-1 | Absent |
| Example 1-2 | UDL-2 | Absent |
| Example 1-3 | UDL-3 | Absent |
| Example 1-4 | UDL-4 | Absent |
| Example 1-5 | UDL-5 | Absent |
| Example 1-6 | UDL-6 | Absent |
| Example 1-7 | UDL-7 | Absent |
| Example 1-8 | UDL-8 | Absent |
| Example 1-9 | UDL-9 | Absent |
| Example 1-10 | UDL-10 | Absent |
| Example 1-11 | UDL-11 | Absent |
| Example 1-12 | UDL-12 | Absent |
| Example 1-13 | UDL-13 | Absent |
| Example 1-14 | UDL-14 | Absent |
| Example 1-15 | UDL-15 | Absent |
| Comparative Example 1-1 | Comparative UDL-1 | Present |
| Comparative Example 1-2 | Comparative UDL-2 | Absent |
| Comparative Example 1-3 | Comparative UDL-3 | Present |
| Comparative Example 1-4 | Comparative UDL-4 | Present |
| Comparative Example 1-5 | Comparative UDL-5 | Present |
| Comparative Example 1-6 | Comparative UDL-6 | Present |

As shown in Table 3, Examples 1-1 to 1-15, which use the inventive composition for forming a silicon-containing metal hard mask (UDL-1 to 15), can fill the dense line-and-space pattern without voids, and it has been confirmed that the inventive composition has good filling ability. Meanwhile, in Comparative Example 1-1, which singly used the metal oxide nanoparticle without the inventive polysiloxane, and Comparative Example 1-3 and Comparative Example 1-4, which used the polysiloxane having an aromatic ring-containing organic group, a void was observed. This is presumably because the metal oxide nanoparticle alone has insufficient thermal flowability, and requires assist for flowability by the thermally crosslinkable polysiloxane. However, it is presumed that the thermally crosslinkable polysiloxane having an aromatic ring-containing organic group has a rigid molecular chain and insufficient thermal flowability, and no improvement of the filling ability was observed in Comparative Example 1-3 and Comparative Example 1-4. In Comparative Example 1-5 and Comparative Example 1-6, which use not the metal oxide nanoparticle but the hydrolytic condensed products A3 and A4 of the metal alkoxide, a void was also observed. This is presumably because A3 and A4, which are obtained by hydrolyzing or condensing the hydrolysable metal compound, have high reactivity, and the thermal flowability is insufficient even in the presence of the inventive polysiloxane having no aromatic ring-containing organic group to lead to the void generation.

Evaluation of Etching Resistance (Examples 2-1 to 2-15 and Comparative Examples 2-1 to 2-6)

The compositions for forming a silicon-containing metal hard mask (UDL-1 to 15 and Comparative UDL-1 to 6) prepared above were each applied on a silicon substrate, baked in the atmosphere at 350° C. for 60 seconds to form an applied film with 100 nm, and the film thickness “a” was measured. Then, etching was performed with each of $CF_4$ gas and $O_2$ gas for 1 minute under the following conditions by using an etching device “Telius”, manufactured by Tokyo Electron Ltd., and the film thickness “b” was measured. The film thickness etched in the 1 minute (film thickness “b”−film thickness “a”) was calculated as etching resistance. A case of the difference between the film thicknesses “b” and “a” being less than 15 nm was evaluated as “A” (excellent), a case of that being 15 nm or more and less than 25 nm was evaluated as “B” (good), and a case of that being 25 nm or more was evaluated as “C” (poor). Table 4 shows the results.

Dry Etching Condition with $CF_4$ Gas

Chamber pressure: 100 mTorr
RF power (upper part): 300 W
RF power (lower part): 200 W
$CF_4$ gas flow rate: 150 sccm
Time: 60 sec Dry Etching Condition with $O_2$ Gas Chamber pressure: 100 mTorr
RF power (upper part): 500 W
RF power (lower part): 500 W
02 gas flow rate: 300 sccm
$CO_2$ gas flow rate: 90 sccm
Ar gas flow rate: 200 sccm
Time: 60 sec

TABLE 4

| | Metal hard mask | Etching resistance | |
|---|---|---|---|
| | Composition | $CF_4$ | $O_2$ |
| Example 2-1 | UDL-1 | A | A |
| Example 2-2 | UDL-2 | A | A |
| Example 2-3 | UDL-3 | A | A |
| Example 2-4 | UDL-4 | A | A |
| Example 2-5 | UDL-5 | A | A |
| Example 2-6 | UDL-6 | A | A |
| Example 2-7 | UDL-7 | A | A |
| Example 2-8 | UDL-8 | A | A |
| Example 2-9 | UDL-9 | A | A |
| Example 2-10 | UDL-10 | A | A |
| Example 2-11 | UDL-11 | A | A |
| Example 2-12 | UDL-12 | B | B |
| Example 2-13 | UDL-13 | A | A |
| Example 2-14 | UDL-14 | A | A |
| Example 2-15 | UDL-15 | A | A |
| Comparative Example 2-1 | Comparative UDL-1 | A | A |
| Comparative Example 2-2 | Comparative UDL-2 | C | C |
| Comparative Example 2-3 | Comparative UDL-3 | A | A |
| Comparative Example 2-4 | Comparative UDL-4 | A | A |
| Comparative Example 2-5 | Comparative UDL-5 | C | C |
| Comparative Example 2-6 | Comparative UDL-6 | C | C |

As shown in Table 4, it has been confirmed that Examples 2-1 to 2-15, which used the inventive compositions for forming a silicon-containing metal hard mask (UDL-1 to 15), had excellent etching resistance against the $CF_4$-based gas and the O2-based gas. Meanwhile, in Comparative Example 2-2, which was composed of only the polysiloxane and contained no metal oxide having excellent etching resistance, insufficient etching resistance was observed. In Comparative Example 2-5 and Comparative Example 2-6, which used not the metal oxide nanoparticle but the metal oxide compound obtained by hydrolyzing or condensing the hydrolysable metal compound, deteriorated etching resistance was observed compared with Examples 2-1 to 2-15, which used the metal oxide nanoparticle. The metal oxide compound obtained by hydrolyzing or condensing the hydrolysable metal compound has high reactivity and low stability, and thereby the crosslinking with the polysiloxane becomes uneven to cause the polysiloxane having poor etching resistance to remain in the film. On the other hand, in the inventive composition for forming a silicon-containing metal hard mask using the metal oxide nanoparticle, the metal oxide is well dispersed in the composition, and thereby it is considered that the crosslinking between the Si atom and the metal atom via the oxygen atom well proceeds during the baking, and the metal having excellent etching resistance can be evenly dispersed in the film.

Evaluation of Wet Etching (Examples 3-1 to 3-15 and Comparative Example 3-1 to 3-6)

The compositions for forming a silicon-containing metal hard mask (UDL-1 to 15 and Comparative UDL-1 to 6) prepared above were each applied on a silicon substrate, baked at 350° C. for 60 seconds to form an applied film with 100 nm, and the film thickness was measured. These films were immersed in a 25% aqueous solution of tetramethylammonium hydroxide (hereinafter, referred to as "TMAH") at 50° C. for 1 minute, and a thickness of the remained film was measured with M-2000 high-speed spectroscopic ellipsometer, manufactured by J. A. Woollam Co., Inc. Table 5 shows the results.

TABLE 5

| | Metal hard mask Composition | Film thickness before treatment nm | Film thickness after treatment nm |
|---|---|---|---|
| Example 3-1 | UDL-1 | 97 | <1 |
| Example 3-2 | UDL-2 | 100 | <1 |
| Example 3-3 | UDL-3 | 102 | <1 |
| Example 3-4 | UDL-4 | 98 | <1 |
| Example 3-5 | UDL-5 | 99 | <1 |
| Example 3-6 | UDL-6 | 100 | <1 |
| Example 3-7 | UDL-7 | 101 | <1 |
| Example 3-8 | UDL-8 | 99 | <1 |
| Example 3-9 | UDL-9 | 101 | <1 |
| Example 3-10 | UDL-10 | 98 | <1 |
| Example 3-11 | UDL-11 | 97 | <1 |
| Example 3-12 | UDL-12 | 98 | <1 |
| Example 3-13 | UDL-13 | 99 | <1 |
| Example 3-14 | UDL-14 | 100 | <1 |
| Example 3-15 | UDL-15 | 102 | <1 |
| Comparative Example 3-1 | Comparative UDL-1 | 100 | 99 |
| Comparative Example 3-2 | Comparative UDL-2 | 103 | 103 |
| Comparative Example 3-3 | Comparative UDL-3 | 99 | <1 |
| Comparative Example 3-4 | Comparative UDL-4 | 97 | 16 |
| Comparative Example 3-5 | Comparative UDL-5 | 102 | 57 |
| Comparative Example 3-6 | Comparative UDL-6 | 99 | 52 |

As shown in Table 5, Examples 3-1 to 3-15, which used the inventive composition for forming a silicon-containing metal hard mask (UDL-1 to 15), was confirmed to have excellent removability with wet etching using TMAH. Meanwhile, Comparative Example 3-1, which was composed of only the metal oxide nanoparticle, and Comparative Example 3-2, which was composed of only the polysiloxane, had insufficient removability, and no change in film thickness was observed. Comparative Example 3-5 and Comparative Example 3-6, which used not the metal oxide nanoparticle but the metal oxide compound obtained by hydrolyzing or condensing the hydrolysable metal compound, were observed to have deteriorated removability compared with Examples 3-1 to 3-15, which used the metal oxide nanoparticle. The metal oxide compound obtained by hydrolyzing or condensing the hydrolysable metal compound has high reactivity and low stability, and thereby the crosslinking with the polysiloxane becomes uneven to easily cause the polysiloxane film and the metal oxide film having TMAH-removal resistance each remained in the film. On the other hand, in the inventive composition for forming a silicon-containing metal hard mask using the metal oxide nanoparticle, the metal oxide is well dispersed in the composition, and thereby the crosslinking between the Si atom and the metal atom via the oxygen atom well proceeds during the baking. Thus, it is considered that the polysiloxane film and the silicon-containing metal hard mask having excellent TMAH-removal resistance is hardly remained locally in the film.

When the thermally crosslinkable polysiloxane combined with the metal oxide nanoparticle was the thermally crosslinkable polysiloxane having no $R^a$, the removability was confirmed to be deteriorated from the comparison between Comparative Example 3-3 and Comparative Example 3-4. From these results, it can be mentioned that $R^a$ having good compatibility with the removing liquid is preferably contained.

[Evaluation of EUV Patterning] (Examples 4-1 to 4-15 and Comparative Example 4-1 to 4-6)

A composition in which the compositions for forming a silicon-containing metal hard mask (UDL-1 to 15 and Comparative UDL-1 to 6) prepared above was diluted with 6200 parts of PGMEA and applied on a $SiO_2$ substrate, and heated at 220° C. for 60 seconds to produce a silicon-containing metal hard mask (resist underlayer film) with 20 nm in film thickness.

Subsequently, a resist material dissolving the following components at proportions shown in Table 6 was applied on the silicon-containing metal hard mask by spin-coating, and the resist material was pre-baked at 105° C. for 60 seconds by using a hot plate to produce a resist film with 35 nm in film thickness. This resist film was exposed using an EUV scanner NXE3300 (NA 0.33, σ 0.9/0.6, quadrupole illumination, L/S pattern with 36 nm in pitch on wafer size), manufactured by ASML Holding N.V. PEB was performed at 100° C. for 60 seconds on a hot plate, development was performed with a 2.38 mass % aqueous TMAH solution for 30 seconds to obtain lines with 18 nm in size. On this size, LWR was observed with an electron microscope (CG5000), manufactured by Hitachi High-Technologies Corporation, and the sectional shape was observed with an electron microscope (S-9380), manufactured by Hitachi, Ltd., (Table 7).

The used polymer, quencher, sensitizer, surfactant, and organic solvents were as follows.

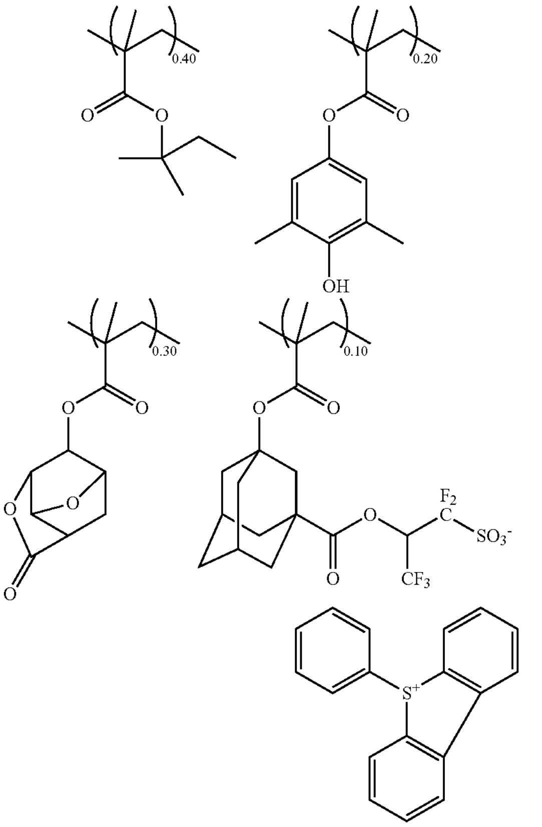

Polymer

Mw = 8,900
Mw/Mn = 1.89

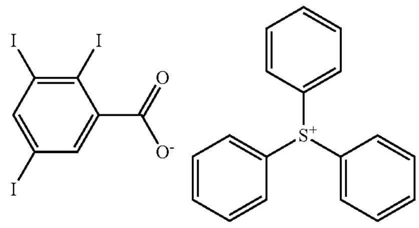

Quencher

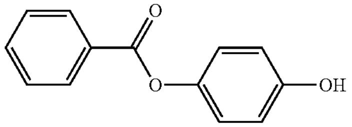

Sensitizer

Surfactant: FC-4430, manufactured by 3M
PGMEA: Propylene glycol monomethyl ether acetate
CyHO: Cyclohexanone
PGME: Propylene glycol monomethyl ether

TABLE 6

| Component | Polymer | Quencher | Sensitizer | Surfactant | Organic solvent |
|---|---|---|---|---|---|
| Composition (parts by mass) | (100) | (4.0) | (2.1) | (0.25) | PGMEA (400)<br>CyHO (2000)<br>PGME (100) |

TABLE 7

| | Composition for metal hard mask | PGMEA dilution (parts by mass) | EUV patterning | |
|---|---|---|---|---|
| | | | LWR | Sectional shape |
| Example 4-1 | UDL-1 | 6200 | 4.1 | Vertical |
| Example 4-2 | UDL-2 | 6200 | 4.2 | Vertical |
| Example 4-3 | UDL-3 | 6200 | 4.2 | Vertical |
| Example 4-4 | UDL-4 | 6200 | 4.3 | Vertical |
| Example 4-5 | UDL-5 | 6200 | 4.2 | Vertical |
| Example 4-6 | UDL-6 | 6200 | 4.2 | Vertical |
| Example 4-7 | UDL-7 | 6200 | 4.3 | Vertical |
| Example 4-8 | UDL-8 | 6200 | 4.0 | Vertical |
| Example 4-9 | UDL-9 | 6200 | 4.2 | Vertical |
| Example 4-10 | UDL-10 | 6200 | 4.2 | Vertical |
| Example 4-11 | UDL-11 | 6200 | 4.4 | Vertical |
| Example 4-12 | UDL-12 | 6200 | 4.2 | Vertical |
| Example 4-13 | UDL-13 | 6200 | 4.1 | Vertical |
| Example 4-14 | UDL-14 | 6200 | 4.1 | Vertical |
| Example 4-15 | UDL-15 | 6200 | 4.2 | Vertical |
| Comparative Example 4-1 | Comparative UDL-1 | 6200 | Pattern collapsed | Pattern collapsed |
| Comparative Example 4-2 | Comparative UDL-2 | 6200 | 4.1 | Vertical |
| Comparative Example 4-3 | Comparative UDL-3 | 6200 | 4.4 | Vertical |
| Comparative Example 4-4 | Comparative UDL-4 | 6200 | Pattern collapsed | Pattern collapsed |
| Comparative Example 4-5 | Comparative UDL-5 | 6200 | Pattern collapsed | Pattern collapsed |
| Comparative Example 4-6 | Comparative UDL-6 | 6200 | Pattern collapsed | Pattern collapsed |

100721

As shown in Table 7, Examples 4-1 to 4-15, which used the inventive compositions for forming a silicon-containing metal hard mask (UDL-1 to 15), used the thermally crosslinkable polysiloxane having the organic group having excellent adhesiveness to the resist upper layer film, and thereby the effect of inhibiting the pattern collapse and exhibiting good LWR can be confirmed. Meanwhile, Comparative Example 4-1, which was composed of only the metal oxide nanoparticle, had insufficient adhesiveness to the resist upper layer film, and was confirmed to cause considerable pattern collapse. In Comparative Example 4-4, which used the thermally crosslinkable polysiloxane B11 having no organic group having excellent adhesiveness to the resist, the pattern collapse was also observed. In Comparative Example 4-5 and Comparative Example 4-6, which used not the metal oxide nanoparticle but the metal oxide compound obtained by hydrolyzing or condensing the hydrolysable metal compound, the pattern collapse was also observed. This is presumably because the metal oxide compound obtained by hydrolyzing or condensing the hydrolysable metal compound has high reactivity and low stability, and the crosslinking with the polysiloxane becomes uneven to fail to evenly form the layer having excellent adhesiveness to the resist upper layer film on the boundary with the resist upper layer film.

Resist-Pattern Reversing Method (Examples 5-1 to 5-15 and Comparative Examples 5-1 to 5-6)

On a $SiO_2$ substrate, a spin-on-carbon (SOC) film ODL-301 (carbon content: 88 mass %), manufactured by Shin-Etsu Chemical Co., Ltd., was applied, and heated at 350° C. for 60 seconds to from a SOC film with 200 nm in film thickness. A resist material dissolving the components at proportions shown in Table 9 (see Tables 9 to 11) Table 8 was applied thereon by spin-coating, and the resist material was pre-baked at 105° C. for 60 seconds by using a hot plate to produce a resist film with 100 nm in film thickness. Then, an immersion protective film material (TC-1) was applied on the photoresist film, and baked at 90° C. for 60 seconds to produce a protective film with 50 nm in film thickness. This material was exposed by using an ArF immersion exposure device (manufactured by NIKON CORPORATION; NSR-S610C, NA 1.30, σ 0.98/0.65, 35°-dipole s-polarized illumination, 6% halftone phase-shifting mask), baked (PEB) at 100° C. for 60 seconds, and developed with a 2.38 mass % aqueous solution of tetramethylammonium hydroxide (TMAH) for 30 seconds to obtain a positive-type line-and-space pattern (resist pattern) of 1:1 with 55 nm. Thereafter, the above composition for forming a silicon-containing metal hard mask (UDL-1 to 15 and Comparative UDL-1 to 6) prepared so as to have a film thickness of 100 nm by baking at 100° C. was applied, and heated at 100° C. for 60 seconds to form a silicon-containing metal hard mask and to fill the resist pattern. The sectional shape with a gap of the resist pattern filled with the silicon-containing metal hard mask was observed with an electron microscope (S-4700), manufactured by Hitachi, Ltd., to check whether there is no void (space) inside the silicon-containing metal hard mask filling the gap of the pattern.

As the resist upper layer film material (single layer resist for ArF), a polymer (RP 1), an acid generator (PAG 1), and a base compound (Amine 1) were dissolved in a solvent containing 0.1 mass % of a surfactant FC-4430 (manufactured by Sumitomo 3M Limited.) at proportions in Table 8, and the mixture was filtered through a 0.1 μm filter made of a fluororesin to prepare the resist upper layer film material.

TABLE 8

| | Polymer (parts by mass) | Acid generator (parts by mass) | Base compound (parts by mass) | Solvent (parts by mass) |
|---|---|---|---|---|
| Single layer resist for ArF | RP 1 (100) | PAG 1 (6.6) | Amine 1 (0.8) | PGMEA (2500) |

The polymer (RP 1), acid generator (PAG 1), and base compound (Amine 1) used for the resist upper layer film material (single layer resist for ArF) are shown below.

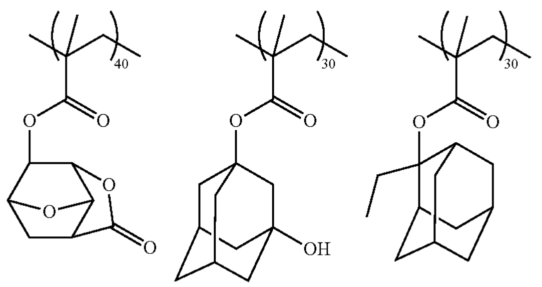

RP1

Mw 7,800

-continued

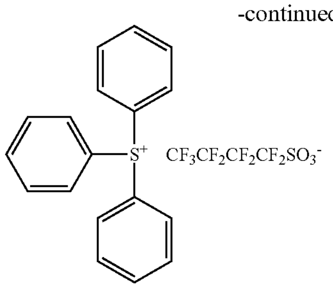

PAG1

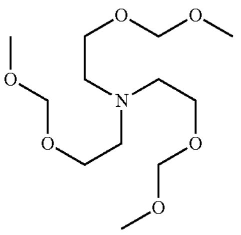

Amine1

As the protective film material for immersion (TC-1), a protective film polymer (PP 1) was dissolved in organic solvents at proportions in Table 9, and the mixture was filtered through a 0.1 μm filter made of a fluororesin to prepare the protective film material for immersion.

TABLE 9

| | Polymer (parts by mass) | Organic solvent (parts by mass) |
|---|---|---|
| TC-1 | PP 1 (100) | Diisoamyl ether (2700) 2-Methyl-1-butanol (270) |

The polymer (PP 1) used for the protective film material for immersion (TC-1) is shown below.

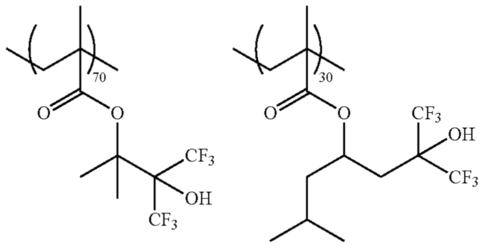

PP1

Mw 8,800

Then, the silicon-containing metal oxide film covering the resist pattern was etched by using an etching device "Telius", manufactured by Tokyo Electron Ltd., to uncover an upper surface of the resist pattern. The resist pattern having the uncovered upper surface was removed by etching to reverse the above pattern on the silicon-containing metal oxide film. While using the obtained silicon-containing metal oxide film pattern as a mask, the SOC film was etched. While using the obtained SOC film pattern as a mask, the $SiO_2$ film was processed by etching. The etching conditions are shown as follows.

The Condition of Etching Back the Silicon-Containing Metal Oxide Film (Uncovering the Resist Pattern)

Chamber pressure: 100 mTorr

RF power (upper part): 300 W

RF power (lower part): 200 W $CF_4$ gas flow rate: 150 sccm

Time: 60 sec

The Condition of Removing the Resist Pattern (Reversing the Resist Pattern on the Silicon-Containing Metal Oxide Film)

Chamber pressure: 15 mTorr
RF power (upper part): 300 W
RF power (lower part): 50 W
$O_2$ gas flow rate: 30 sccm
$N_2$ gas flow rate: 270 sccm
Time: 60 sec The Condition of Transferring the Metal Oxide Film Pattern to the SOC Film Chamber pressure: 100 mTorr
RF power (upper part): 500 W
RF power (lower part): 500 W
$O_2$ gas flow rate: 300 sccm
$CO_2$ gas flow rate: 90 sccm
Ar gas flow rate: 200 sccm
Time: 60 sec The Condition of Transferring the SOC Film Pattern to the $SiO_2$ Film Chamber pressure: 10 mTorr
RF power (upper part): 100 W
RF power (lower part): 800 W
$CF_4$ gas flow rate: 25 sccm
$CHF_3$ gas flow rate: 15 sccm
$O_2$ gas flow rate: 5 sccm
Time: 200 sec The sectional shape with a gap of the resist pattern filled with the silicon-containing metal hard mask was observed by using an electron microscope (S-4700), manufactured by Hitachi, Ltd., to check whether there is no void (space) inside the silicon-containing metal hard mask filling the gap of the pattern. The sectional shape of the $SiO_2$ pattern formed by reversing the resist pattern was also observed. Table 10 shows the results.

TABLE 10

| | Composition for metal hard mask | Pattern reversibility | |
|---|---|---|---|
| | | Filling gap of resist pattern/ void | Sectional shape of $SiO_2$ pattern after reverse-transferring pattern |
| Example 5-1 | UDL-1 | Absent | Vertical |
| Example 5-2 | UDL-2 | Absent | Vertical |
| Example 5-3 | UDL-3 | Absent | Vertical |
| Example 5-4 | UDL-4 | Absent | Vertical |
| Example 5-5 | UDL-5 | Absent | Vertical |
| Example 5-6 | UDL-6 | Absent | Vertical |
| Example 5-7 | UDL-7 | Absent | Vertical |
| Example 5-8 | UDL-8 | Absent | Vertical |
| Example 5-9 | UDL-9 | Absent | Vertical |
| Example 5-10 | UDL-10 | Absent | Vertical |
| Example 5-11 | UDL-11 | Absent | Vertical |
| Example 5-12 | UDL-12 | Absent | Vertical |
| Example 5-13 | UDL-13 | Absent | Vertical |
| Example 5-14 | UDL-14 | Absent | Vertical |
| Example 5-15 | UDL-15 | Absent | Vertical |
| Comparative Example 5-1 | Comparative UDL-1 | Present | Pattern crushed |
| Comparative Example 5-2 | Comparative UDL-2 | Absent | Pattern twisted |
| Comparative Example 5-3 | Comparative UDL-3 | Present | Pattern crushed |
| Comparative Example 5-4 | Comparative UDL-4 | Present | Pattern crushed |
| Comparative Example 5-5 | Comparative UDL-5 | Present | Pattern crushed |

TABLE 10-continued

| | Composition for metal hard mask | Pattern reversibility | |
|---|---|---|---|
| | | Filling gap of resist pattern/ void | Sectional shape of $SiO_2$ pattern after reverse-transferring pattern |
| Comparative Example 5-6 | Comparative UDL-6 | Present | Pattern crushed |

As shown in Table 10, Examples 5-1 to 5-15, which used the inventive compositions for forming a silicon-containing metal hard mask (UDL-1 to 15), had excellent flowability during the spin-coating, and thereby confirmed to fill the gap of the resist pattern without void. The sectional shape of the $SiO_2$ substrate to which the pattern formed by reversing the resist pattern on the silicon-containing oxide film pattern was transferred was formed in the vertical shape, and the excellent pattern transferring ability was confirmed. From the results, when an ultrafine pattern is formed with the lithography process, the inventive composition for forming a silicon-containing metal hard mask forms the silicon-containing metal oxide film in the gap of the resist pattern by applying the composition on the resist pattern. The difference in the dry etching rate between the resist pattern and the silicon-containing metal oxide film formed in the gap thereof is utilized to enable to reverse the pattern. Meanwhile, in Comparative Example 5-1 and Comparative Examples 5-3 to 5-6, which had poor filling ability due to the insufficient flowability observed in the above evaluation of the filling ability, a void was observed in the gap of the resist pattern during the filling. Thus, the sectional shape of the $SiO_2$ film pattern after reversing the resist pattern found the crushed pattern or pattern-less region. Comparative Example 5-2 had good filling property of the gap of the resist pattern, but found pattern twisting on the sectional shape of the $SiO_2$ film pattern after reversing the resist pattern. This is presumably due to insufficient etching resistance against the $O_2$-based gas in the above evaluation of the etching resistance.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A composition for forming a silicon-containing metal hard mask, comprising:

(A) a metal oxide nanoparticle;

(B) a thermally crosslinkable polysiloxane (Sx) having no aromatic-ring-containing organic group; and (C) a solvent, wherein (B) the thermally crosslinkable polysiloxane (Sx) has a structural unit of any one or more of a repeating unit represented by the following general formula (Sx-1), a repeating unit represented by the following formula (Sx-2), and a partial structure represented by the following general formula (Sx-3), (Sx-1)
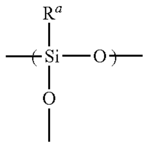
(Sx-2)
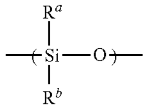
(Sx-3)
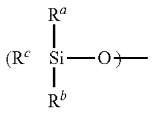
wherein $R^a$ represents: an organic group represented by any of the following formulae (T1) to (T3); and $R^b$ and $R^c$ each independently represent an organic group having no aromatic ring,
(T1)
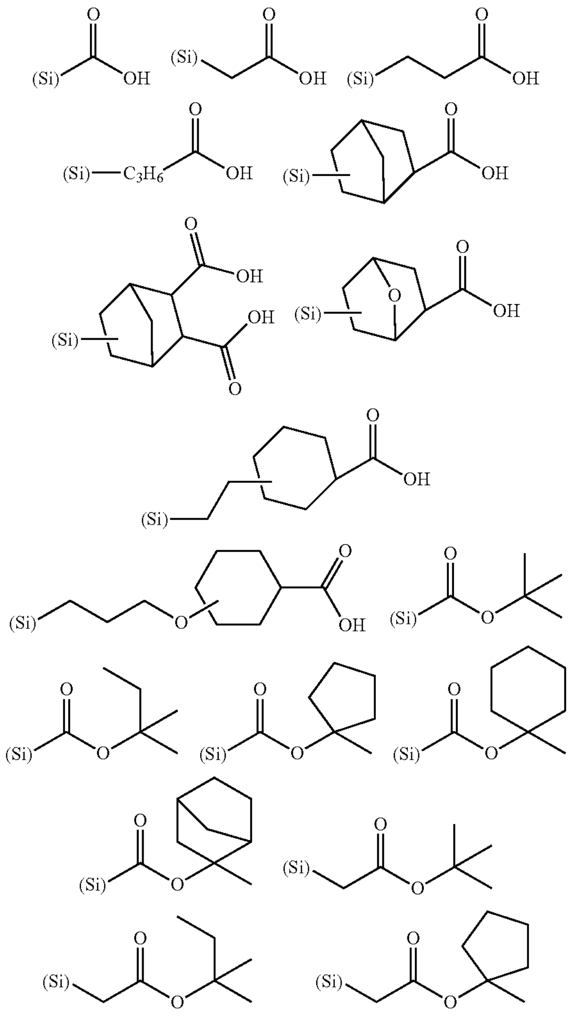
-continued
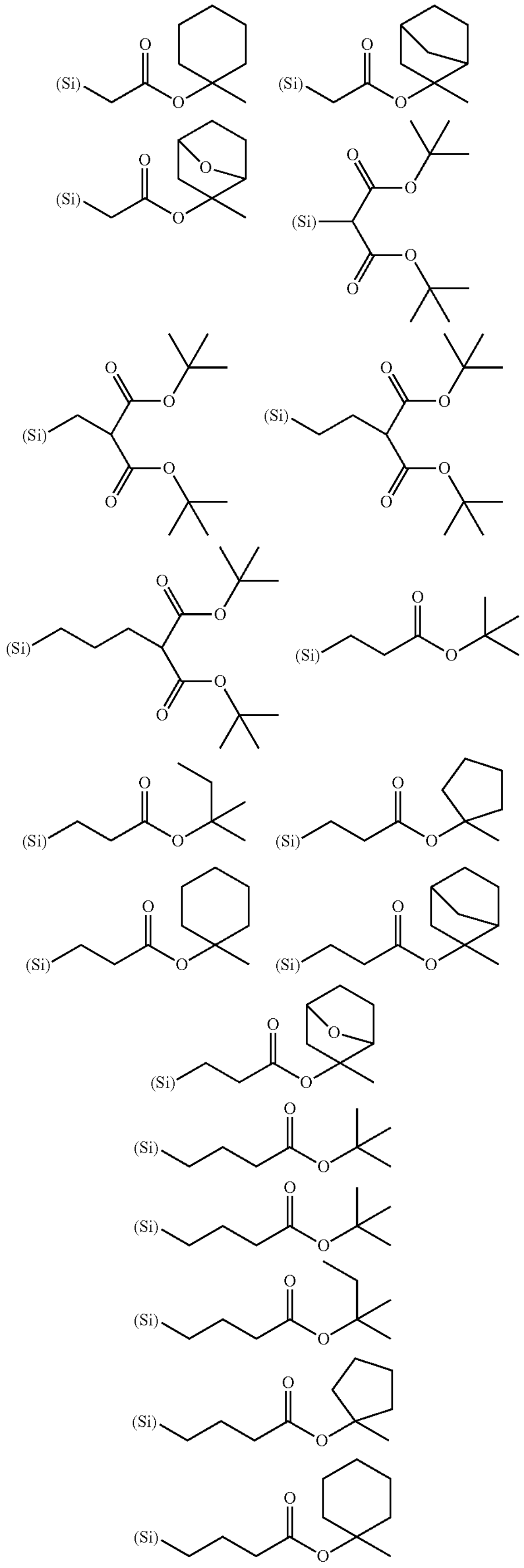

-continued
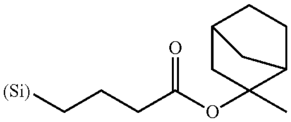
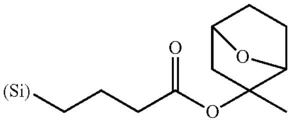
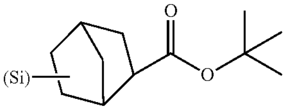
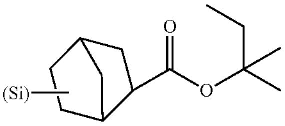
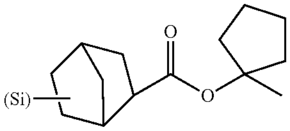
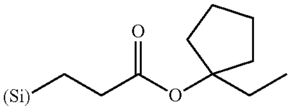
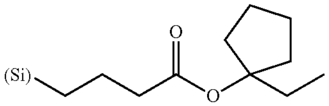
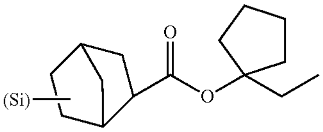
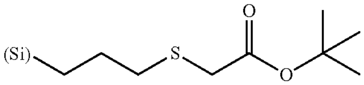
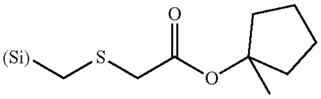
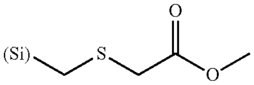
(T2)
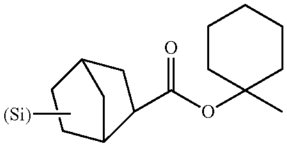
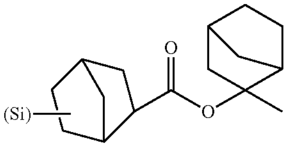
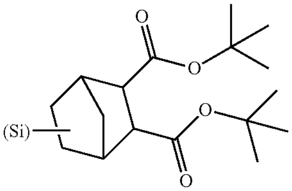
-continued
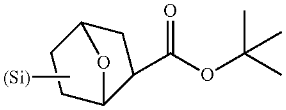
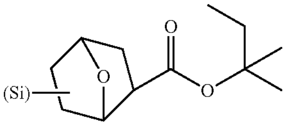
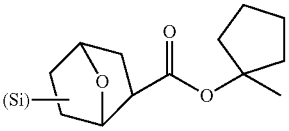
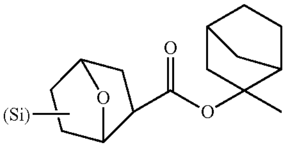
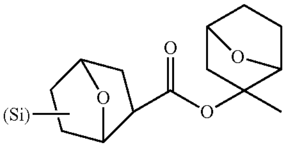
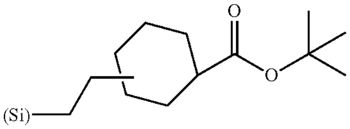
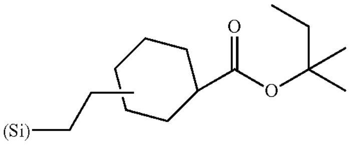
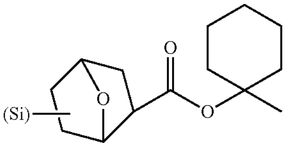
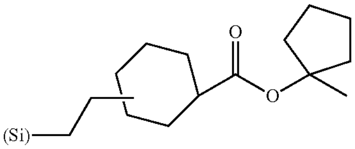
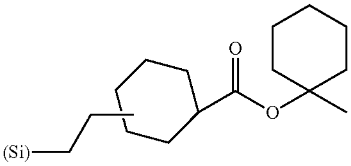
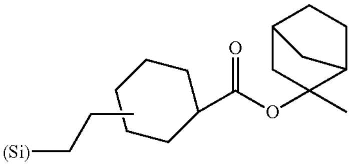
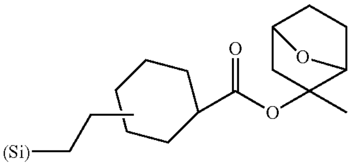
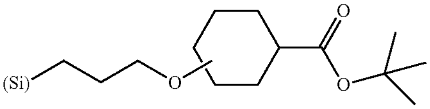
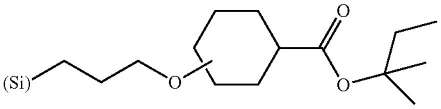

-continued
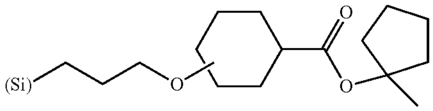
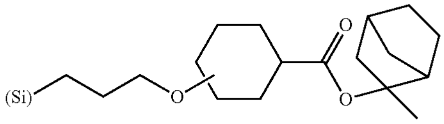
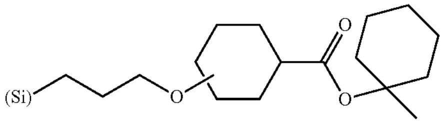
(T3)
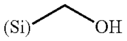
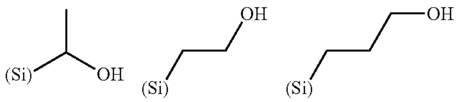
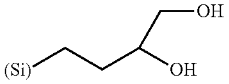
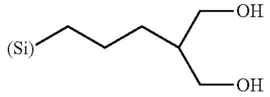
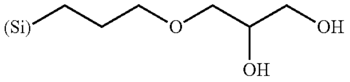
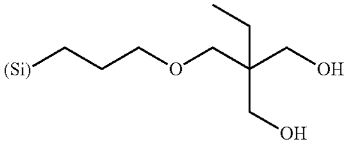
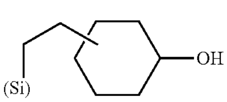
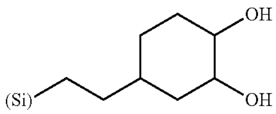
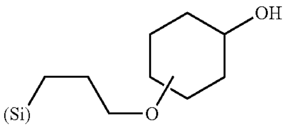
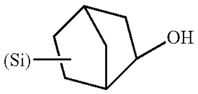
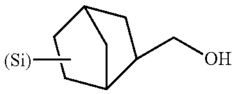
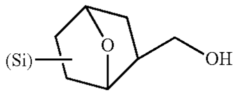
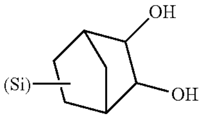
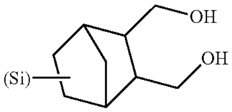
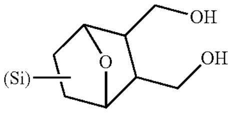
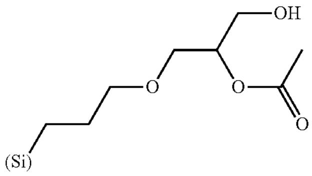
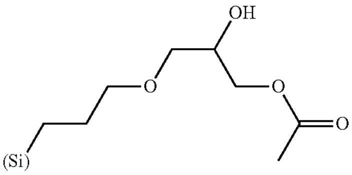
-continued
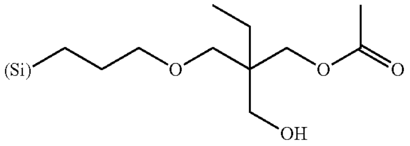
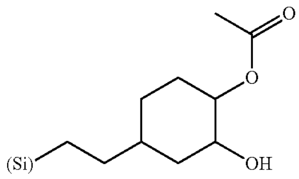
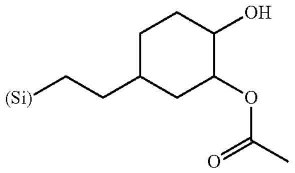
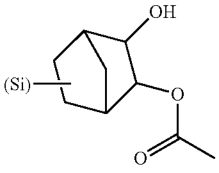
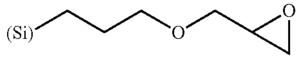
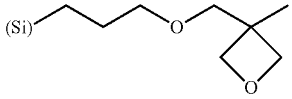
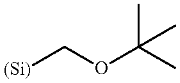
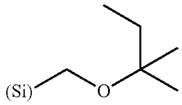
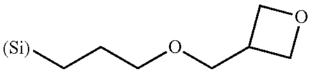
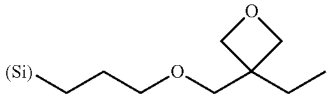
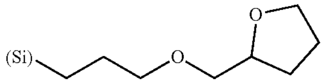
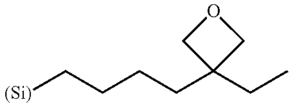
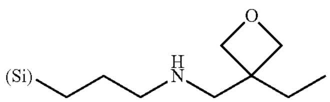
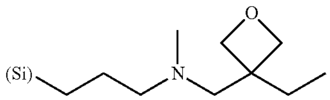
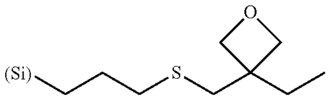
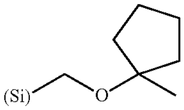
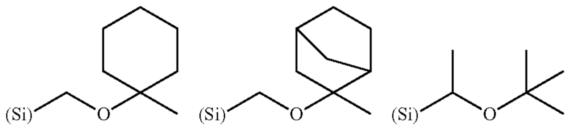
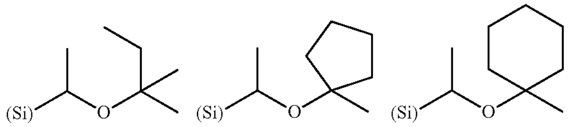

-continued
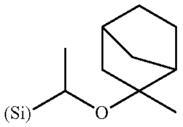
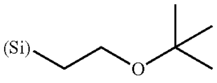
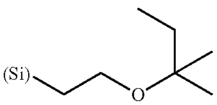
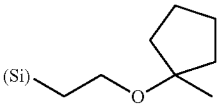
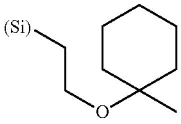
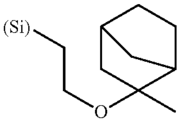
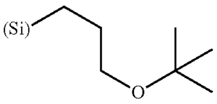
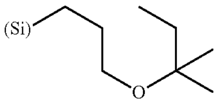
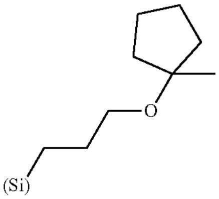
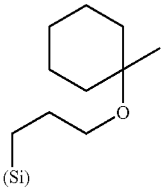
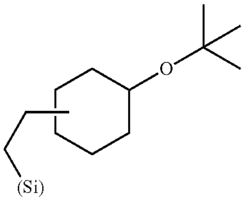
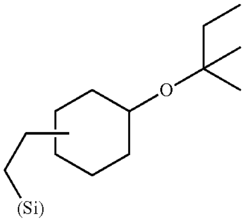
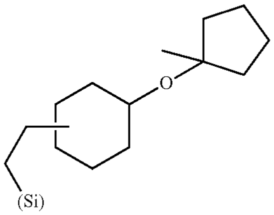
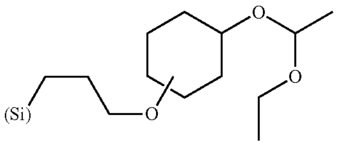
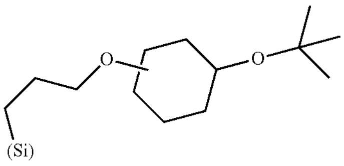
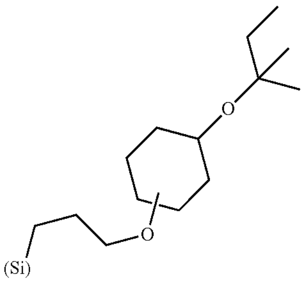
-continued
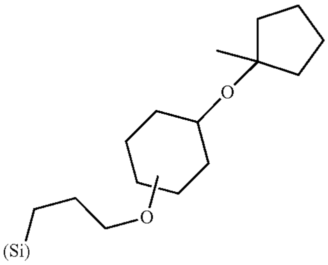
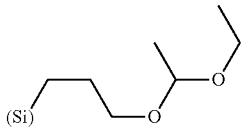
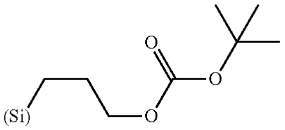
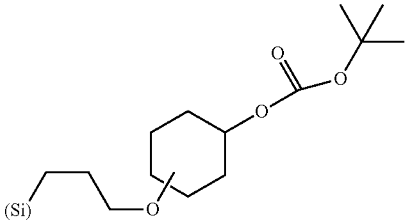
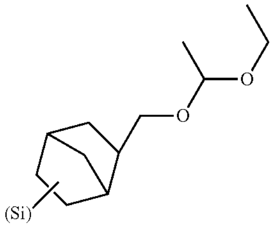
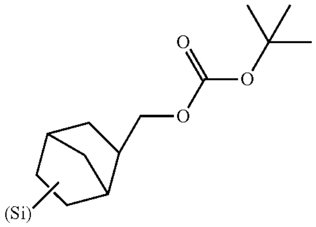
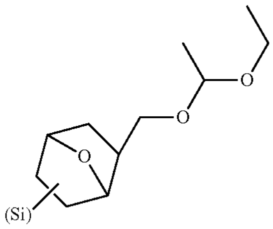
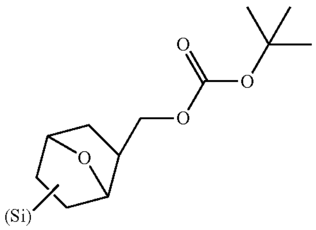

-continued

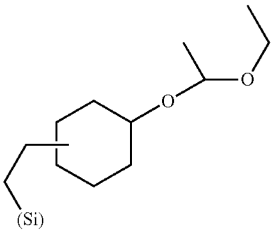

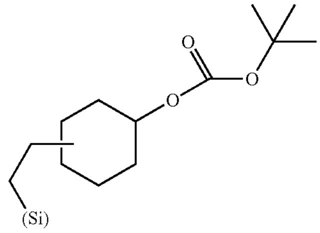

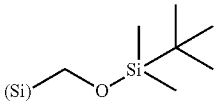

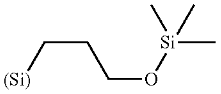

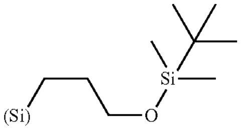

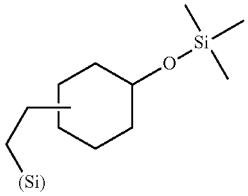

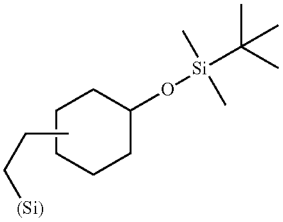

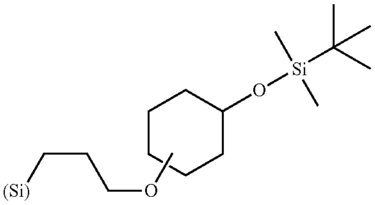

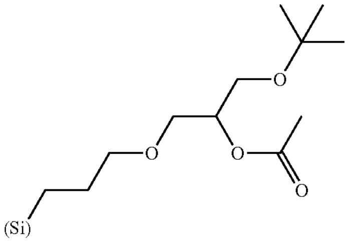

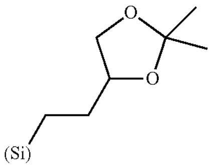

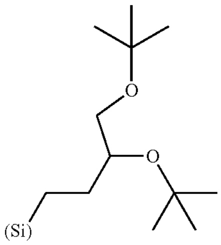

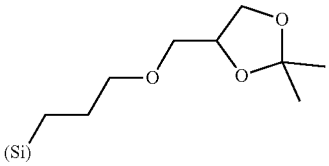

-continued

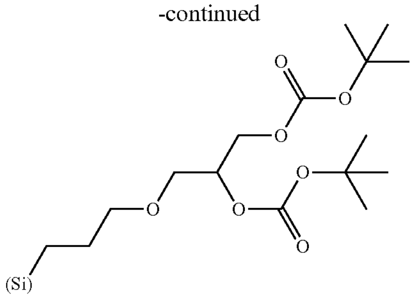

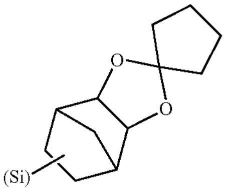

wherein (Si) represents a bonding position to Si.

2. The composition for forming a silicon-containing metal hard mask according to claim 1, wherein (A) the metal oxide nanoparticle is one or more kinds of an oxide nanoparticle of a metal selected from the group consisting of zirconium, hafnium, aluminum, tungsten, titanium, copper, tin, cerium, indium, zinc, yttrium, lanthanum, chromium, cobalt, platinum, iron, antimony, and germanium.

3. The composition for forming a silicon-containing metal hard mask according to claim 1, wherein (A) the metal oxide nanoparticle is one or more of metal oxide nanoparticles selected from the group consisting of a zirconium oxide nanoparticle, a hafnium oxide nanoparticle, a tungsten oxide nanoparticle, a titanium oxide nanoparticle, and a tin oxide nanoparticle.

4. The composition for forming a silicon-containing metal hard mask according to claim 1, wherein (A) the metal oxide nanoparticle has an average primary particle diameter of 100 nm or less.

5. The composition for forming a silicon-containing metal hard mask according to claim 1, further comprising a crosslinking catalyst (Xc).

6. The composition for forming a silicon-containing metal hard mask according to claim 5, wherein the crosslinking catalyst (Xc) is a sulfonium salt, an iodonium salt, a phosphonium salt, an ammonium salt, a polysiloxane having these salts as a partial structure, or an alkali metal salt.

7. The composition for forming a silicon-containing metal hard mask according to claim 1, wherein (C) the solvent is an organic solvent being a mixture of: one or more kinds of an organic solvent having a boiling point of lower than 180° C.; and one or more kinds of an organic solvent having a boiling point of 180° C. or higher.

8. A patterning process for forming a pattern in a substrate to be processed, comprising:

(I-1) a step of applying the composition for forming a silicon-containing metal hard mask according to claim 1 on a substrate to be processed, then heat-treating the composition, and forming a silicon-containing metal hard mask;

(I-2) a step of forming a resist upper layer film on the silicon-containing metal hard mask by using a photoresist material;

(I-3) a step of pattern-exposing the resist upper layer film, and then developing the pattern with a developing liquid to form a pattern in the resist upper layer film;

(I-4) a step of transferring the pattern to the silicon-containing metal hard mask by dry etching while using the resist upper layer film having the formed pattern as a mask; and (I-5) a step of forming a pattern in the substrate to be processed by processing the substrate to be processed while using the silicon-containing metal hard mask having the formed pattern as a mask.

9. The patterning process according to claim 8, wherein the substrate to be processed is a semiconductor device substrate or a substrate having a film formed on the semiconductor device substrate, the film being a metal film, an alloy film, a metal carbide film, a metal oxide film, a metal nitride film, a metal oxycarbide film, or a metal oxynitride film.

10. The patterning process according to claim 9, wherein a metal constituting the substrate to be processed is silicon, gallium, titanium, tungsten, hafnium, zirconium, chromium, germanium, copper, silver, gold, indium, arsenic, palladium, tantalum, iridium, aluminum, iron, molybdenum, cobalt, manganese, ruthenium, or an alloy thereof.

11. A patterning process for forming a pattern in a substrate to be processed, comprising:

(II-1) a step of forming an organic resist underlayer film on a substrate to be processed;

(II-2) a step of applying the composition for forming a silicon-containing metal hard mask according to claim 1 on the organic resist underlayer film, then heat-treating the composition, and forming a silicon-containing metal hard mask;

(II-3) a step of forming a resist upper layer film on the silicon-containing metal hard mask by using a photoresist material;

(II-4) a step of pattern-exposing the resist upper layer film, and then developing the pattern with a developing liquid to form a pattern in the resist upper layer film;

(II-5) a step of transferring the pattern to the silicon-containing metal hard mask by dry etching while using the resist upper layer film having the formed pattern as a mask;

(II-6) a step of transferring the pattern to the organic resist underlayer film by dry etching while using the silicon-containing metal hard mask having the transferred pattern as a mask; and (II-7) a step of forming a pattern in the substrate to be processed by processing the substrate to be processed while using the organic resist underlayer film having the formed pattern as a mask.

12. A patterning process for forming a pattern in a substrate to be processed, comprising:

(III-1) a step of forming an organic resist underlayer film on a substrate to be processed;

(III-2) a step of applying the composition for forming a silicon-containing metal hard mask according to claim 1 on the organic resist underlayer film, then heat-treating the composition, and forming a silicon-containing metal hard mask;

(III-3) a step of forming a BARC or an adhesive film on the silicon-containing metal hard mask by using a composition for forming an organic thin film;

(III-4) a step of forming a resist upper layer film on the BARC or the adhesive film by using a photoresist material;

(III-5) a step of pattern-exposing the resist upper layer film, and then developing the pattern with a developing liquid to form a pattern in the resist upper layer film;

(III-6) a step of transferring the pattern to the BARC or the adhesive film, and the silicon-containing metal hard mask by dry etching while using the resist upper layer film having the formed pattern as a mask;

(III-7) a step of transferring the pattern to the organic resist underlayer film by dry etching while using the silicon-containing metal hard mask having the transferred pattern as a mask; and (III-8) a step of forming a pattern in the substrate to be processed by processing the substrate to be processed while using the organic resist underlayer film having the formed pattern as a mask.

13. A patterning process for forming a pattern in a substrate to be processed by reversing a resist pattern, comprising:

(IV-1) a step of forming a photoresist film on a substrate to be processed by using a photoresist material;

(IV-2) a step of pattern-exposing the photoresist film, and then developing the pattern with a developing liquid to form a pattern in the photoresist film;

(IV-3) a step of applying the composition for forming a silicon-containing metal hard mask according to claim 1 on the photoresist film pattern, heat-treating the composition, covering a silicon-containing metal hard mask, and then filling a gap of the photoresist film pattern with the silicon-containing metal hard mask;

(IV-4) a step of etching back the silicon-containing metal hard mask by a chemical stripper or dry etching, the mask covering the photoresist film having the formed pattern, and uncovering an upper surface of the photoresist film having the formed pattern;

(IV-5) a step of removing the photoresist film pattern having the uncovered surface by dry etching to form a reversed pattern to the original pattern on the silicon-containing metal hard mask; and (IV-6) a step of forming a tone-reversed pattern in the substrate to be processed by processing the substrate to be processed while using the silicon-containing metal hard mask having the formed reversed pattern as a mask.

14. A patterning process for forming a pattern in a substrate to be processed by reversing a pattern obtained by nanoimprinting, comprising:

(V-1) a step of forming a pattern on a substrate to be processed by nanoimprinting;

(V-2) a step of applying the composition for forming a silicon-containing metal hard mask according to claim 1 on the pattern, heat-treating the composition, covering a silicon-containing metal hard mask, and then filling a gap of the nanoimprint pattern with the silicon-containing metal hard mask;

(V-3) a step of etching back the silicon-containing metal hard mask by a chemical stripper or dry etching, the mask covering the pattern formed by nanoimprinting, and uncovering an upper surface of the nanoimprint pattern film having the formed pattern;

(V-4) a step of removing the nanoimprint pattern having the uncovered surface by dry etching to form a reversed pattern to the original pattern on the silicon-containing metal hard mask; and (V-5) a step of forming a tone-reversed pattern in the substrate to be processed by processing the substrate to be processed while using the silicon-containing metal hard mask having the formed reversed pattern as a mask.

15. A patterning process for forming a pattern in a substrate to be processed by reversing a resist pattern, comprising:

(VI-1) a step of forming a photoresist film on a substrate to be processed by using a photoresist material;

(VI-2) a step of pattern-exposing the photoresist film and then developing the photoresist film with a developing liquid, and a step of further rinsing the developed film with a rinsing liquid as necessary;

(VI-3) a step of substituting the developing liquid or the rinsing liquid with the composition for forming a silicon-containing metal hard mask according to claim 1, heat-treating the composition, covering a silicon-containing metal hard mask, and then filling a gap of the photoresist film pattern with the silicon-containing metal hard mask;

(VI-4) a step of etching back the silicon-containing metal hard mask by a chemical stripper or dry etching, the mask covering the photoresist film having the formed pattern, and uncovering an upper surface of the photoresist film having the formed pattern;

(IV-5) a step of removing the photoresist film pattern having the uncovered surface by dry etching to form a reversed pattern to the original pattern on the silicon-containing metal hard mask; and (IV-6) a step of forming a tone-reversed pattern in the substrate to be processed by processing the substrate to be processed while using the silicon-containing metal hard mask having the formed reversed pattern as a mask.

16. A patterning process for forming a pattern in a substrate to be processed, comprising:

(VII-1) a step of forming an organic resist underlayer film on a substrate to be processed, applying the composition for forming a silicon-containing metal hard mask according to claim 1 thereon, then heat-treating the composition to from a silicon-containing metal hard mask, and further forming a resist upper layer film thereon;

(VII-2) a step of exposing and developing the resist upper layer film to form a resist upper layer film pattern;

(VII-3) a step of transferring the resist upper layer film pattern to the silicon-containing metal hard mask by dry etching while using the resist upper layer film pattern as a mask, and further transferring the resist upper layer film pattern to the organic resist underlayer film by dry etching while using the silicon-containing metal hard mask having the transferred resist upper layer film pattern as a mask, the transferring being performed with remaining a part of the silicon-containing metal hard mask on the organic resist underlayer film, and then forming an organic resist underlayer film pattern;

(VII-4) a step of removing the remained silicon-containing metal hard mask on the organic resist underlayer film pattern with a removing liquid;

(VII-5) a step of forming an inorganic silicon film composed of any one of polysilicon, amorphous silicon, silicon oxide, silicon nitride, silicon oxynitride, silicon carbide, or a composite material thereof so as to cover the organic resist underlayer film pattern by a CVD method or an ALD method;

(VII-6) a step of removing a part of the inorganic silicon film by dry etching, and uncovering an upper part of the organic resist underlayer film pattern; and (VII-7) a step of removing the organic resist underlayer film pattern to form an inorganic silicon film pattern having a pattern pitch being ½ of a pattern pitch of the resist upper layer film.

17. The patterning process according to claim 16, wherein in in the step (VII-4), the removing liquid contains either or both of a fluoride ion and a nitrogen-containing cation.

* * * * *